United States Patent [19]

Bayston et al.

[11] Patent Number: 5,026,156

[45] Date of Patent: Jun. 25, 1991

[54] METHOD AND SYSTEM FOR PULSE INTERVAL MODULATION

[75] Inventors: Thomas E. Bayston; Roy C. Weidler, Jr.; Arthur B. Thompson, Jr.; Allen C. Layton, all of Orange County, Fla.

[73] Assignee: Martin Marietta Corporation, Bethesda, Md.

[21] Appl. No.: 277,180

[22] Filed: Jul. 24, 1972

[51] Int. Cl.$^5$ .......................... G01C 3/08; G01S 7/36; H03K 7/04; G06F 15/336

[52] U.S. Cl. ........................................ 356/45; 342/13; 342/16; 342/189; 356/152; 375/23; 455/604; 455/606; 455/611; 364/728.03

[58] Field of Search ...................... 340/206; 235/150.3; 343/5 DP, 5 PD, 6.5 LC, 17.1 R, 17.1 PR, 18 E; 356/152, 4, 5; 244/3.16, 3.13, 3.16; 325/143; 455/604, 606, 611; 375/23; 342/13, 16, 189; 364/728.03

[56] References Cited

U.S. PATENT DOCUMENTS

| | | | |
|---|---|---|---|
| 2,698,896 | 1/1955 | Rinia | 325/143 |
| 3,588,898 | 6/1971 | Watters, Jr. et al. | 343/5 DP |
| 3,614,626 | 10/1971 | Dillard | 343/5 DP |
| 3,696,248 | 10/1972 | Cunningham et al. | 356/152 |
| 3,702,476 | 11/1972 | Nathanson et al. | 343/5 DP |

Primary Examiner—Stephen C. Buczinski

[57] ABSTRACT

A system and method for pulse interval modulating signals in accordance with a code wherein the code resides in the spacing between adjacent pulses. The invention has particular utility in connection with laser designators and laser seekers and, while clearly not limited to this application, is disclosed hereinafter mainly in connection with laser designators and seekers. In connection with this laser environment, the invention may include a pulse interval modulation encoder for encoding the laser designator output signal and a pulse interval modulation decoder for decoding by the laser seeker of the encoded designator signal. The encoder preferably employs an ordered arrangement of unique pulse interval pairs which cyclically repeats after a relatively long time period. Because of the length of the time period and the apparent randomness of the intervals forming the unique interval pairs, the code appears to enemy countermeasures to be random. The decoder is, however, capable of recognizing the code from a particular designator by locally generating the same ordered set of unique interval pairs for comparison with the incoming designator signal. Thus, a number of laser designators may be operated selectively with predetermined seekers in the same area.

85 Claims, 24 Drawing Sheets

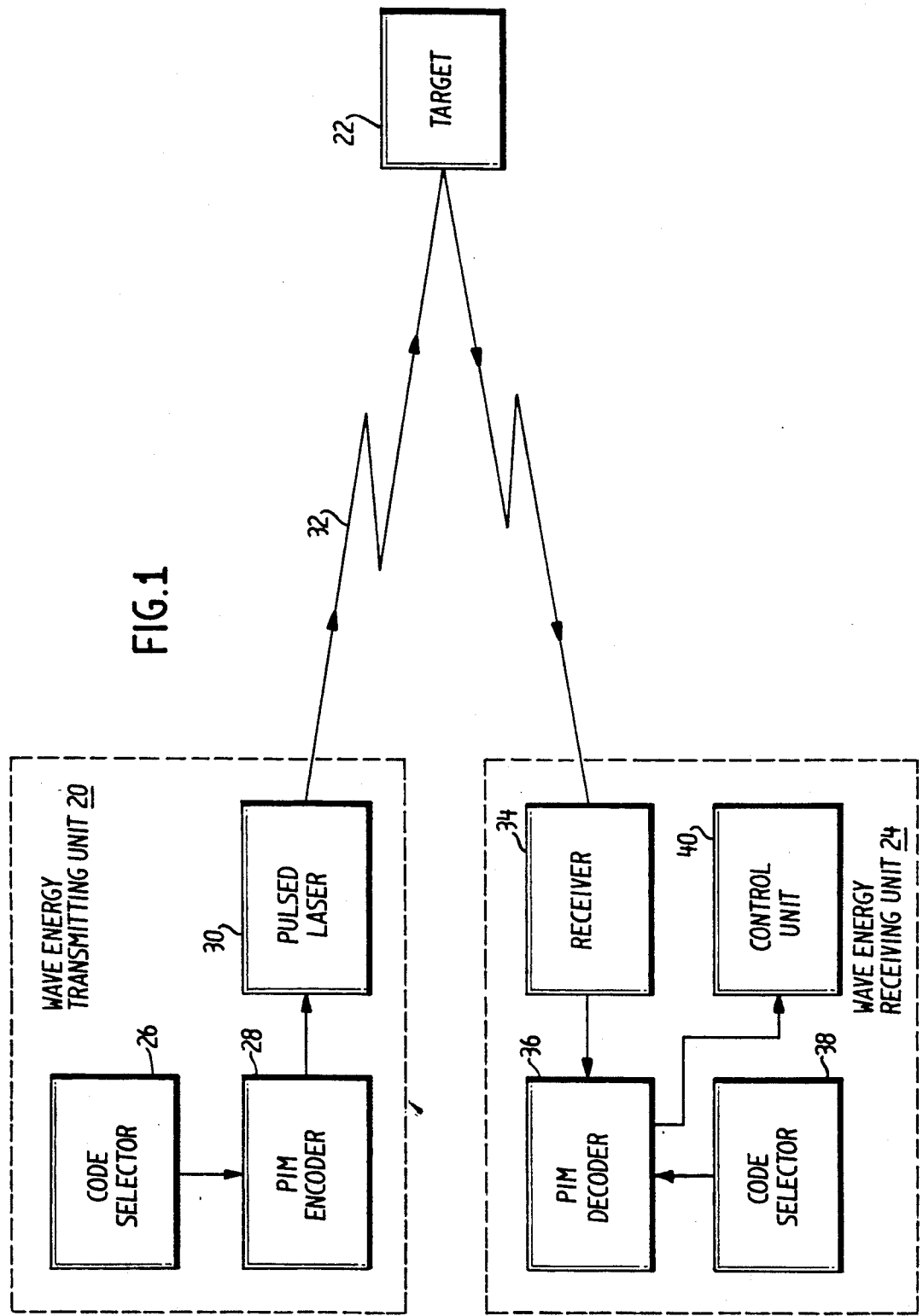

FIG. 2a (DISCRETE INTERVALS)
FIG. 2b (CODE 1; ONE CYCLE)
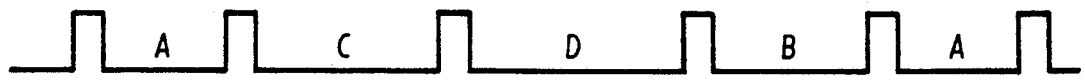
FIG. 2c (CODE 2; ONE CYCLE)
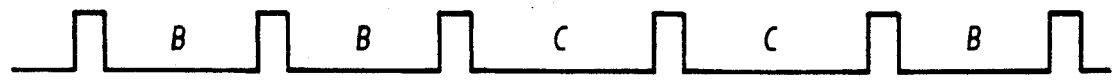
FIG. 2d (CODE 3; ONE CYCLE)
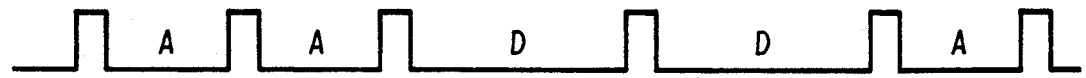
FIG. 2e (CODE 4; ONE CYCLE)

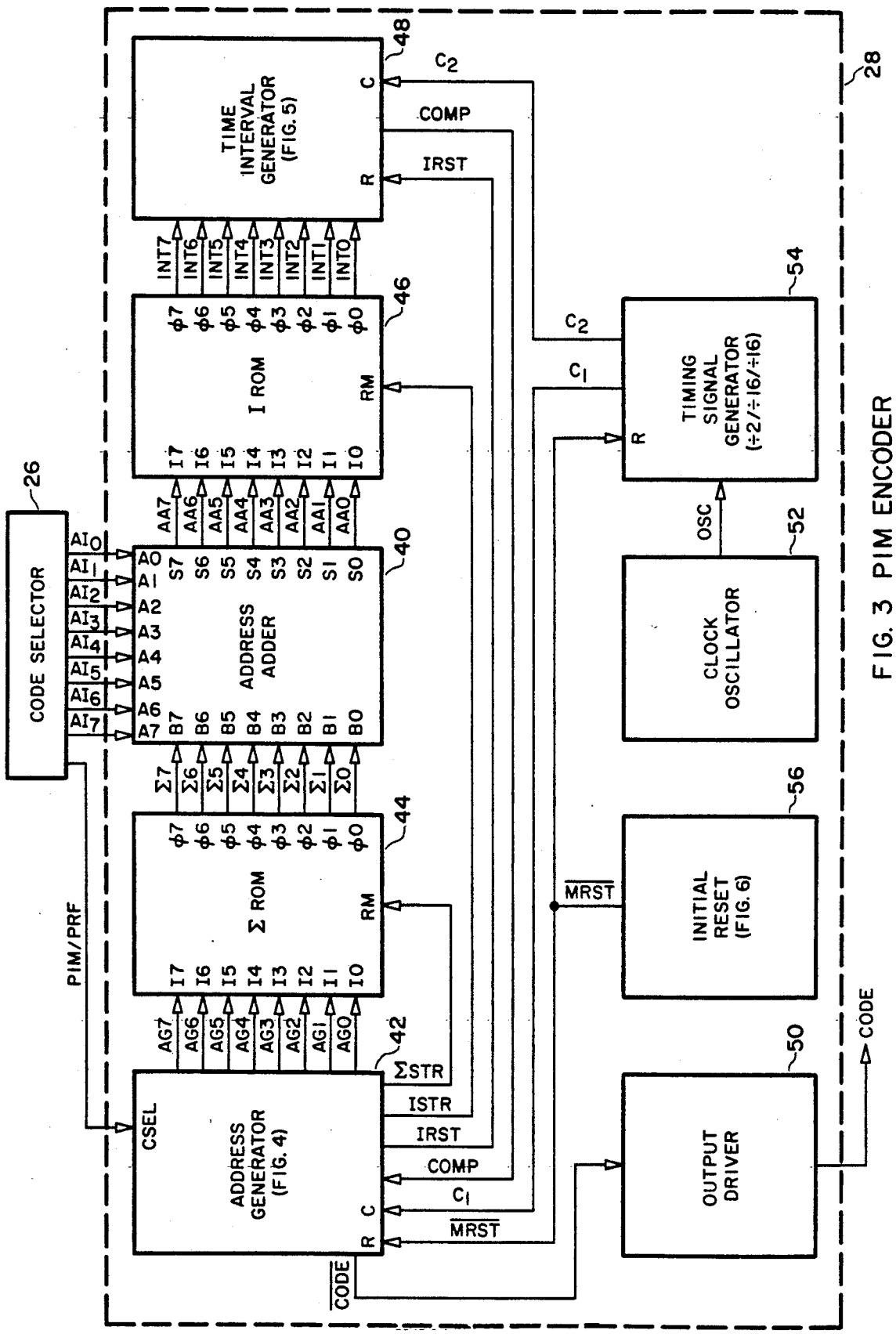
FIG. 3 PIM ENCODER

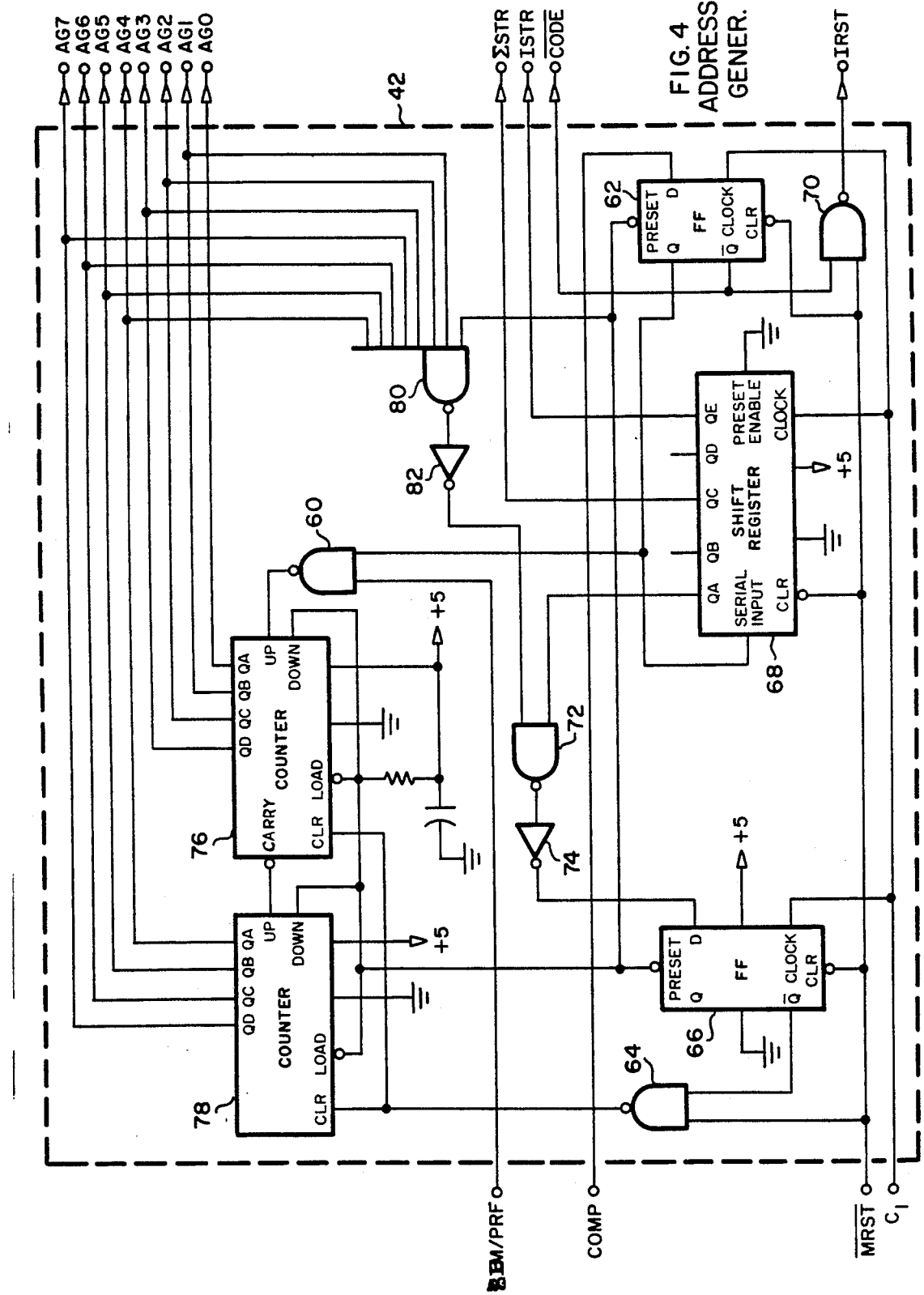

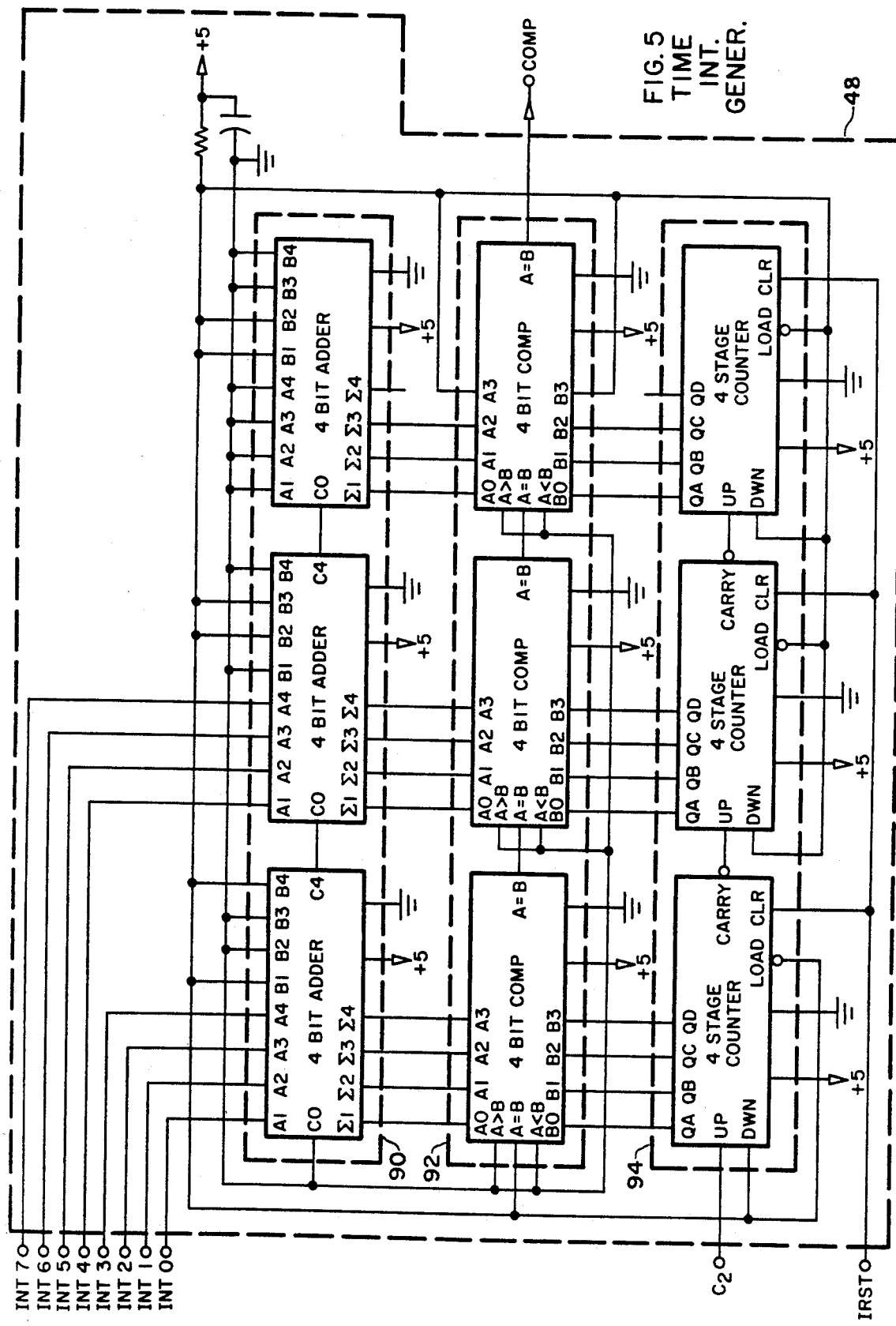
FIG. 5 TIME INT. GENER.

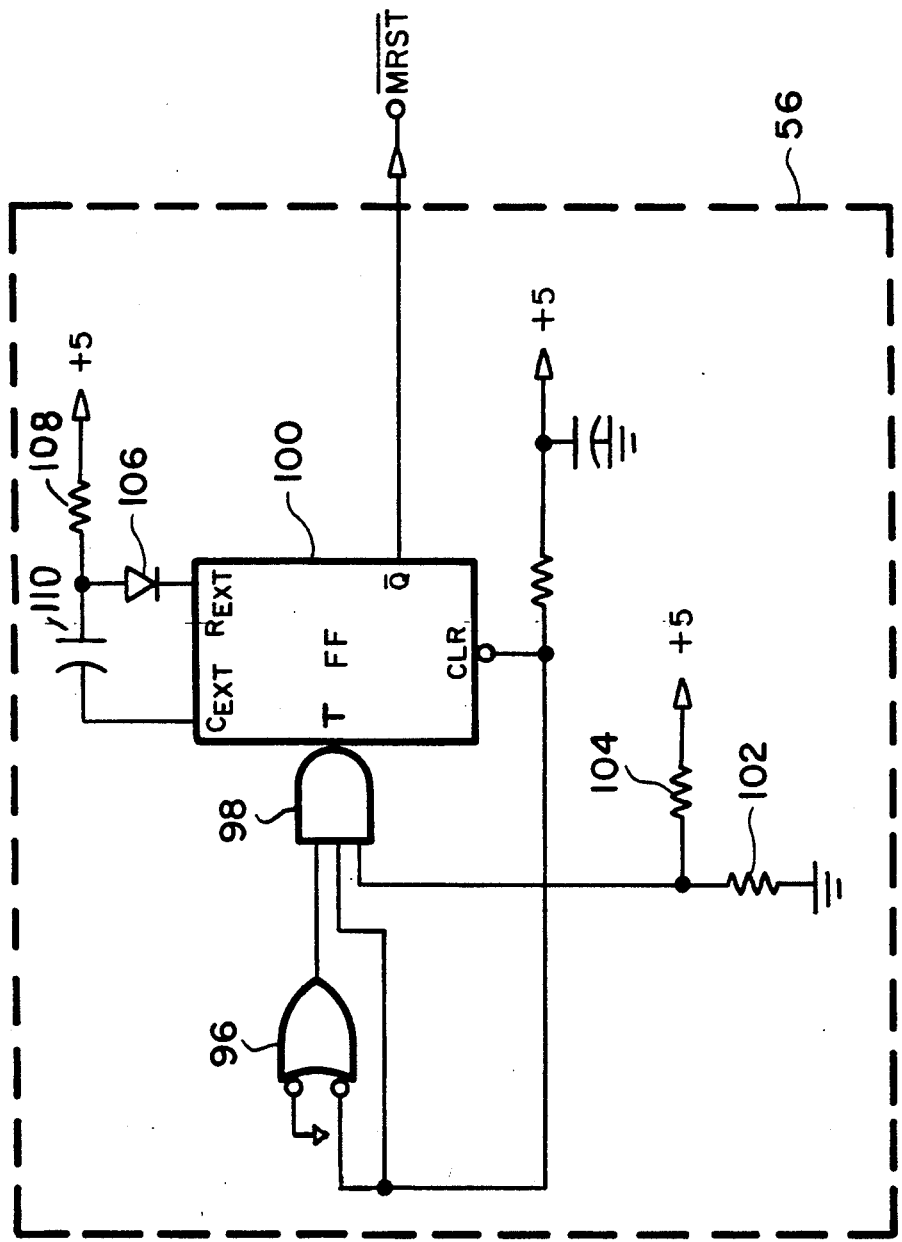
FIG. 6 INITIAL RESET

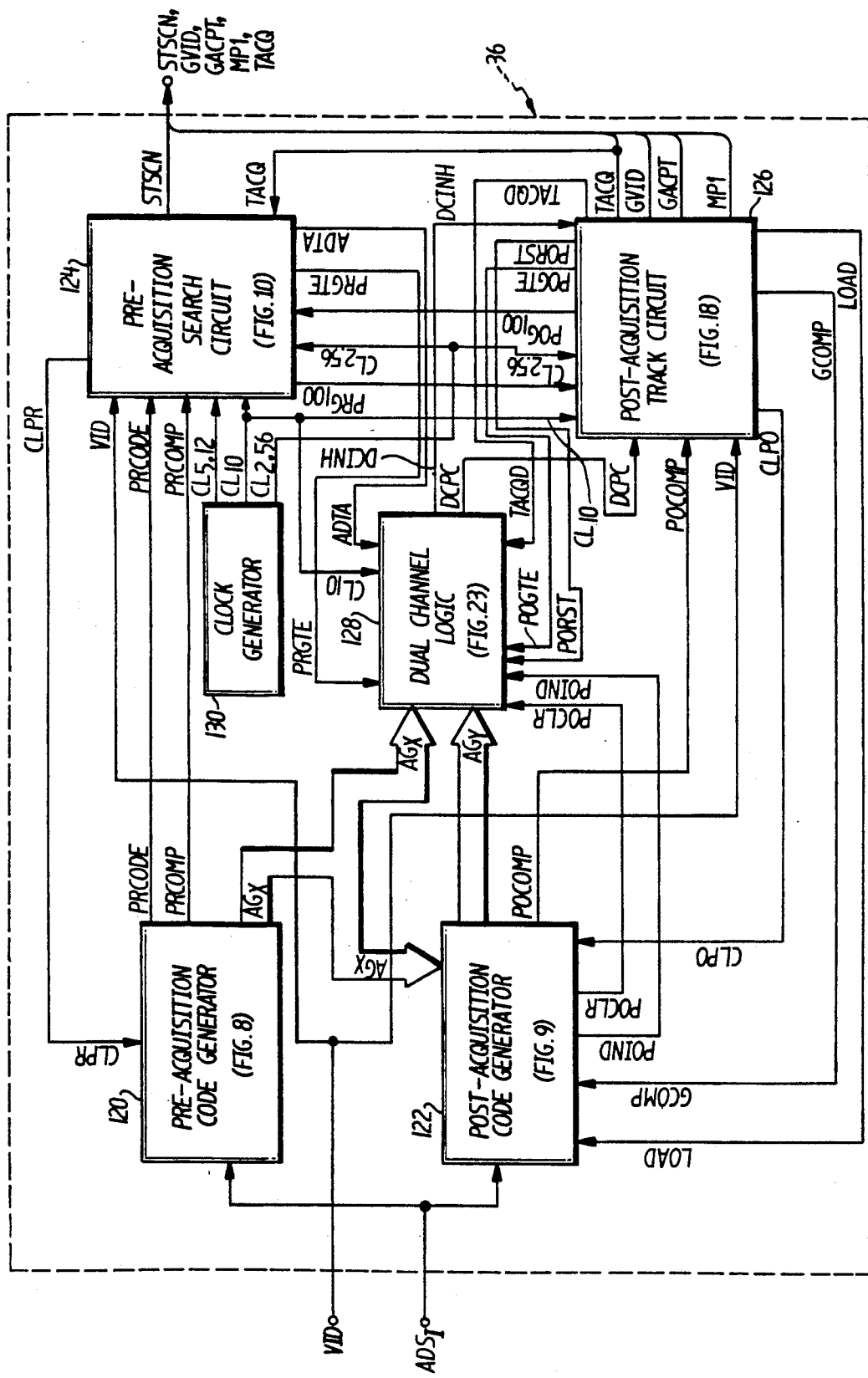
FIG. 7 PIM DECODER

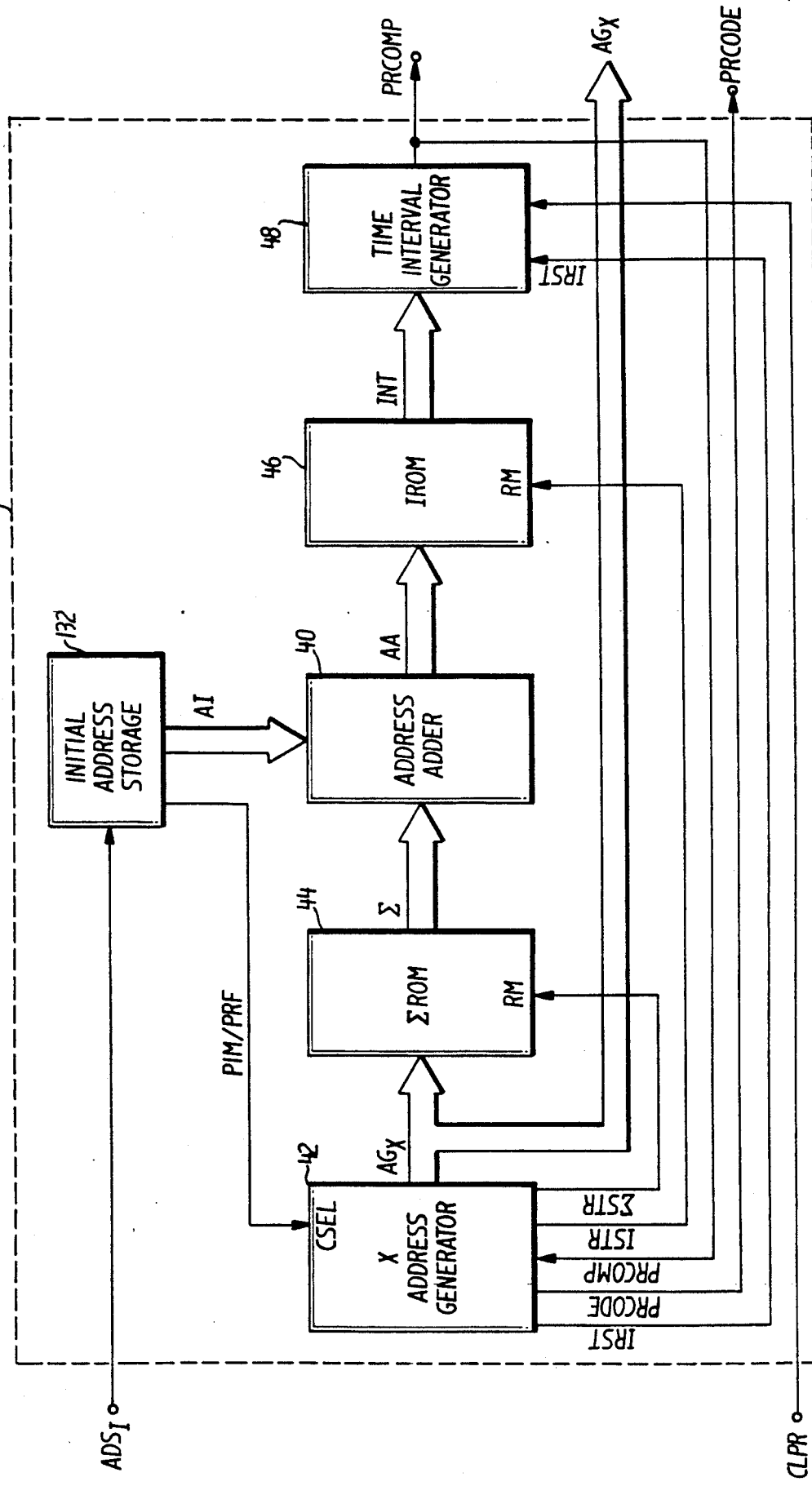

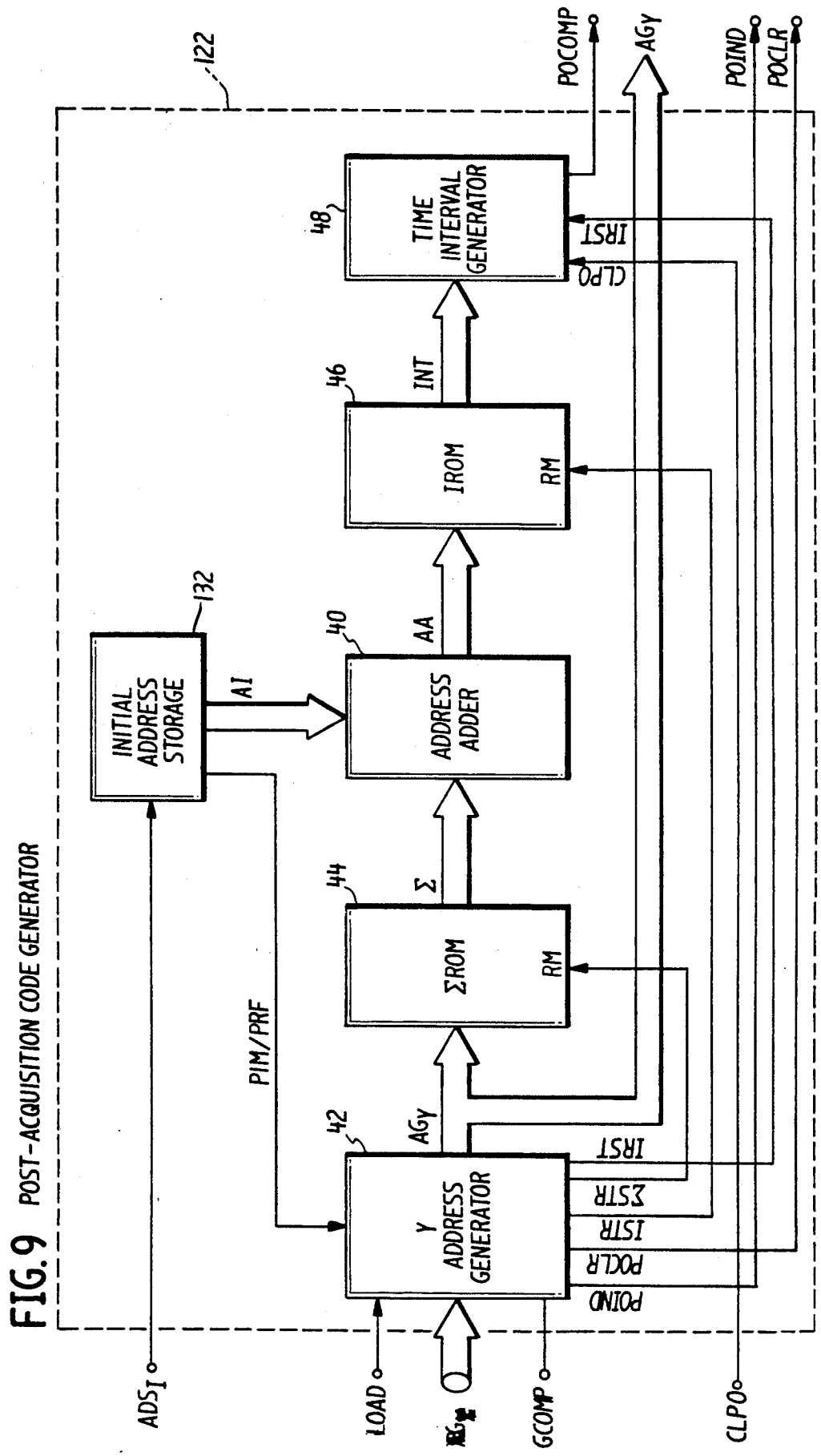
FIG. 9 POST-ACQUISITION CODE GENERATOR

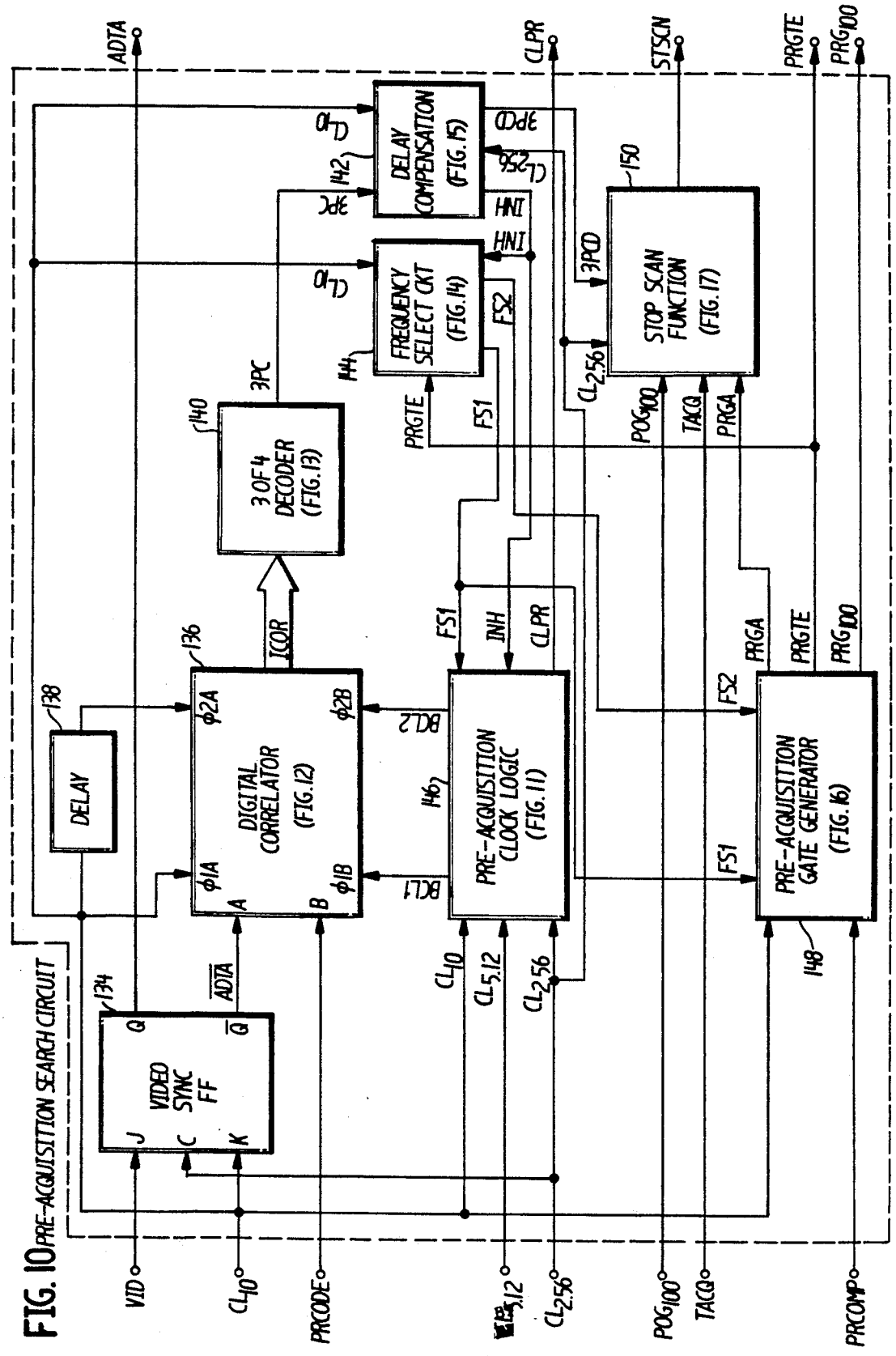
FIG. 10 PRE-ACQUISITION SEARCH CIRCUIT

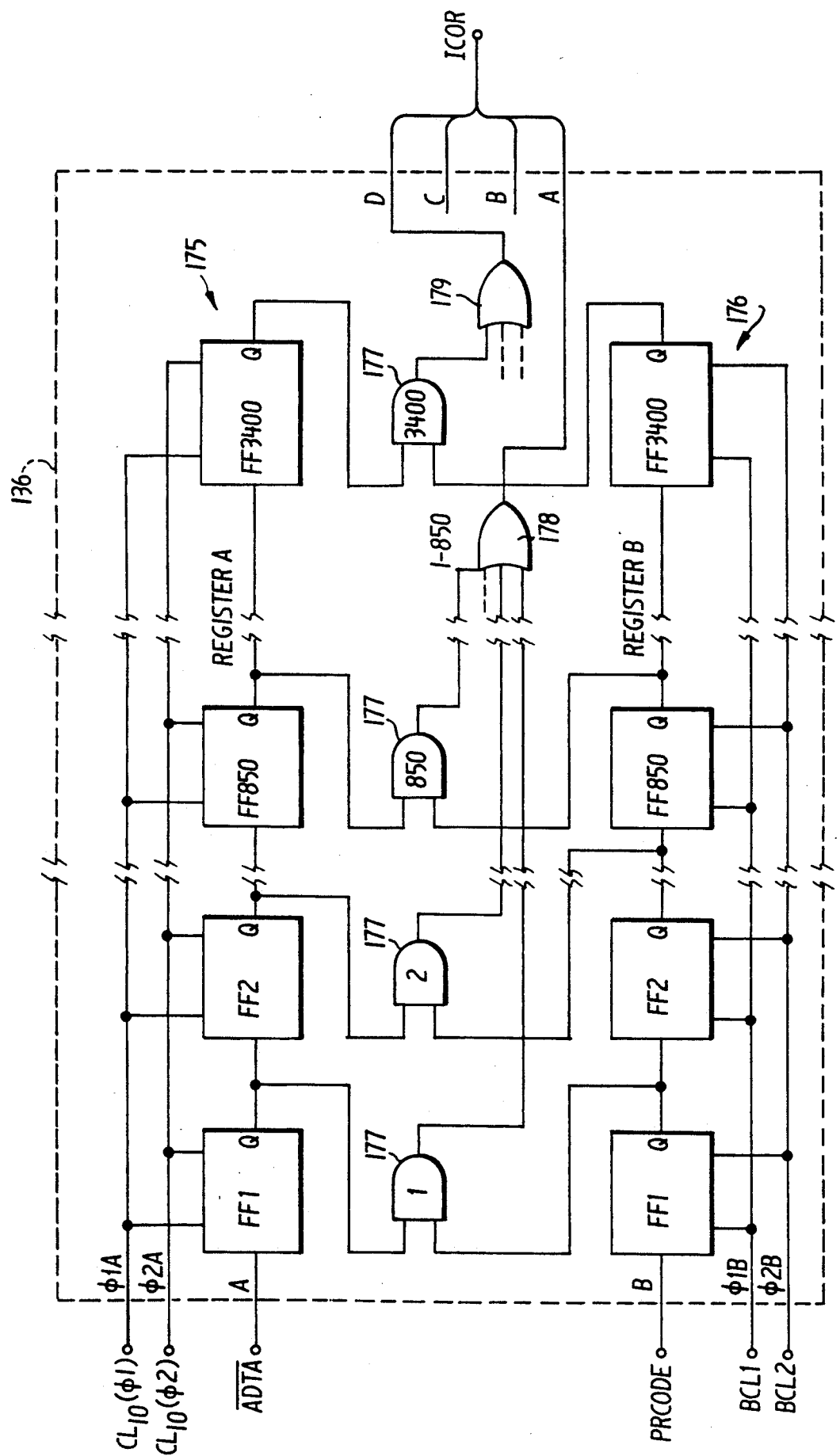
FIG. 12 DIGITAL CORRELATOR

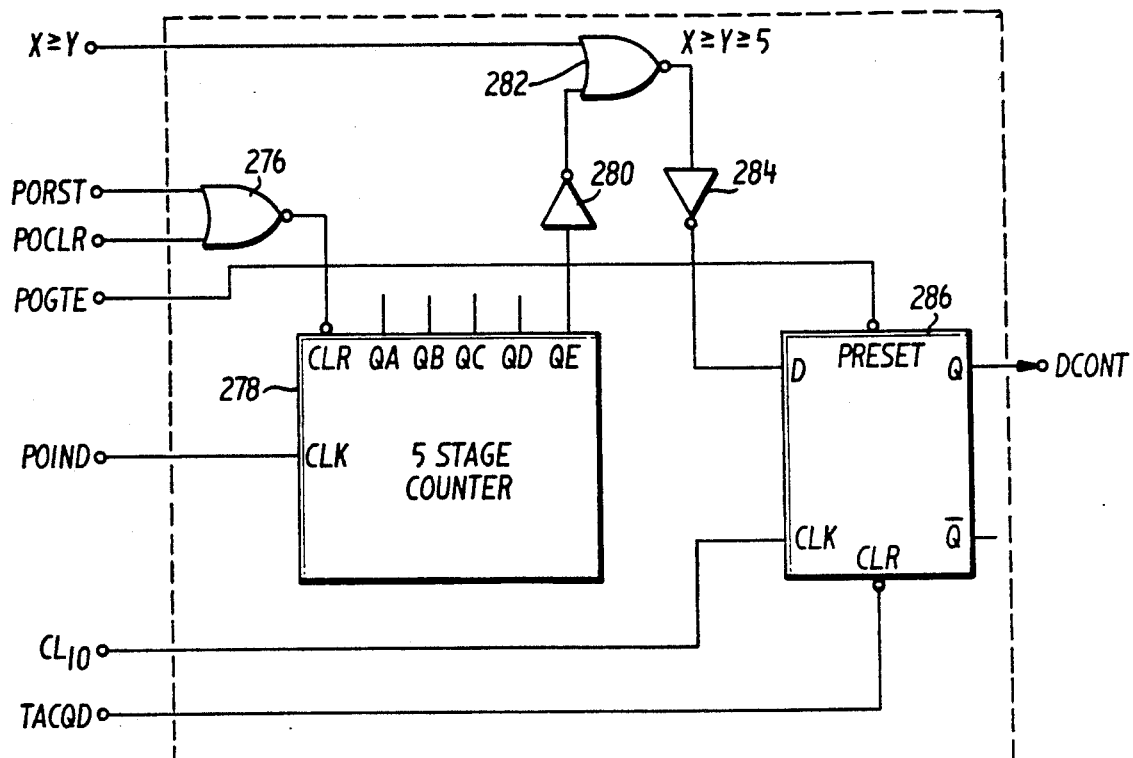
FIG. 24 DUAL CHANNEL CONTROL
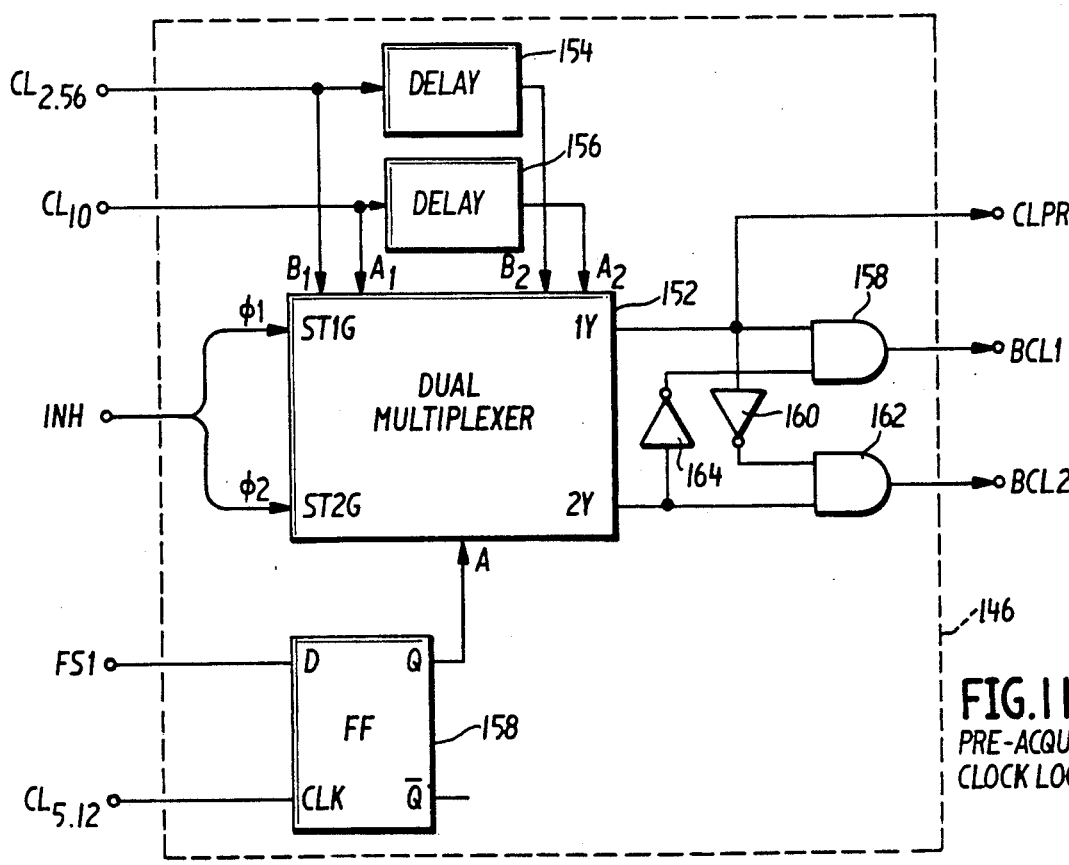
FIG. 11 PRE-ACQUISITION CLOCK LOGIC

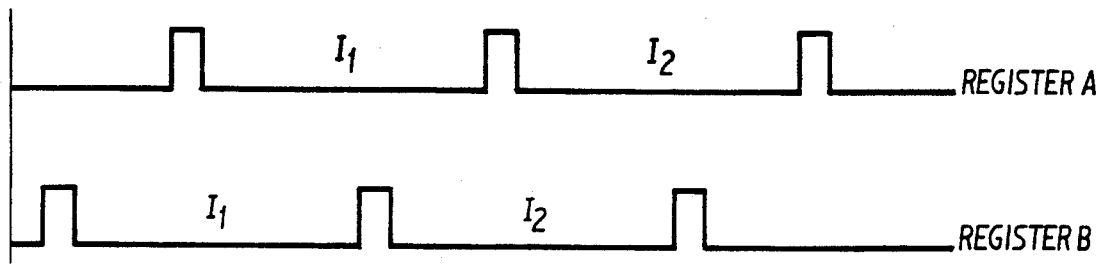
FIG. 12a ($T_1 = 0$)
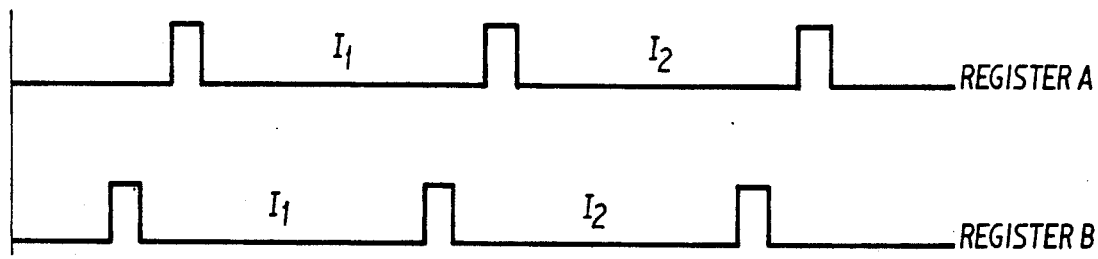
FIG. 12b ($T_2 = T_1 + 10BCL$)
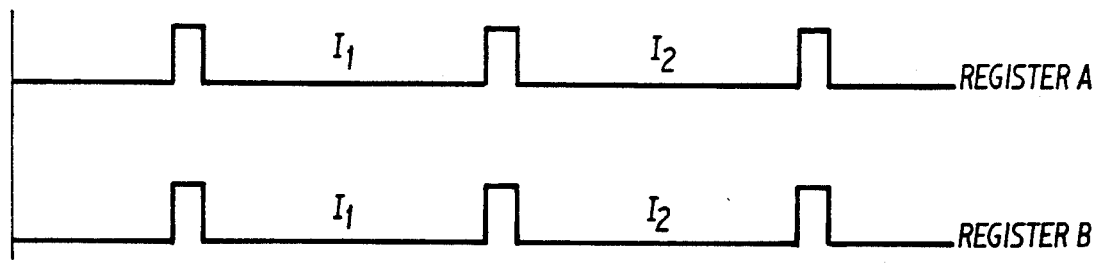
FIG. 12c ($T_3 = T_2 + 10BCL$)
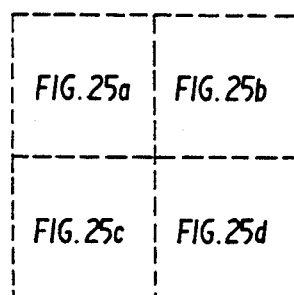
FIG. 25

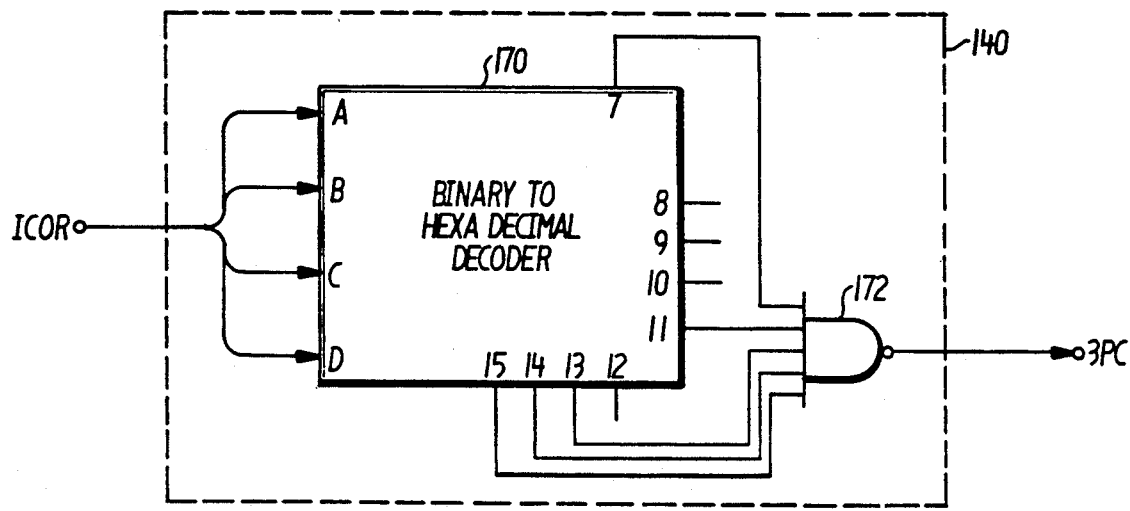
FIG. 13  3 OF 4 DECODER
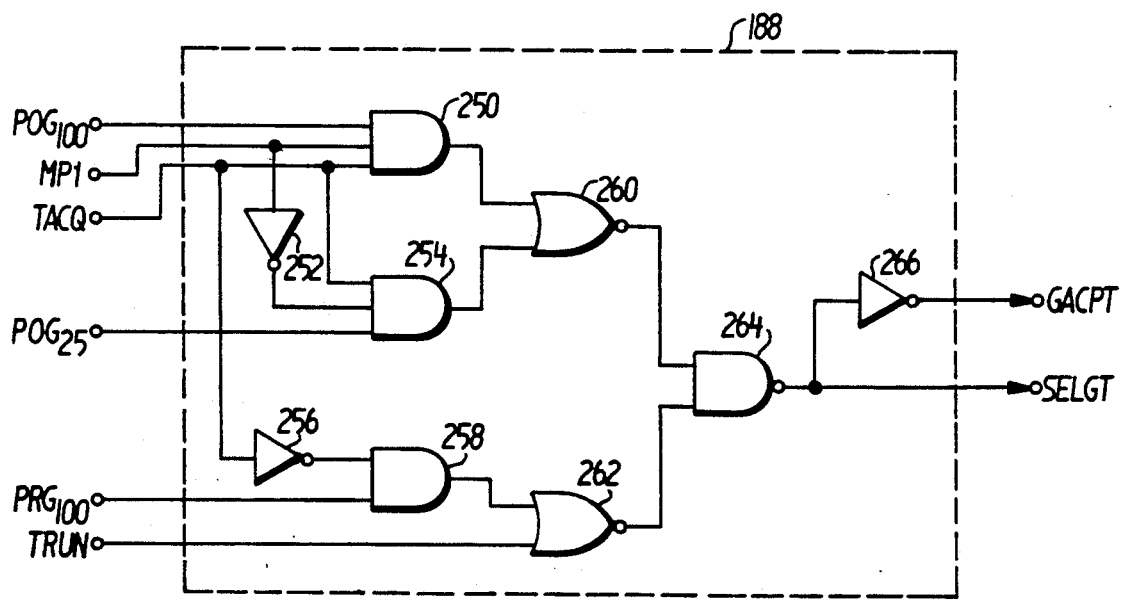
FIG. 22  GATE SELECT LOGIC

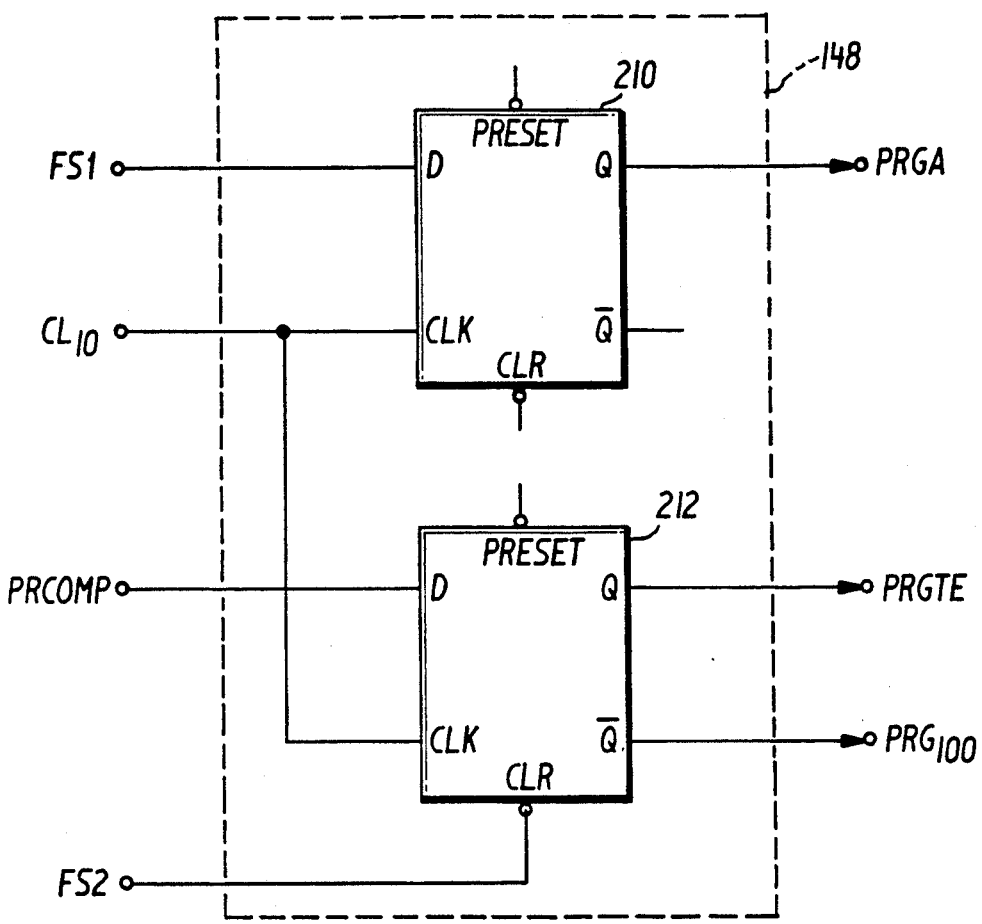
FIG. 16 PRE-ACQUISITION GATE GENERATOR
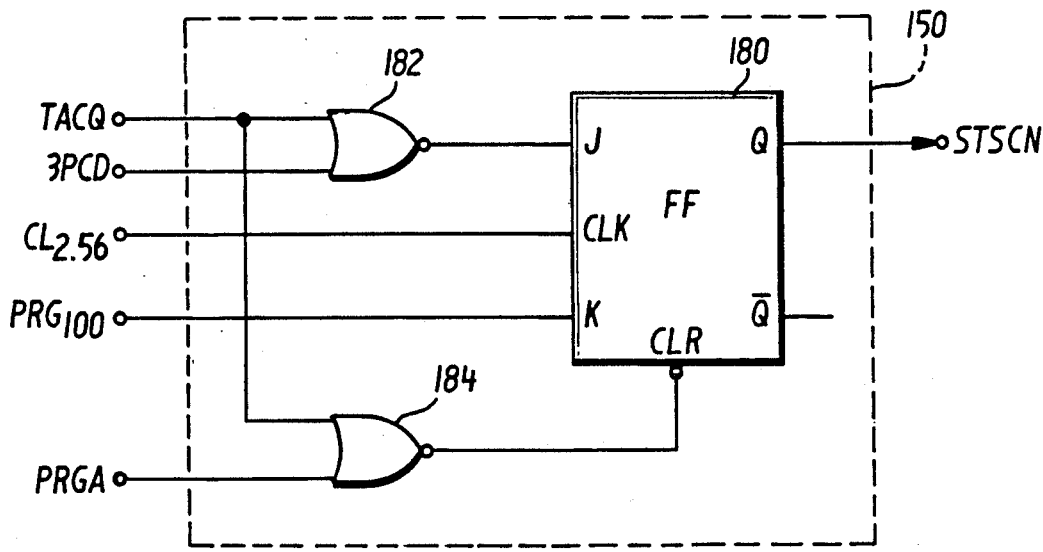
FIG. 17 STOP SCAN FUNCTION

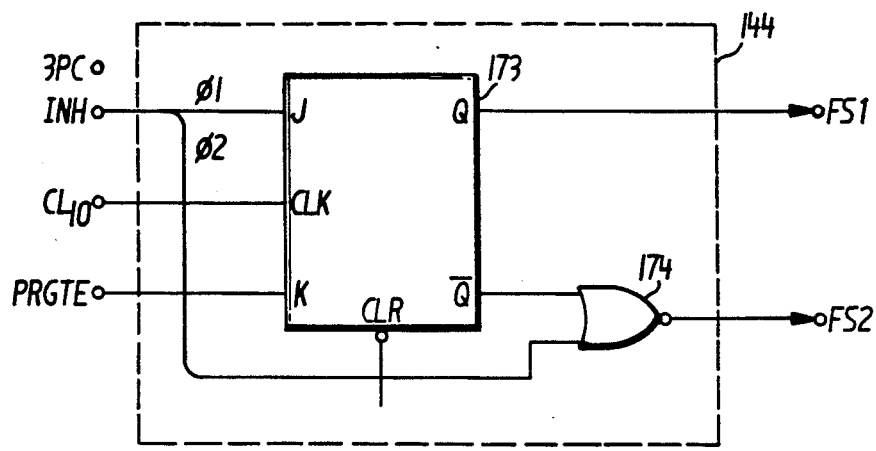
FIG. 14 FREQUENCY SELECT CIRCUIT
FIG. 15 DELAY COMPENSATION
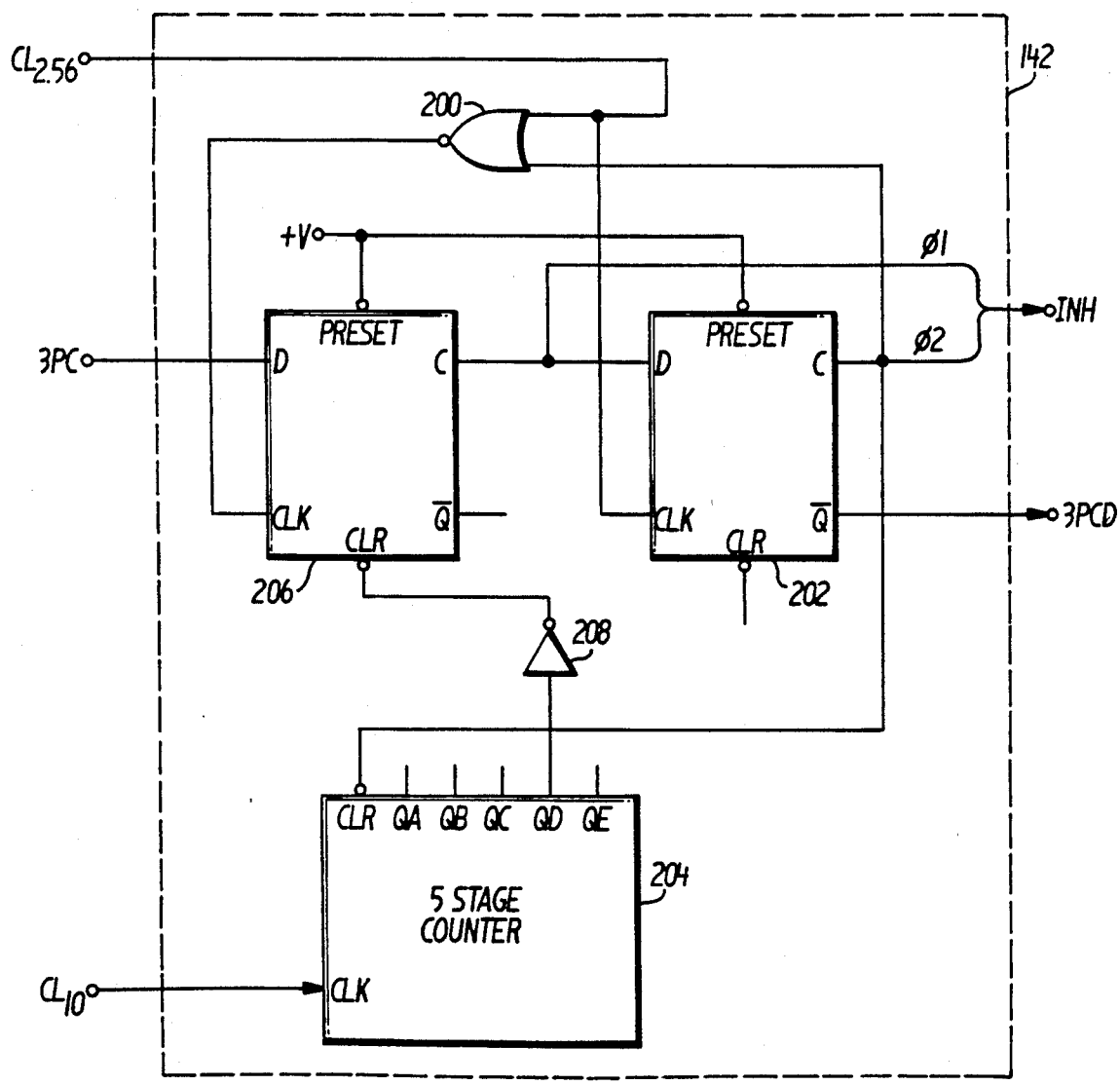

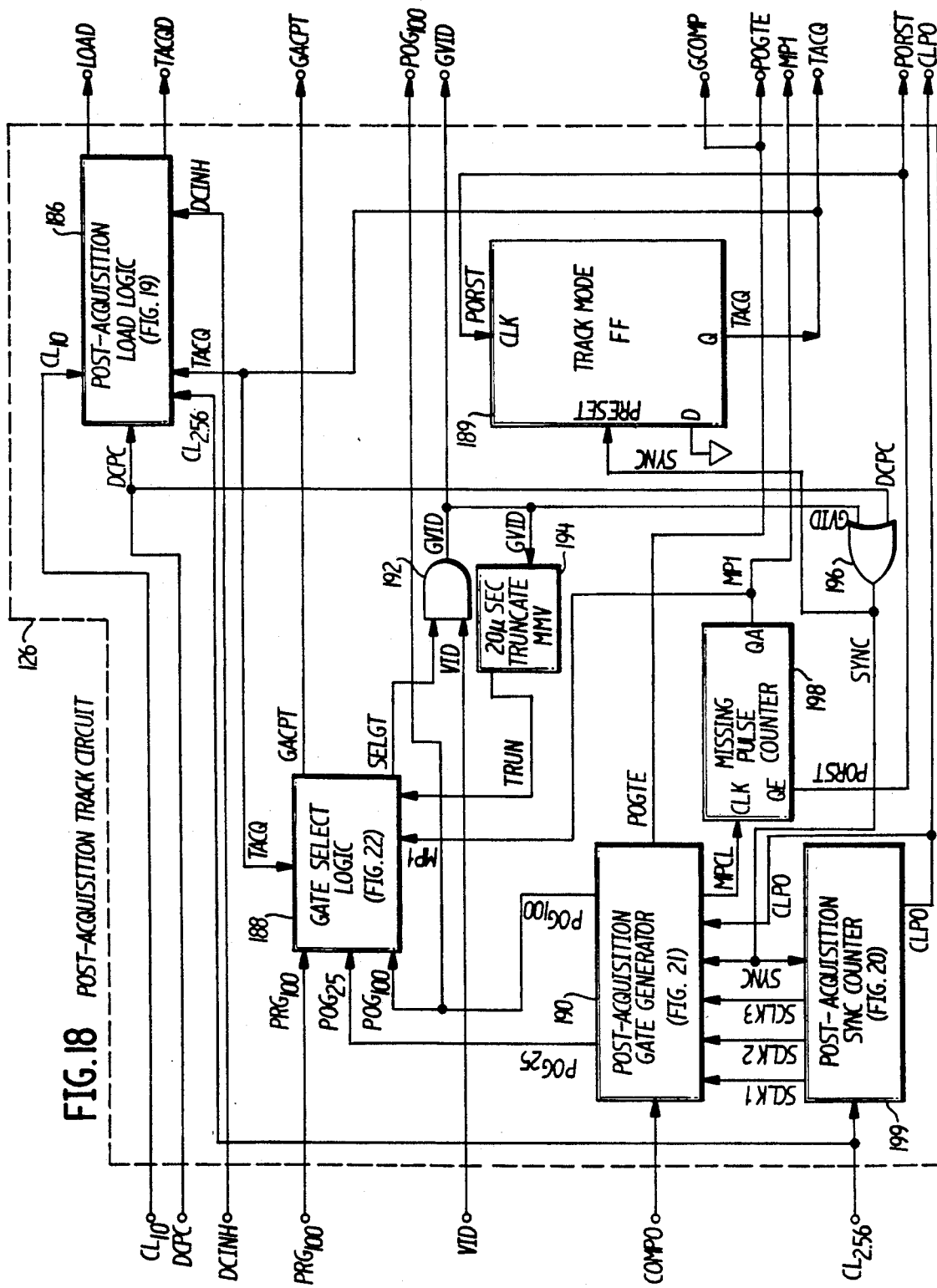
FIG.18 POST-ACQUISITION TRACK CIRCUIT

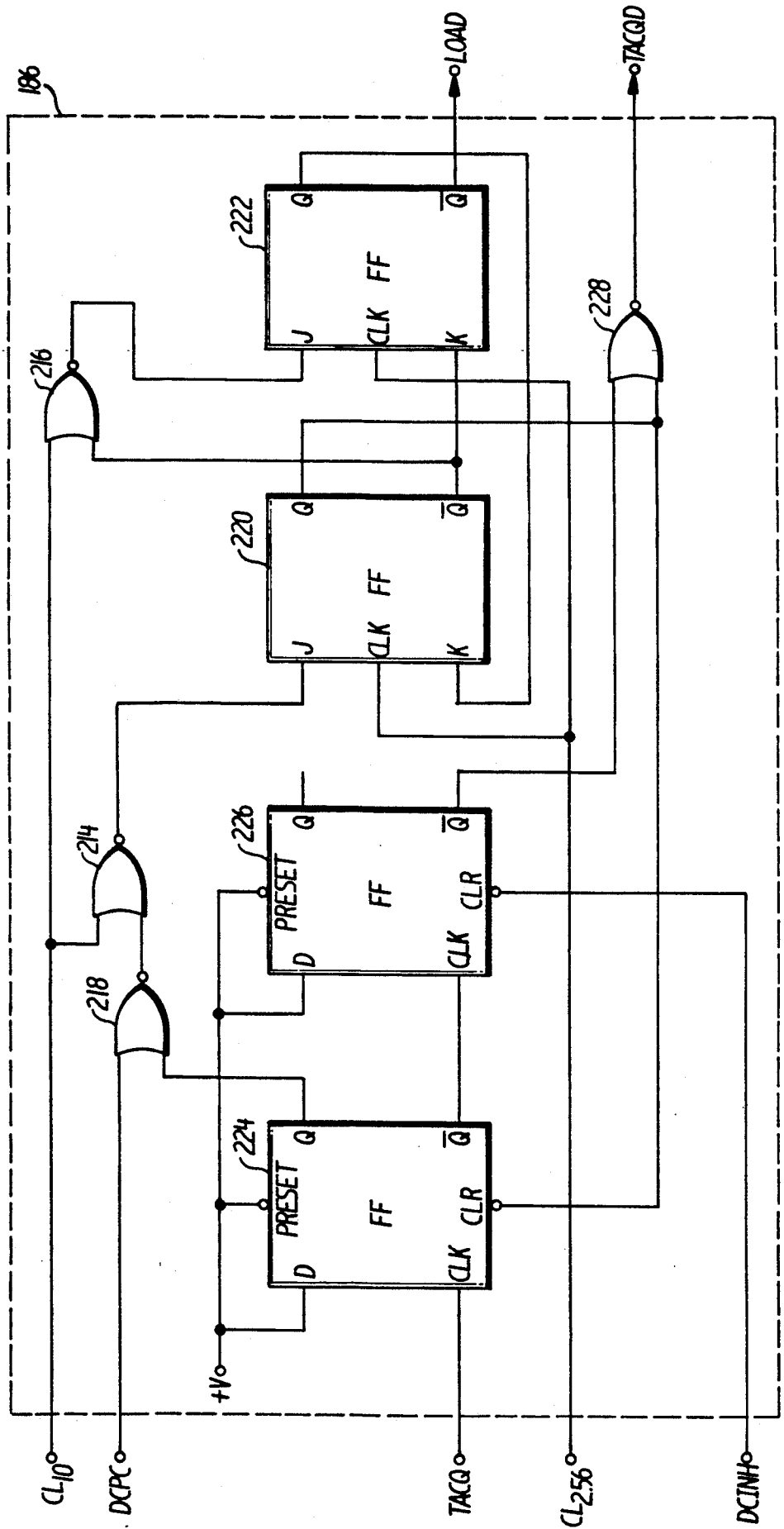
FIG. 19 POST-ACQUISITION LOAD LOGIC

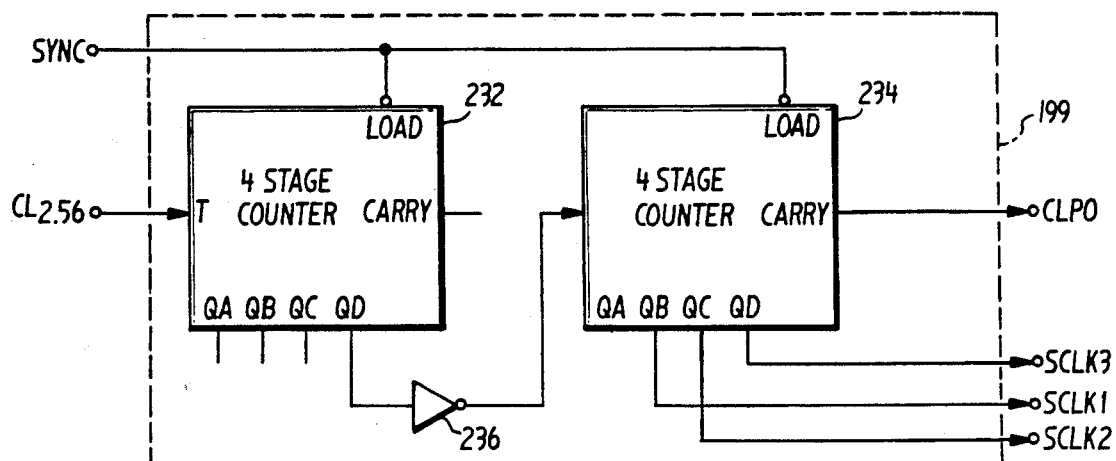
FIG. 20 POST-ACQUISITION SYNC COUNTER
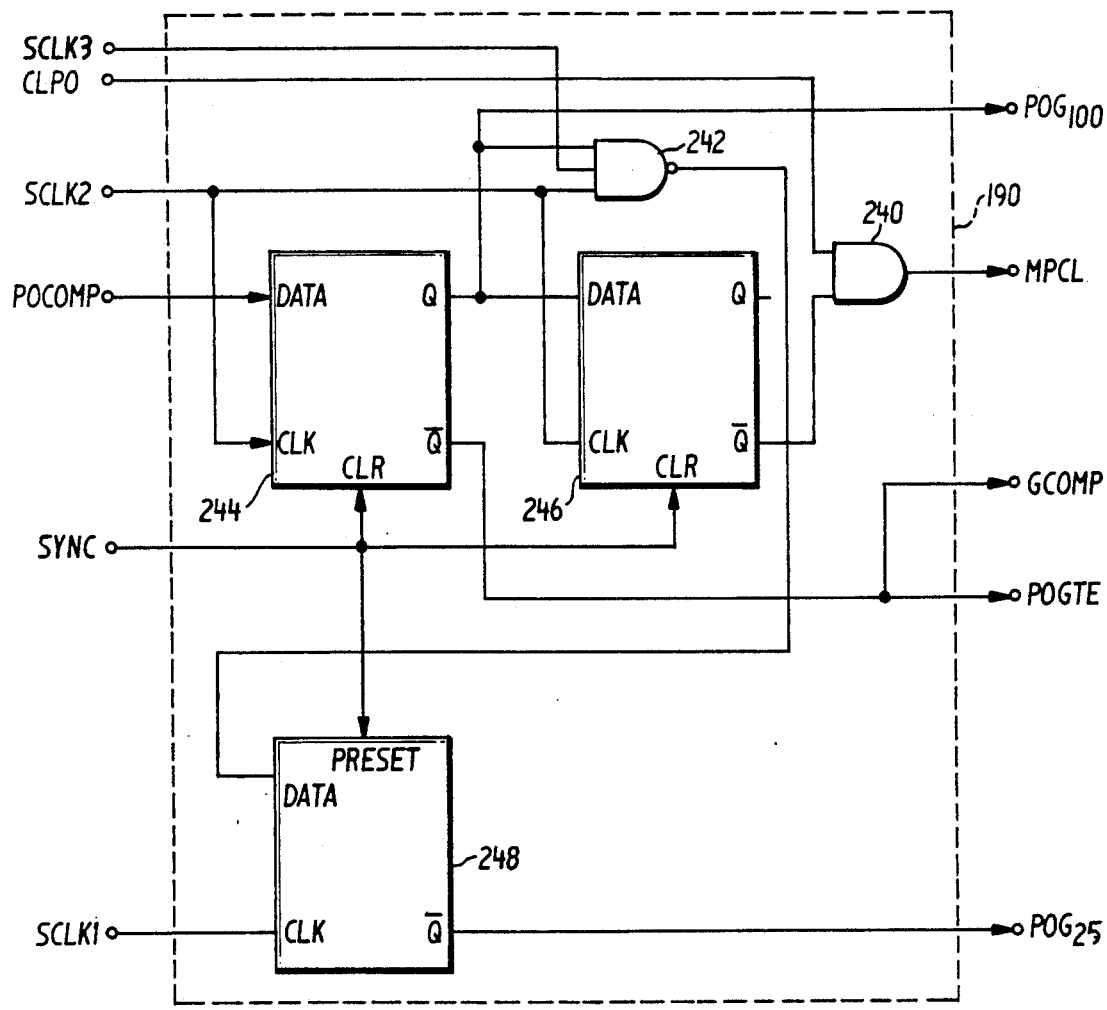
FIG. 21 POST-ACQUISITION GATE GENERATOR

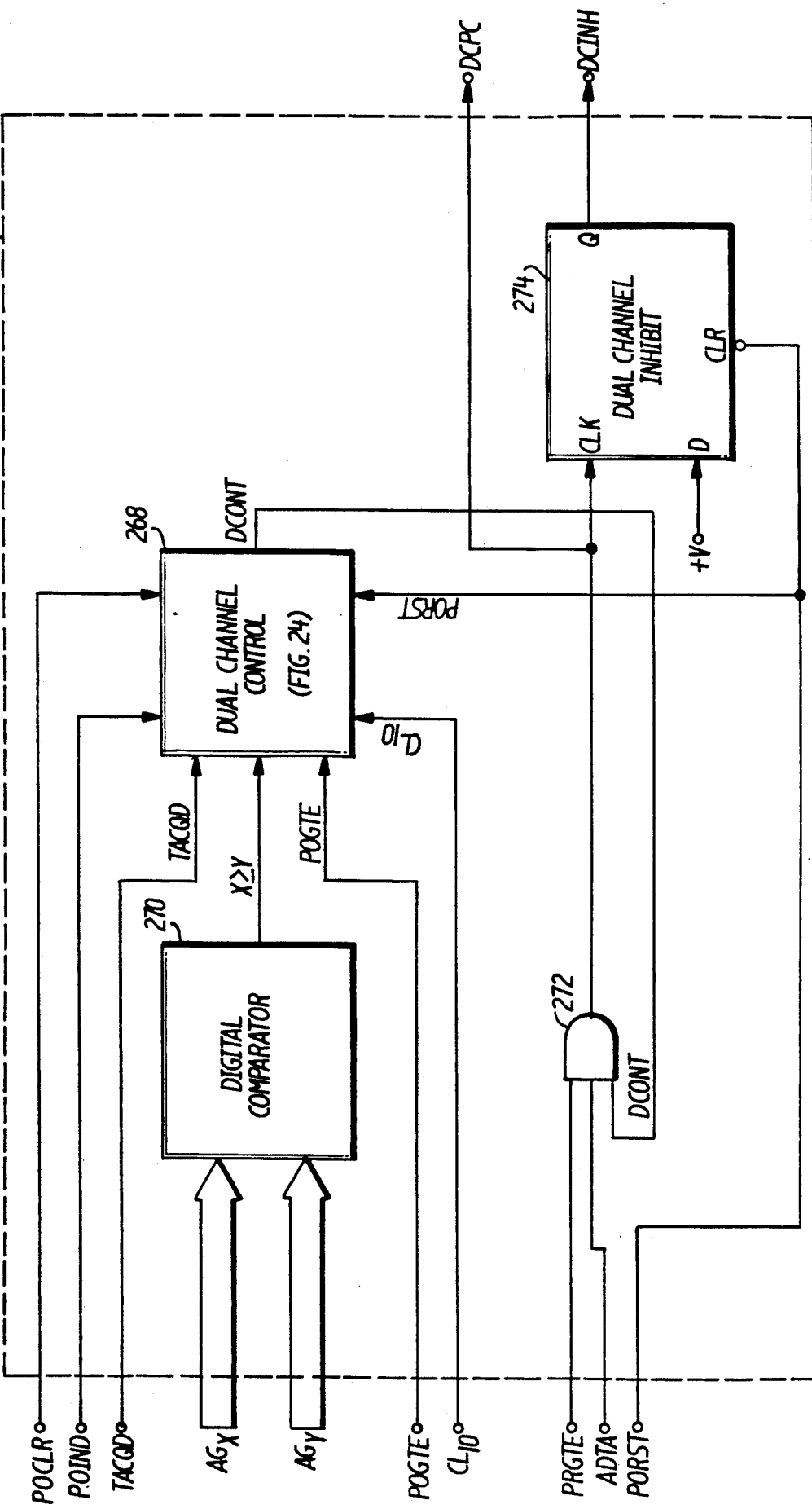
FIG. 23 DUAL CHANNEL LOGIC

METHOD AND SYSTEM FOR PULSE INTERVAL MODULATION

BACKGROUND OF THE INVENTION

The present invention relates to a method and system for pulse interval modulation of wave energy and, in particular, to a method and system for encoding and decoding wave energy in accordance with selectable pulse interval modulation code sequences. The invention has particular utility in connection with laser designators and laser seekers and, while clearly not limited to this application, will be described hereinafter in connection with laser designators and seekers to facilitate an understanding thereof.

Laser target designators are used to covertly point out a target for laser seeker-equipped aircraft and for the laser designation of targets to provide semi-active guidance of free fall bombs or for the guidance of laser guided missiles. In such a system, pulses of laser energy of high peak power and short duration, e.g., a pulsed solid state laser such as Nd:YAC or Nd:Glass lasing material, are transmitted from the target designator to illuminate a target for tracking or guidance purposes. In an area containing numerous targets, several laser designators may be operating simultaneously and the return energy may cause interference between friendly systems. Thus it becomes necessary for each system operating in one area to be capable of distinguishing the signal from one designator from that of another designator.

In addition, with the proven effectiveness of laser designator systems it is likely that laser countermeasures will eventually be developed and become a serious threat to their continued success. It is thus of utmost importance that the system be relatively immune to at least those types of countermeasures such as PRF predicters and repeaters which could be presently available.

It is accordingly an object of the present invention to provide a novel coding method and system.

It is a more specific object of the present invention to provide a novel pulse interval modulation coding method and system particularly suited for use in connection with laser target designation systems.

It is yet another object of the present invention to provide a novel pulse interval modulation encoder for encoding the wave energy signal in accordance with a desired code sequence.

It is a further object of the present invention to provide a novel pulse interval modulation decoding method and system for selectively decoding pulse interval modulation encoded wave energy signals.

It is still another object of the present invention to provide a novel wave energy encoding and decoding method and system wherein a large number of different codes are provided.

It is still a further object of the present invention to provide a novel pulse interval modulation encoding and decoding system wherein the intervals between any two adjacent pairs of pulses is unique to a code sequence.

It is another object of the present invention to provide a novel method and system for selectively generating any of a large number of code sequences including selectable pulse repetition frequency (PRF) and pulse interval modulation (PIM) codes through a memory addressing technique.

It is yet a further object of the present invention to provide a novel method and coding system for pulse signals wherein a coded signal can be recognized as being the desired signal upon receipt of only three successive pulses of the signal.

It is still another object of the present invention to provide a novel method and system for encoding and decoding signals in accordance with a large number of selectable codes through a memory addressing technique wherein entirely new codes may be made available by merely changing an integrated circuit memory.

It is still a further object of the present invention to provide a novel method and system for decoding a pulse interval modulated signal wherein a signal from a repeater type countermeasure may be distinguished from a desired signal.

It is an additional object of the present invention to provide a novel method and laser target designation system wherein unique code sequences permit a laser seeker to operate selectively with a laser designator and provide a high degree of immunity to countermeasures.

It is yet another object of the present invention to provide a novel pulse interval modulation coding method and system utilizing novel pulse arrangements such that only one internal pair at any position in the code need be correctly identified in order that a particular code can be recognized.

These and other objects and advantages of the present invention will become apparent to one skilled in the art to which the invention pertains from a perusal of the following detailed description when read in conjunction with the attached drawings.

THE DRAWINGS

FIG. 1 is a broad functional block diagram of the system of the present invention;

FIG. 2 is a series of waveforms illustrating the code of the present invention;

FIG. 3 is a general functional block diagram of the PIM encoder of FIG. 1;

FIG. 4 is a more detailed functional block diagram of the address generator of the PIM encoder of FIG. 3;

FIG. 5 is a more detailed functional block diagram of the time interval generator of the PIM encoder of FIG. 3;

FIG. 6 is a more detailed functional block diagram of the initial reset circuit of FIG. 3;

FIG. 7 is a broad functional block diagram of the PIM decoder of FIG. 1;

FIG. 8 is a functional block diagram of the pre-acquisition code generator of FIG. 7;

FIG. 9 is a functional block diagram of the post-acquisition code generator of FIG. 7;

FIG. 10 is a functional block diagram of the pre-acquisition search circuit of FIG. 7;

FIG. 11 is a schematic circuit diagram of the pre-acquisition clock logic circuit of FIG. 10;

FIG. 12 is a schematic circuit diagram of the digital correlator of FIG. 10;

FIGS. 12a through 12c are a series of waveforms illustrating the operation of the digital correlator of FIG. 12;

FIG. 13 is a schematic circuit diagram of the 3 of 4 decoder of FIG. 10;

FIG. 14 is a schematic circuit diagram of the frequency select circuit of FIG. 10;

FIG. 15 is a schematic circuit diagram of the delay compensation circuit of FIG. 10;

FIG. 16 is a schematic circuit diagram of the pre-acquisition gate generator of FIG. 10;

FIG. 17 is a schematic circuit diagram of the stop scan function circuit of FIG. 10;

FIG. 18 is a functional block diagram of the post-acquisition track circuit of FIG. 7;

FIG. 19 is a schematic circuit diagram of the post-acquisition load logic circuit of FIG. 18;

FIG. 20 is a schematic circuit diagram of the post-acquisition sync counter of FIG. 18;

FIG. 21 is a schematic circuit diagram of the post-acquisition gate generator of FIG. 18;

FIG. 22 is a schematic circuit diagram of the gate select logic circuit of FIG. 18;

FIG. 23 is a more detailed functional block diagram of the dual channel logic circuit of FIG. 18;

FIG. 24 is a schematic circuit diagram of the dual channel control circuit of FIG. 23;

FIG. 25 is a chart illustrating the relationship of the FIGS. 25a-25d; and,

THE DETAILED DESCRIPTION

The present invention is hereinafter described in the laser designator and seeker application with which it has particular utility. While it is to be understood that the invention has many other applications and is not to be limited thereto, an understanding of the invention in this laser application may be gained from the following detailed description of a preferred embodiment organized with the following Table of Contents:

TABLE OF CONTENTS

Figure 25A:
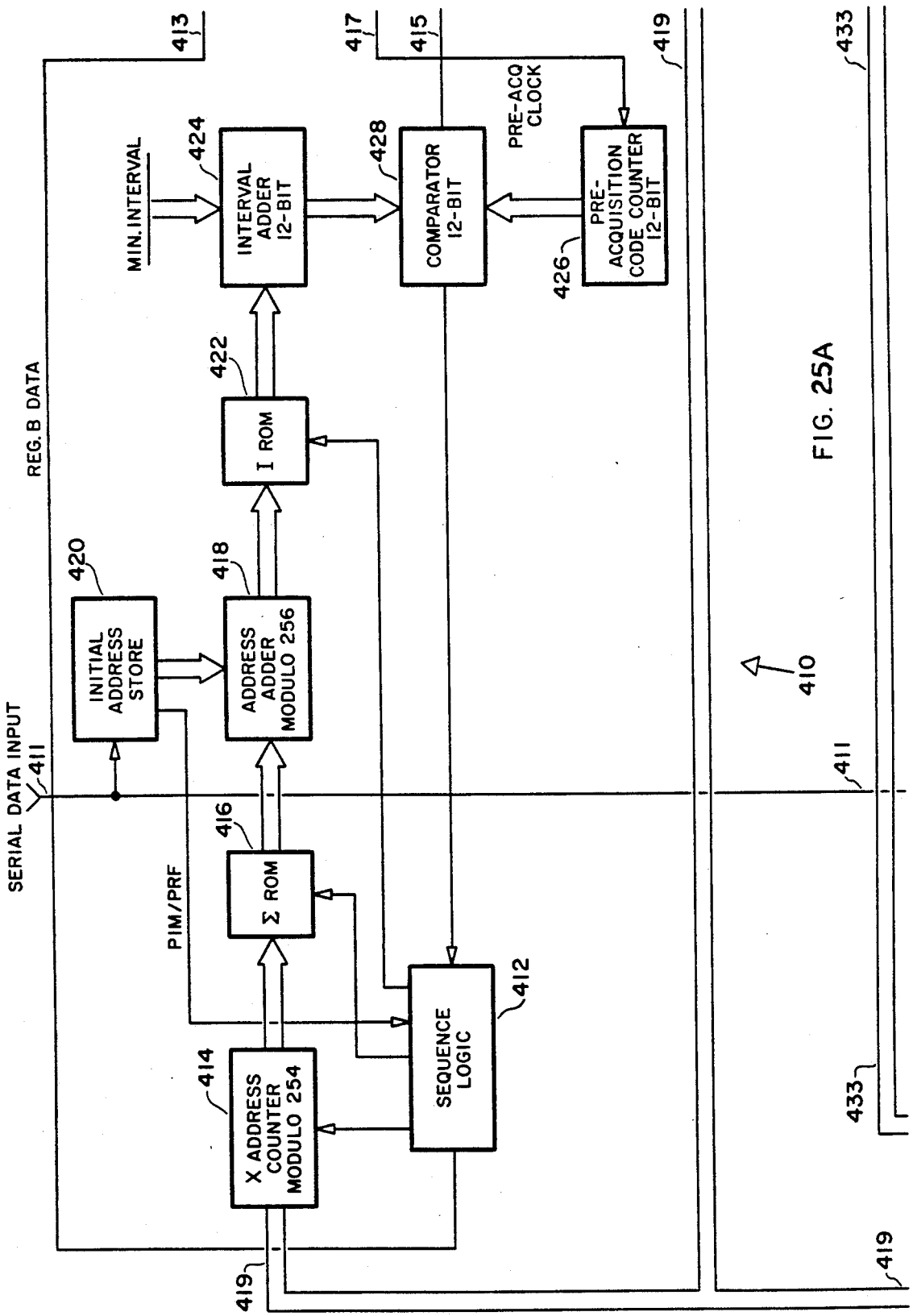
FIGS. 25A-25D are collectively another functional block diagram of the PIM decoder of FIG. 1.
Figure 25B:
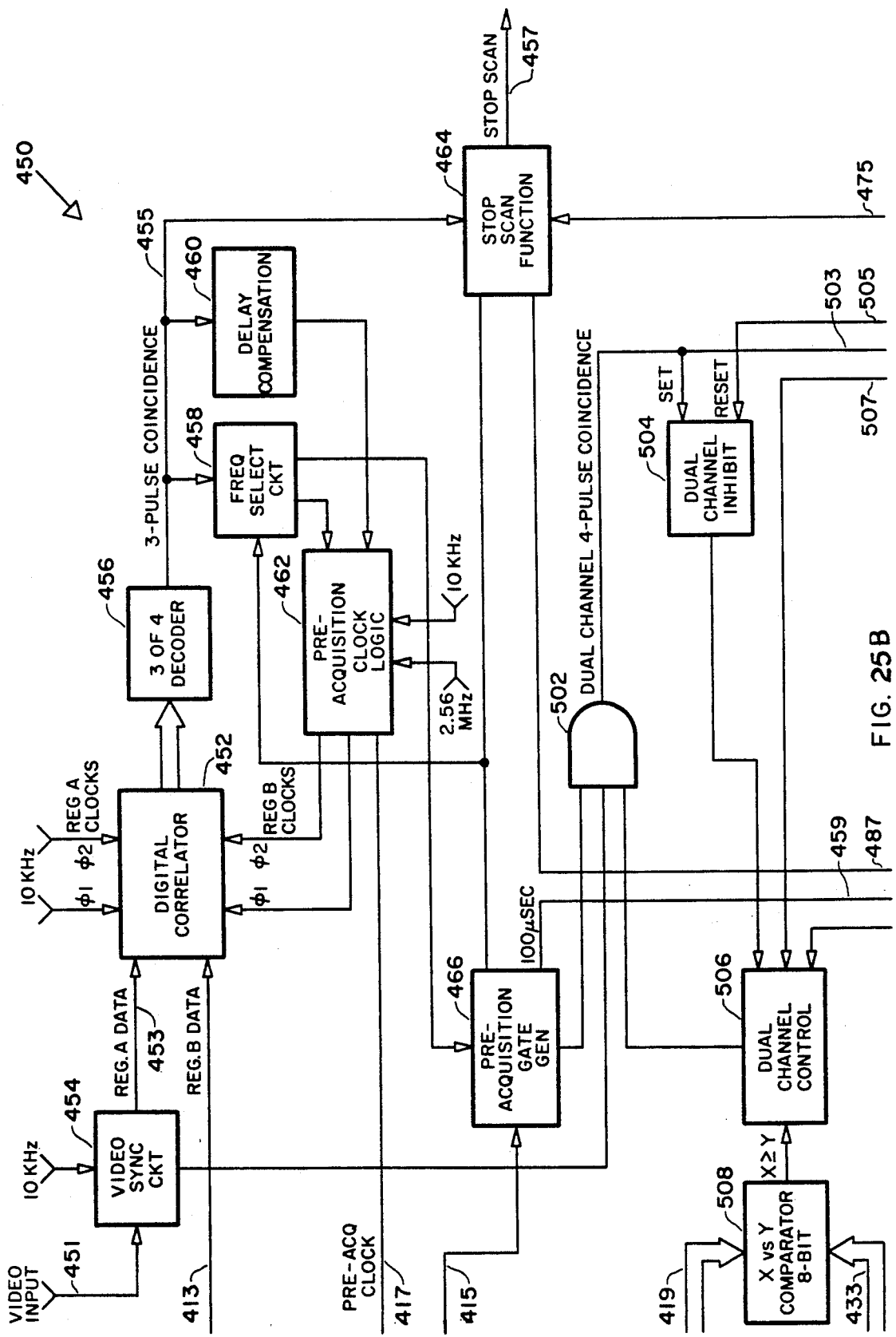
Figure 25C:
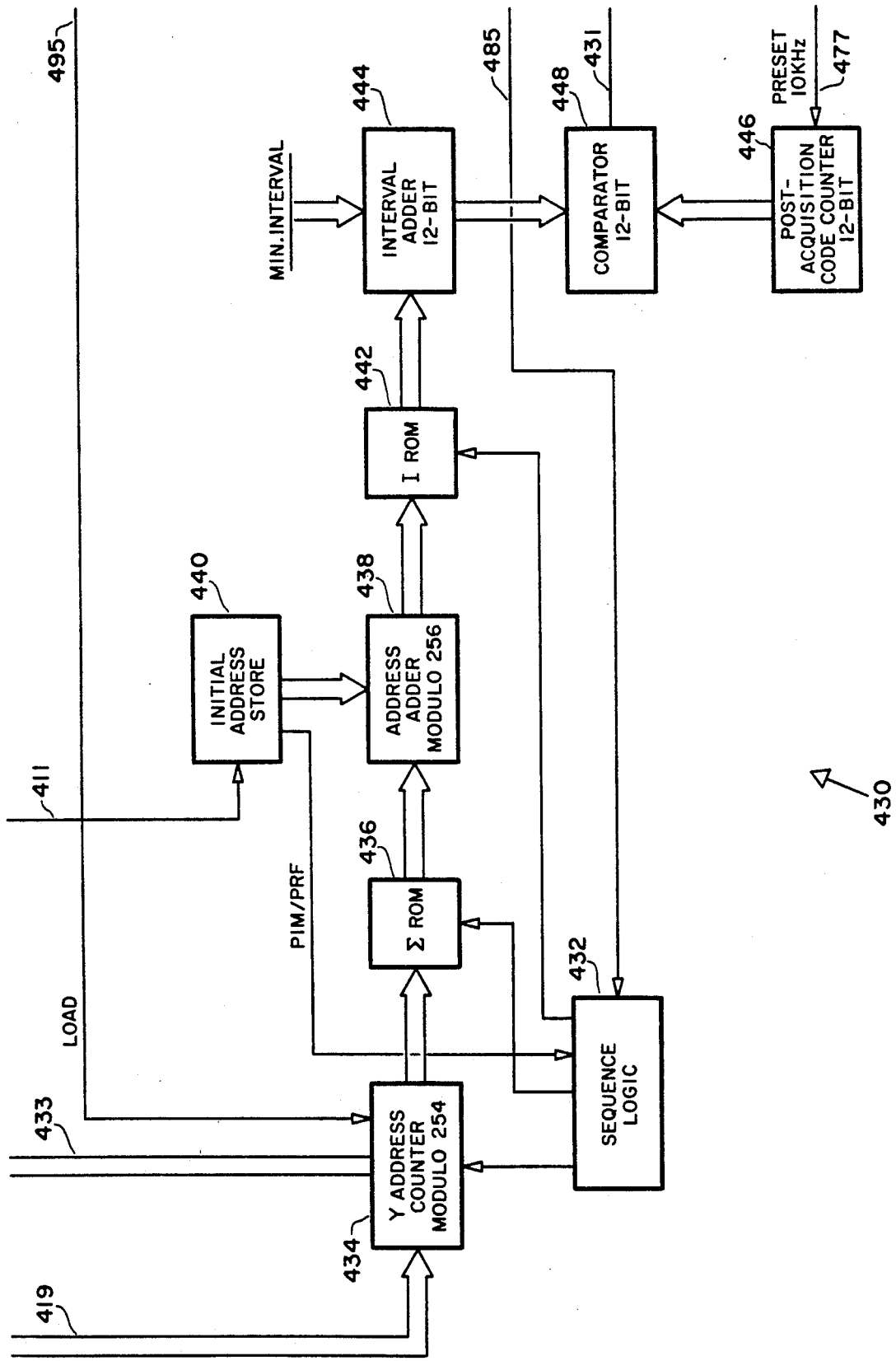
Figure 25D:
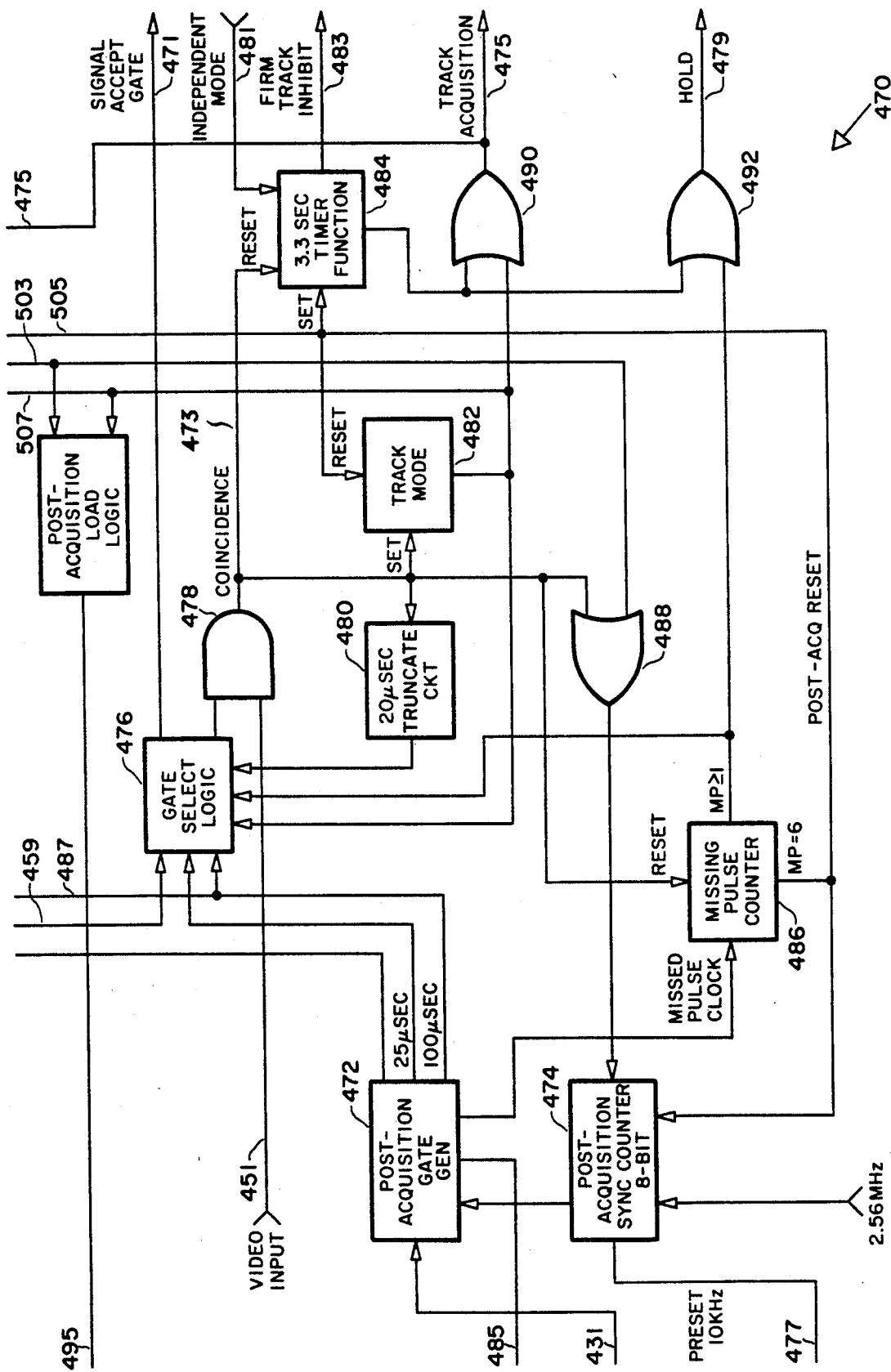

General Systems Description (FIG. 1)
The Code (FIG. 2)
The Encoder (FIGS. 3-6)
  General Description (FIG. 3)
  Address Generator (FIG. 4)
  Time Interval Generator (FIG. 5)
  Initial Reset Circuit (FIG. 6)
The Decoder (FIGS. 7-24)
  General Description (FIG. 7)
  Pre- and Post-Acquisition Code Generators (FIGS. 8 and 9)
  Pre-Acquisition Search Circuit (FIG. 10)
  Pre-Acquisition Clock Logic Circuit (FIG. 11)
  Digital Correlator (FIG. 12)
  3 of 4 Decoder (FIG. 13)
  Frequency Select Circuit (FIG. 14)
  Delay Compensation Circuit (FIG. 15)
  Pre-Acquisition Gate Generator (FIG. 16)
  Stop Scan Function Circuit (FIG. 17)
  Post-Acquisition Track Circuit (FIG. 18)
  Post-Acquisition Load Logic Circuit (FIG. 19)
  Post-Acquisition Sync Counter (FIG. 20)
  Post-Acquisition Gate Generator (FIG. 21)
  Gate Select Logic Circuit (FIG. 22)
  Dual Channel Logic Circuit (FIG. 23)
  Control Circuit (FIG. 24)
Description of PIM Decoder of FIG. 25.

GENERAL SYSTEM DESCRIPTION

The encoding of the wave energy and the rapid and accurate decoding thereof according to the present invention permits a system to operate in the presence of interference by other friendly sources of wave energy or by deliberate electronic countermeasures. The present invention therefore has numerous applications in connection with radar systems, target designation systems and other systems wherein it is desirable to encode wave energy in a manner which permits a receiver of the energy to distinguish between a desired signal and an undesired signal. However, since the invention is particularly useful in connection with laser target designation systems, the invention is hereinafter described in this connection to facilitate an understanding thereof.

For example, as is illustrated in FIG. 1, wave energy from a wave energy transmitting unit 20, e.g., light wave energy from a laser target designator may be directed at a target 22 and the reflected energy utilized by a wave energy receiving unit 24 of a weapons system for tracking the target 22 and/or guiding a missile or other projectile to the target 22. In a typical laser target designation system, the transmitting unit may be carried, for example, by a spotter aircraft or ground unit and the missiles or projectiles may be launched from an air or ground unit. The launched missile or projectile may be guided to the target by a suitable guidance system including the wave energy receiver 24.

In the preferred embodiment of the present invention as applied to a laser target designation system, the wave energy transmitting unit 20 may comprise a code selector 26 for selecting a desired pulse interval modulated code (PIM) and a PIM encoder 28 for generating the selected PIM code for application to a suitable pulsed laser 30. The pulses of wave energy spaced in accordance with the selected PIM code (described hereinafter in greater detail) are transmitted from the pulsed laser 30 toward the target 22 along an optical path indicated at 32. These spaced pulses are reflected from the target 22 and received by a suitable light detector or receiver 34 in the wave energy receiving unit 24.

The signal from the receiver 34 in the wave energy receiving unit 24 is then decoded by a PIM decoder 36, the operation of which may be controlled by a code selector 38 as is subsequently described in detail. The desired received signal may then be applied to a control unit 40 for use in controlling a guidance system, for example.

In operation as a laser target designation system for designating targets to a guided missile or projectile weapons system, the wave energy transmitting unit 20 may be a hand-held unit or other portable unit and may be either surface based or air based. A particular PIM code may be assigned to the transmitting unit 20 to distinguish that unit from all other friendly units operating in the area and to permit the recognition of the signal transmitted by the transmitting unit 20 by a particular receiving unit. The transmitting unit 20 thus transmits a pulse laser signal encoded in accordance with a preselected code toward the target 22 to be designated.

The laser energy reflected from the target 22 is received by the receiving unit 24 and decoded thereby. If the code selector 38 of the receiving unit 24 is set to the same code to which the code selector 26 of the transmitting unit 20 is set, the received signal is decoded by the decoder 36 and signals may be supplied to the control unit 40 to provide a control function such as guiding a missile or projectile toward the target 22.

It is thus clear that in an area of multiple targets wherein several laser target designators may be operating simultaneously to designate different targets, different codes may be assigned to each target designator. In a like manner, codes corresponding to the various designator codes may be assigned to the various receiving units within those missiles or projectiles which are to be directed toward the various designated targets. Thus, a designator or transmitting unit may designate a target to a particular receiving unit in the presence of numerous other friendly operating designators. Moreover, as is hereinafter described in greater detail, the receiving unit 24 rejects all but the PIM code selected by the code selector 38 and deliberate electronic countermeasures are ineffective to jam or spoof the receiving unit.

THE CODE

As was previously mentioned in connection with FIG. 1, the transmitted pulses of wave energy are coded in accordance with a pulse interval modulation (PIM) code. In the pulse interval modulation code of the present invention, the information or coding carried by the pulses is carried in the form of the spacing or time intervals between adjacent pulses.

Specifically and with reference now to FIG. 2, a plurality of discrete interpulse intervals, e.g., the four intervals A, B, C and D of FIG. 2a, are arranged in accordance with the present invention to produce the PIM code. By combining the intervals into pairs of intervals, unique ordered pairs of intervals equal in number to the square of the number of discrete interpulse intervals may be provided. This may be represented in accordance with the exemplary discrete intervals A, B, C, and D of FIG. 2a as the below tabulated sixteen unique ordered pairs of interpulse intervals:

TABLE I

| AA | BA | CA | DA |
| AB | BB | CB | DB |
| AC | BC | CC | DC |
| AD | BD | CD | DD |

The unique ordered pairs of Table I can then be arranged serially to form various codes. For example, a predetermined number of the unique interval pairs of Table I may be serially combined to form cyclically repetitive sets or code words of a predetermined length, i.e., having a predetermined number of interval pairs. One possible code arrangement utilizing the unique interval pairs of Table I may be that illustrated in FIGS. 2b-2e and shown below as follows:

TABLE II

| Code I. D. | Unique Interval Pairs | Combined Interval Pairs (2 cycles) |
| --- | --- | --- |
| CODE 1: | (AB) (BD) (DC) (CA) | ABDCABDCA... |
| CODE 2: | (AC) (CD) (DB) (BA) | ACDBACDBA... |
| CODE 3: | (BB) (BC) (CC) (CB) | BBCCBBCCB... |
| CODE 4: | (AA) (AD) (DD) (DA) | AADDAADDA... |

It should be noted that in connection with the above example of Table II, the product of the number of codes and the code lengths (expressed in terms of the number of unique interval pairs in one cycle of the code) is equal to the total number of unique interval pairs available. This arrangement maximizes the use of the available interval pairs in that all interval pairs are used in one of the codes. Another arrangement, for example, might be an arrangement of eight unique interval pairs in each cycle of each code resulting in two unique PIM codes.

In Table II and in FIGS. 2b-2e, it can be seen that two successive, adjacent pulse intervals form unique interval pairs, i.e., pairs which are used only once in each cycle. To facilitate the encoding and decoding of the transmitted pulse signal, the pairs are preferably selected so that the adjacent intervals including the first and last intervals in each cycle are identical thus permitting the elimination of interval duplication in the final code structure, i.e., the sharing of a common interval between adjacent pulse interval pairs.

It can be seen from the foregoing description of the PIM code of the present invention that through the use of only I discrete interpulse intervals, $I^2$ unique interval pairs are available for forming the PIM code. Thus, with four different available intervals, sixteen unique interval pairs are available to form serial codes.

If the number of unique interval pairs in each cycle of the code is an integer L, the number of available codes C may be expressed by the equation:

$$C = \frac{I^2}{L} \tag{1}$$

Thus, with the four exemplary intervals A, B, C and D forming codes each having four interpulse interval pairs per cycle, four different codes, e.g., Codes 1-4 of Table II, are available.

By making the code length much longer than four interval pairs, each resulting code appears to consist of a plurality of randomly spaced pulses making code duplication almost impossible. However, the spacing between adjacent pulses, i.e., each interval, is unique and known for a particular set of code words, and the spaces between any successive pairs of adjacent pulses, i.e., each interval pair, is unique to a particular code word of a particular set. The spacing of the pulses is therefore not random but, since it appears to be random, may be termed "psuedo-random".

Moreover, since all interval pairs are unique within any one cycle or word of any code, only one interval pair at any position in the code need be correctly identified in order to recognize a particular code. Thus, in the exemplary codes of Table II, if the interval pair AA is successfully identified, the received code must be Code 4.

THE ENCODER

General Description

The previously described PIM code sequences described in connection with FIGS. 2b-2e may be generated in the form of pulse trains interval modulated by the PIM encoder 28 of FIG. 1 in accordance with a selected code. The selected interval modulated pulse train may then be utilized to pulse the laser 30 for transmission of the PIM encoded wave energy.

A preferred embodiment of the encoder 28 of the present invention is illustrated in greater detail in the functional block diagrams of FIGS. 3-6. By way of introduction, the encoder 28 generates a large number of unique PIM codes through the use of a unique read only memory (ROM) addressing techniques as will hereinafter become apparent from the description read in conjunction with FIGS. 3-6. However, prior to describing the PIM encoder circuit, a brief discussion of the theory of operation of the encoder may facilitate an understanding of the invention.

As was previously described, if each code word comprises the same number L of unique pairs of pulse intervals and there are I different intervals available, the number of available code words C is given by equation (1).

In utilizing the ROM encoding technique of the present invention, the I unique intervals are stored in memory, i.e., in an interval read only memory (IROM), and each interval is assigned an exclusive address ADS ranging, for example, from 0 to I−1. An example of the IROM contents and associated addresses in a situation in which there are eight intervals I may be as follows:

TABLE III

| IROM POSITION | ADS | INTERVAL |
| --- | --- | --- |
| 1 | 0 | A |
| 2 | 1 | B |
| 3 | 2 | C |
| 4 | 3 | D |
| 5 | 4 | E |
| 6 | 5 | F |
| 7 | 6 | G |
| 8 | 7 | H |

To select the intervals stored in the IROM to form code words each containing L unique interval pairs, an initial interval address $ADS_I$, e.g., $ADS_1$, may first be selected. After the interval designated by this initially selected address $ADS_I$ has been read from the IROM, a next interval address is then selected and the corresponding interval read from the IROM. This selection process continues until a code word is generated at which time the code word is repeated to generate another cycle or word of the same code.

The intervals must, of course, be read from the IROM in some manner which insures the generation of unique interval pairs both within one word of a particular code and between codes in a set of codes. This is accomplished in accordance with the preferred embodiment of the invention by arbitrarily selecting an initial interval address $ADS_I$ as the first interval address and thereafter generating unique address pairs.

More specifically, a unique address difference $\Delta$ from a predetermined list of unique address differences may be added to the initial interval address to obtain the next interval address. Subsequent interval addresses may be obtained by sequentially adding the address differences from the list to the current interval address.

The unique address differences may be, for example, equal in number to the number of interval pairs in each code word and may range in value from $\Delta_1=1$ to $\Delta_i=I$. A particular $\Delta$ may only be used once in each cycle of the code, i.e., in each code word, to insure that there are no repeated ordered interval pairs either in a code word or between different code words. If it is desired to avoid interval pairs which are the same interval for each value of the pair, the value $\Delta=I$ must be omitted. Moreover, in order to provide a cyclic code which repeats after L intervals pairs, the sum of all the $\Delta$'s must be equal to the product of the number of available intervals I times an integer J. This relationship may be expressed as follows:

$$\sum_{i=1}^{L} \Delta_i = I \cdot J \qquad (2)$$

Equation (2) insures that the code is cyclic by insuring that the sum of the $\Delta$'s is an integral multiple of I. This condition may be easily complied with where the number of discrete intervals I is an even number by excluding the value $\Delta=I/2$ from the address differences or $\Delta$ list.

To facilitate an understanding of the effect on equation (2) of the omission of the values I and I/2 from the $\Delta$ list, it should first be noted that the sum of a consecutive set of numbers is the product of the average value and the number of integers. This may be expressed as:

$$\sum_{N=i}^{k} N = \frac{i+k}{2}(k+1-i) \qquad (3)$$

Remembering that the value $\Delta=I$ is omitted to avoid duplicate intervals in a pair, then the sum of the $\Delta$'s minus the I/2 value would be $$\sum_{i=1}^{i=I-1} \Delta_i - \frac{I}{2} = \frac{1+I-1}{2}(I-1) - \frac{I}{2} \qquad (4)$$

$$= \frac{I^2}{2} - I$$

$$= I\left(\frac{I}{2} - 1\right)$$

Since I is an even number, I/2 is an integer and therefore (I/2)−1 is also an integer, thus meeting the requirement that the sum be an integral multiple of I.

In the preferred implementation of the foregoing ROM encoding technique, the $\Delta$'s are not used directly but are replaced by the partial sums of the $\Delta$'s in a sum read only memory ($\Sigma$ROM). In arriving at the sum list, the $\Delta$'s are arranged so that the sum values are also unique to insure that no interval appears more than once in a code word.

Briefly summarizing, the following restrictions are met in generating code words in accordance with the preferred embodiment of the invention:

1. No $\Delta$ is used more than once;
2. The value $\Delta=I$ is not used;
3.

$$\sum_{i=1}^{L} \Delta_i = I \cdot J$$

where J=any positive integer;

4.

$$\sum_{i=1}^{m} \Delta_i \neq I \cdot J$$

where m=any positive integer <L; and
5. No $\Sigma$ value appears more than once.

With the above restrictions met, a code word may be generated by adding the first sum value $\Sigma_I$ to a selected initial address $ADS_I$ of one of the intervals to obtain the address of the next interval in the code. The second sum value is then added to the initial address $ADS_I$ to obtain the address of the next successive interval. This may be expressed generally for any address $ADS_{K+1}$ by the equation:

$$ADS_{K+1} = ADS_I + \Sigma_K \qquad (5)$$

Whenever the highest available address is exceeded by the resultant sum of the initial address $ADS_I$ and the sum value $\Sigma_K$, the value of the total number of available intervals I is subtracted from this resultant sum. In this manner the resultant sum $ADS_{K+1}$ is adjusted until it falls within the range of available interval addresses.

Moreover, it should be noted that in view of the previously described restrictions on the system, each initial address between and including $ADS_I=0$ and $ADS_I=I-1$ results in a different code word. Thus each code word may be selected by presetting the initial address $ADS_I$ as desired.

To further facilitate an understanding of the invention prior to proceeding with the detailed description of the preferred encoder of FIG. 3 an exemplary set of code words, CODE 1-CODE 8, each having six interval pairs, may be generated using the exemplary eight intervals A-H of Table III by selecting initial addresses as follows:

| | CODE 1 ($ADS_I = 0$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 0 | A |
| 2 | 1 | 1 | 1 | B |
| 3 | 3 | 4 | 4 | E |
| 4 | 2 | 6 | 6 | G |
| 5 | 5 | 11 | 3* | D |
| 6 | 7 | 18 | 2 | C |
| 7** | 6 | 24 | 0 | A |

*$ADS_I + \Sigma_K > I$; Therefore $ADS = ADS_I + \Sigma_K - I = 11 - 8 = 3$
**Code word starts repeating

| | CODE 2 ($ADS_I = 1$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 1 | B |
| 2 | 1 | 1 | 2 | C |
| 3 | 3 | 4 | 5 | F |
| 4 | 2 | 6 | 7 | H |
| 5 | 5 | 11 | 4 | E |
| 6 | 7 | 18 | 3 | D |
| 7 | 6 | 24 | 1 | B |

| | CODE 3 ($ADS_I = 2$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 2 | C |
| 2 | 1 | 1 | 3 | D |
| 3 | 3 | 4 | 6 | G |
| 4 | 2 | 6 | 0 | A |
| 5 | 5 | 11 | 5 | F |
| 6 | 7 | 18 | 4 | E |
| 7 | 6 | 24 | 2 | C |

| | CODE 4 ($ADS_I = 3$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 3 | D |
| 2 | 1 | 1 | 4 | E |
| 3 | 3 | 4 | 7 | H |
| 4 | 2 | 6 | 1 | B |
| 5 | 5 | 11 | 6 | G |
| 6 | 7 | 18 | 5 | F |
| 7 | 6 | 24 | 3 | D |

| | CODE 5 ($ADS_I = 4$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 4 | E |
| 2 | 1 | 1 | 5 | F |
| 3 | 3 | 4 | 0 | A |
| 4 | 2 | 6 | 2 | C |
| 5 | 5 | 11 | 7 | H |
| 6 | 7 | 18 | 6 | G |
| 7 | 6 | 24 | 4 | E |

| | CODE 6 ($ADS_I = 5$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 5 | F |
| 2 | 1 | 1 | 6 | G |
| 3 | 3 | 4 | 1 | B |
| 4 | 2 | 6 | 3 | D |
| 5 | 5 | 11 | 0 | A |
| 6 | 7 | 18 | 7 | H |
| 7 | 6 | 24 | 5 | F |

| | CODE 7 ($ADS_I = 6$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 6 | G |
| 2 | 1 | 1 | 7 | H |
| 3 | 3 | 4 | 2 | C |
| 4 | 2 | 6 | 4 | E |
| 5 | 5 | 11 | 1 | B |
| 6 | 7 | 18 | 0 | A |
| 7 | 6 | 24 | 6 | G |

| | CODE 8 ($ADS_I = 7$) | | | |
|---|---|---|---|---|
| Interval Sequence | $\Delta$ | $\Sigma_K$ | $ADS_I + \Sigma_K$ (Current Address) | Interval |
| 1 | (Initial address for 1st interval) | | 7 | H |
| 2 | 1 | 1 | 0 | A |
| 3 | 3 | 4 | 3 | D |
| 4 | 2 | 6 | 5 | F |
| 5 | 5 | 11 | 2 | C |
| 6 | 7 | 18 | 1 | B |
| 7 | 6 | 24 | 7 | H |

It can be seen from the above example that the described ROM address difference technique provides, from eight unique intervals A-H, a set of eight unique code words CODE 1-CODE 8 each containing six unique interval pairs. It is further illustrated that each interval pair selected by the ROM address difference technique is unique within a code word and is unique to a code word in the set of eight words. With this clear understanding of the preferred form of the encoding technique of the present invention, the encoder of FIG. 3 may now be described in detail.

Referring now to FIG. 3, a preferred embodiment of the PIM encoder 28 of the present invention, suitable for providing 256 unique PIM codes each containing 254 unique pulse intervals, is illustrated.

A suitable code selector 26 comprising, for example, a plurality of manually settable switches operable to provide output signals $AI_0$-$AI_{N-1}$ where the value of N is equal to the number of digits required to represent the highest address of the available intervals in a selected digital code. In the FIG. 3 embodiment wherein the highest interval address is 256, eight binary bits $AI_0$-$AI_7$ are provided to represent a selected initial address $ADS_I$ encoded in either binary or three digit octal form, thus providing either a 256 address or 512 address capability, respectively.

The signals $AI_0$-$AI_7$ from the code selector 26 may be applied to the input terminals A0-A7 of an address adder 40 which may comprise any suitable conventional eight bit parallel adder, and a mode select signal PIM/PRF from the code selector 26 may be applied to an input terminal CSEL of an address generator 42 described hereinafter in greater detail in connection with FIG. 4. The address generator 42 may be, for example, a suitable conventional modulo 254 or ring counter which cyclically counts from 0 to 253 (i.e., provides 254 addresses).

The binary bits AG0-AG7 of the generated address signal from the address generator 42 are applied to the address input terminal I0-I7, respectively, of a suitable conventional "sum" read only memory ($\Sigma$ROM) 44 and a sum strobe signal ($\Sigma$STR) from the address generator 42 is applied to the read memory or RM input terminal of the $\Sigma$ROM. The binary bits $\Sigma 0 - \Sigma 7$ of the output signal from the output terminals $\phi 0$-$\phi 7$ of the $\Sigma$ROM 44 are applied to the input terminals B0-B7 of the address adder 40 and the binary bits AA0-AA7 of the output signal $ADS_{K+1}$ [see equation (5)] from the respective sum output terminals S0-S7 of the address adder 40 is applied to the respective address input terminal I0-I7 of an interval read only memory (IROM) 46.

An interval read only memory strobe or ISTR signal is applied from the address generator 42 to the read memory or RM input terminal of the IROM 46 and the binary bits INT0-INT7 output signal from the IROM 46 are applied to a time interval generator 48 described hereinafter in greater detail in connection with FIG. 5. A time interval reset or IRST signal from the address generator 42 is applied to the reset input terminal R of the time interval generator 48 and a comparator output or COMP signal from the time interval generator 48 may be applied to the address generator 42. The address generator may utilize the COMP signal to generate an inverted code or $\overline{CODE}$ signal and the $\overline{CODE}$ signal may be applied from the address generator 42 to a suitable conventional output driver circuit 50. The output driver circuit 50 may amplify and invert the $\overline{CODE}$ signal to provide the code output signal CODE.

A suitable conventional oscillator circuit 52 such as a stable free-running multivibrator may provide an output signal OSC to a suitable conventional timing signal generator 54 such as a plurality of frequency dividers. For example, the oscillator 52 may generate a 5.12 MHz. signal and the timing signal generator 54 may divide this signal by 32 to obtain a 160 KHz. clock signal $C_1$ and may further divide the signal $C_1$ in frequency by 16 to generate a 10 KHz. output signal $C_2$. The output signal $C_1$ may be applied to a clock input terminal C of the address generator 42 and the output signal $C_2$ may be applied to a clock input terminal C of the interval time generator 48.

A master reset or $\overline{MRST}$ signal may be generated by an initial reset circuit 56 as is hereinafter described in connection with FIG. 6 or in any other suitable manner to initialize the logic circuits in the PIM encoder. The $\overline{MRST}$ signal may be applied to the reset input terminals of the address generator 52 and the timing signal generator 54 so that these circuits may be initialized when, for example, the system is first energized.

In operation, the $\overline{MRST}$ signal from the initial reset circuit 56 resets all logic circuits to their initial states. The address generator 42, a modulo 254 or ring counter, provides a binary output signal, i.e., an 8 bit parallel binary word, representing the initial address for the sum read only memory $\Sigma$ROM 44. This initially generated address is preferably a binary ZERO, i.e., the modulo 254 counter is initially set to a count of zero.

Prior to the address generator 42 being clocked to a count of one in response to the $C_1$ clock signal, the sum signal located at the position in the $\Sigma$ROM initially addressed is strobed or read by the strobe signal $\Sigma$STR applied to the read memory or RM input terminal and the addressed sum signal is strobed to the address adder 40.

The sum signal $\Sigma$ applied to the address adder 40 from the sum read only memory 44 is added to the selected initial address signal AI from the code selector 26 by the address adder 40 and the output signal from the address adder 40, the current interval address, addresses the proper location in the interval read only memory 46. It should be noted that the problem of exceeding the highest address in the IROM 46 is eliminated by the address adder 40 in that the adder output signal can never exceed 255. When the sum of the AI and $\Sigma$ signal exceeds 255, the address adder in effect subtracts 256 from the total by providing a carry signal and a remainder (the desired address).

After this interval has been addressed, the ISTR signal strobes the addressed interval out of the interval read only memory 46 to the time interval generator 48. The time interval generator 48, previously reset by the interval reset signal IRST, converts the time interval word, i.e., the digital signal INT0-INT7 representative of the time interval, into a real time interval in response to the clock signal $C_2$.

For example, the time interval generator 48 may include a conventional digital comparator in which the digital interval signal from the IROM 46 may be utilized to generate a time interval having a length determined by the digital signal representative of the interval and the clock signal $C_2$. This may be accomplished conventionally by, for example, strobing the IROM 46 output signal into one counter and comparing the IROM output signal with the count in another counter clocked by the $C_2$ clock signal.

Thus, for example, the addressed interval from the IROM 46 may be placed into the digital comparator in the time interval generator and the comparator counted down or up by the clock signal $C_2$. When the comparator reaches some predetermined count, the comparator may provide an output pulse thereby providing a real time interval determined by the digital signal applied thereto.

The comparator output signal COMP from the time interval generator 48 may be applied to the address generator 42 to index the address generator 42 by one count to proceed to the next interval. The address generator generates low signal level IRST pulse which is applied to the time interval generator 48 to prepare it for the next interval from the IROM 46. The sum and interval read only memories 44 and 46, respectively, are thereafter strobed as was previously described to generate the next interval from the indexed or updated generated address signal AG0–AG7.

The comparator output signal COMP is also utilized by the address generator 42 to generate the $\overline{CODE}$ signal. The $\overline{CODE}$ signal is then conditioned by the driver circuit 50 as required to permit the COMP pulses to be utilized, for example, to pulse a laser as was described in connection with FIG. 1. For example, the driver circuit may invert and amplify the $\overline{CODE}$ signal to provide CODE signal to the laser 30 of FIG. 1.

The address generator 42 continues to be indexed, each time generating a new time interval by adding a unique sum signal from the $\Sigma$ROM 44 to the selected initial address $ADS_j$, thereby addressing a new interval in the IROM 46 with each indexing of the address generator 42. After 254 such intervals, the address generator 42 is reset to its startling value, e.g., the address generator 42 has counted through one complete cycle and is reset to binary ZERO, and another cycle of the code is generated. It can be readily seen that the 254 intervals thus generated comprise one complete code sequence or code word which is determined by the selected initial address signal.

While the time interval generator 48 as described above generates real time intervals related in length to the digital interval from the IROM 46, it is preferred that the addressed interval from the IROM indicate a deviation from some predetermined minimum time interval preset in the comparator circuitry of the time interval generator 48 as is hereinafter described in greater detail. Thus, in effect, a fixed minimum pulse interval is modulated, i.e., incremented, by the addition of unique time intervals in the preferred form of the PIM encoder to generate the PIM code.

In addition to the PIM encoding capabilities, the selector 26 may comprise a plurality of three digit octal coded switches providing 512 possible digital input signals to the encoder 28 as was previously mentioned. One-half of these possible input signals may select the above-described 256 PIM codes and the remaining one-half (256) may be selectable pulse repetition frequency PRF codes generated by inhibiting the indexing of the address generator 40 by the COMP signal. For example, when using three digit octal coded switches, this inhibit function selecting PRF codes may be provided by the code selector 26 output signal PIM/PRF in response to the selection of all addresses between Code No. 1 and Code No. 256. The PIM codes may be provided in response to all addresses between Code No. 257 and Code No. 512.

It can be seen from the above that at least 256 different code sequences are provided thereby permitting a selection of codes in different systems for operation on a non-interfering basis. Moreover, it is clear from the above that the 254 interval pair code sequences, because of code length and apparently random order, appear to be totally random even though encoded in accordance with the described cyclically repetitive code. Moreover, the entire code sequence may be changed by replacing either the $\Sigma$ROM 44 or the IROM 46. Thus, from mission to mission new code sequences may be made available by merely changing an integrated circuit.

Address Generator

Referring now to FIG. 4 wherein the address generator 42 of FIG. 3 is illustrated in greater detail, the PIM/PRF signal from the code selector 26 may be applied via the code select or CSEL input terminal to one input terminal of a two input terminal NAND gate 60. The COMP signal from the time interval generator 48 of FIG. 3 may be applied to the set steering input terminal D of a suitable conventional bistable multivibrator or flip-flop 62.

The $\overline{MRST}$ signal from the initial reset circuit 56 of FIG. 3 may be applied via the input terminal R to one input terminal of a NAND gate 64, to the clear or CLR input terminal of a conventional bistable multivibrator or flip-flop 66, to the clear or CLR input terminal of a suitable conventional five bit serial shift register 68, to one input terminal of a two input terminal NAND gate 70 and to the clear or CLR input terminal of the flip-flop 62. The $C_1$ clock signal from the timing signal generator 54 of FIG. 3 may be applied to the CLOCK input terminal of the flip-flop 66, the shift register 68 and the flip-flop 62.

The output signal from the true output terminal Q of the flip-flop 62 may be applied to the other input terminal of the NAND gate 60 and to the serial data input terminal SERIAL INPUT of the shift register 68. The preset enable terminal PRESET ENABLE of the shift register 68 may be grounded and the output signals from the true output terminals QC and QE of the third and fifth stages, respectively, of the shift register 68 may be provided as the respective output signals $\Sigma$STR and ISTR. The output signal from the true output terminal QA of the first stage of the shift register 68 may be applied to one input terminal of a two input terminal NAND gate 72.

The output signal from the NAND gate 72 may be applied through an inverter 74 to the set steering terminal D of the flip-flop 66. The output signal from the false output terminal $\overline{Q}$ of the flip-flop 66 may be applied to the other input terminal of the NAND gate 64 and the output signal from the NAND gate 64 may be applied to the clear or CLR input terminals of two conventional four bit counters 76 and 78. The output signal from the NAND gate 60 may be applied to the up count or UP input terminal of the counter 76. The output signal from the CARRY output terminal of the counter 76 may be applied to the UP input terminal of the counter 78 so that the counters 76 and 78 thereby function as an eight bit serial counter.

The output signals from the true output terminals QA–QD of the counter 76 are provided as the output signals AG0–AG3 of the address generator 42 and the output signals from the true output terminals QA–QD of the counter 78 are provided as the output signals AG4–AG7 of the address generator 42. The output signals AG1–AG7 from the counters 76 and 78 are also applied to seven of the input terminals of a conventional eight input terminal NAND gate 80 of the output signal from which may be applied through an inverter 82 to the other input terminal of the NAND gate 72.

The output signal from the false output terminal $\overline{Q}$ of the flip-flop 62 is provided as the output signal $\overline{CODE}$ of the address generator 42 and is applied to the other input terminal of the NAND gate 70. The output signal from the NAND gate 70 is provided as the IRST output signal of the address counter 42 as earlier described.

A high level signal may be applied to the PRESET INPUT terminals of the flip-flops 62 and 66, to the eighth input terminal of the NAND gate 80 and to both the LOAD and DWN input terminals of the counters 76 and 78. This signal may be supplied from a suitable positive voltage source in a conventional manner as is illustrated.

In operation, the $\overline{MRST}$ signal from the initial reset circuit 56 of FIG. 3 assumes a low signal level, e.g., for one clock interval, to initially reset the flip-flops 62 and 66 and the shift register 68. Thereafter, the $\overline{MRST}$ signal assumes a high signal level enabling the NAND gates 64 and 70. The counters 76 and 78 are then cleared by the output signal from the NAND gate 64 and the bits AG0-AG7 all assume binary ZERO signal levels.

After a first Σ has been read from the ΣROM 44 of FIG. 3 in response to this first binary ZERO address signal AG0-AG7, a first real time interval COMP signal from the time interval generator 48 of FIG. 3 sets and then resets the flip-flop 62 to provide a brief high signal level output pulse at the true output terminal Q and a low signal level output pulse at the false output terminal $\overline{Q}$.

The low signal level output pulse from the false output terminal $\overline{Q}$ of the flip-flop 62 is provided as the $\overline{CODE}$ output signal of the address generator and is gated through the NAND gate 70 as the IRST signal utilized as previously described to reset the time interval generator 48 for the next time interval. The $\overline{CODE}$ output signal is, in the preferred embodiment of the invention, approximately 6 microseconds in duration.

The high signal level output pulse from the true output terminal Q of the flip-flop 62 is clocked into the first stage of the shift register 68 by the clock signal $C_1$ and, if the system is in PIM mode, is applied through the enabled NAND gate 60 to increment the count in the counters 76 and 78 by a count of one.

The signal from the flip-flop 62 clocked into the first stage of the shift register 68 is applied to the NAND gate 72 which, if enabled, sets the flip-flop 66 to clear the counters 76 and 78. The NAND gate 72 is, however, enabled only when the total count in the counter 76 and 78 is 254 as is indicated by a low signal level output signal from the NAND gate 80.

After the counters 76 and 78 have been incremented, the high signal level signal in the first stage of the shift register 68 is shifted through the register by the clock signal $C_1$ generating first the ΣSTR signal for strobing the sum read only memory 44 and then the ISTR signal for strobing the interval read only memory 46. Thus, at some predetermined time, after an address has been generated, the sum read only memory 44 is read by the ΣSTR signal and applied to the address adder 40 as was described in connection with FIG. 3. Thereafter, the interval in the IROM addressed by the updated address from the address adder 40 is read in response to the next generated ISTR signal.

With the system in the PRF mode, the NAND gate 60 is inhibited and the incrementing of the counters 76 and 78 is inhibited. The generated address thus always remains at zero and the address selected by the code selector 26 of FIG. 3 determines a constant PRF which, by changing the code selector address, may be varied.

Time Interval Generator

The time interval generator 48 of FIG. 3 which generates a real time interval in response to the digitally coded signal INT0-INT7 is illustrated in greater detail in FIG. 5.

Referring now to FIG. 5, the binary bits INT0-INT7 of the interval read from the interval read only memory 46 of FIG. 3 are applied to a parallel binary adder generally indicated at 90. The adder 90 may include, for example, three four-bit stages in which, as was previously mentioned in connection with FIG. 3, the interval read from the interval read only memory is added to some fixed, predetermined interval. The fixed, predetermined interval may be provided by applying a high signal level to predetermined ones of the adder input terminals and by grounding others of the adder input terminals as is illustrated.

The binary bits of the sum output signal from the adder 90 are applied to the A input terminals of a suitable conventional digital comparator generally indicated at 92. The digital comparator 92 may be, for example, three four-bit comparators connected to compare up to twelve binary bits applied to the A input terminals with up to twelve binary bits applied to the B input terminals thereof.

The IRST signal from the address generator 42 of FIGS. 3 and 4 may be applied to the clear input terminal CLR of a conventional binary counter generally indicated at 94. The $C_2$ clock signal from the timing signal generator 54 of FIG. 3 may be applied to the clock input terminal UP of the counter 94. The counter 94 may, for example, comprise three four-stage counters connected, as illustrated, to serially count the $C_2$ clock signals. The output signals from the true or QA-QD output terminals of each stage of the counter 94 may be applied to the B input terminals of the digital comparator 92 for comparison with the adder 90 output signals. The COMP output signal may be provided, as illustrated, from the A=B output terminal of the digital comparator 92.

In operation, the binary signal from the IROM 46 of FIG. 3 representing the addressed time interval is added to some predetermined constant by the adder 92. In the embodiment illustrated in FIG. 5, the binary number 100101101100 (the decimal number 873) is added to the addressed interval INT. When translated into a real time interval in response to a 10 KHz. $C_2$ clock signal, this constant (i.e., the decimal number 873) provides a real time interval of 87.3 milliseconds which is added to the addressed interval as was previously described in connection with FIG. 3.

Translation of the binary interval into a real time interval is accomplished in a conventional manner by comparing the output signal from the adder 90 with the output signal from the counter 94 in the comparator 92. When the counter output signal is equal to the adder output signal, a pulse COMP is generated by the comparator 92. The real time interval is thus equal to the time period between the time at which the counter 94 is cleared by the IRST signal and the time at which the counter 94 reaches a count equal to the adder 90 output signal. Where the addressed interval is zero, for example, the generated interval is equal to the constant interval applied to the B input terminals of the adder and the real time interval is 87.3 milliseconds. In the event that the addressed interval is a maximum or 255, the generated time interval translates into a real time interval of 112.8 milliseconds.

The average pulse interval for a particular code utilizing the above constant interval of 87.3 milliseconds and adding intervals between 0 and 25.5 milliseconds is approximately 100 milliseconds. The average frequency or repetition rate of the encoded transmitted signal is thus approximately 10 pulses per second.

Initial Reset Circuit

The initial reset circuit 56 of FIG. 3 is illustrated in greater detail in the functional block diagram of FIG. 6. Referring now to FIG. 6, the energization of encoder 28 provides a positive voltage, e.g., a positive 5 volts, through a resistor 104 and across a resistor 102 to one input terminal of a three input terminal AND gate 98. The output terminal of the AND gate is directly connected to the trigger input terminal T of a conventional monostable or one-shot multivibrator 100.

The multivibrator 100 is provided with terminals CEXT and REXT for the external connection, respectively, of a capacitor 110 and a resistor 108 which collectively determine the RC time constant of the multivibrator and thus the width of the output pulse. The output signal from the false output terminal $\overline{Q}$ is utilized as the master reset signal $\overline{MRST}$.

The application of power to the circuit also stablizes the multivibrator by the application of a positive potential to the inverting clear or reset input terminal CLR. This positive going signal is also applied to a second input terminal of the AND gate 98 and to one input terminal of a NOR gate 96. The other input terminal of the NOR gate 96 is grounded and the output terminal thereof is connected to the third input terminal of the AND gate 98.

In operation, the voltage across the resistor 102 rises sufficiently to trigger the multivibrator 100 to provide a low signal level $\overline{MRST}$ output signal to the timing signal generator 54 of FIG. 3 and the address generator 42 of FIGS. 3 and 4. After a period of time determined by the RC time constant of the resistor 108 and the capacitor 110, the multivibrator 100 is reset through a diode 106 and the $\overline{MRST}$ signal assumes a high signal level and remains at this high signal level thereafter. Thus, the initial reset circuit 56 provides a low signal level pulse $\overline{MRST}$ whenever the encoder is energized thereby providing an initializing signal for the logic circuits of the encoder 28 of FIG. 3.

THE DECODER

General Description

The decoder 36 of FIG. 1 permits the wave energy receiving unit 24 to select a properly encoded video signal from the receiver 34 in the presence of interfering signals from other friendly systems and/or electronic countermeasures. As was previously described, the uniqueness of all interval pairs of each code permits the code to be properly recognized upon receipt of three successive pulses, i.e., one interval pair. A preferred embodiment of a decoder for accomplishing this code recognition is described generally in connection with FIG. 7 and in greater detail in connection with FIGS. 8–25.

With reference now to FIG. 7, the initial address or $ADS_I$ signal determines the code for which the receiving unit 24 is set. This signal may be applied from the code selector 38 of FIG. 1 to a pre-acquisition code generator 120 and a post-acquisition code generator 122 in the decoder 36. The video signal from the receiver 34 of FIG. 1 may be applied to a pre-acquisition search circuit 124 and to a post-acquisition track circuit 126 in the decoder 36.

A pre-acquisition code or PRCODE signal and a pre-acquisition comparator or PRCOMP signal are applied from the pre-acquisition code generator 120 to the pre-acquisition search circuit 124. A generated pre-acquisition code address or $AG_X$ signal may be applied to the post-acquisition code generator 122 and to a dual channel logic circuit 128.

A post-acquisition comparator or POCOMP signal may be applied from the post-acquisition code generator 122 to the post-acquisition track circuit 126. A generated Y address or $AG_Y$, a post-acquisition counter clear or POCLR signal, and a counter index or POIND signal may be applied from the post-acquisition code generator 122 to the dual channel logic circuit 128.

A suitable conventional clock generator 130 may provide a low frequency clock signal $CL_{10}$, for example, a 10 KHz. clock signal which may be applied to the pre-acquisition search circuit 124, the post-acquisition track circuit 126, and the dual channel logic 128. The clock generator 130 may also provide a high frequency clock signal $CL_{2.56}$, for example, a 2.56 MHz. clock signal, which may be applied to both the pre-acquisition search circuit 124 and the post-acquisition track circuit 126. The clock generator 130 may also provide another high frequency clock signal $CL_{5.12}$, for example, a 5.12 MHz. clock signal, which may be applied to the pre-acquisition search circuit 124. The clock signals $CL_{10}$, $CL_{2.56}$, and $CL_{5.12}$ may, alternatively, be supplied from any suitable external clock signal source. The dual channel logic circuit 128 may provide a dual channel four pulse coincidence or DCPC output signal and a dual channel inhibit or DCINH signal which may be applied to the post-acquisition track circuit 126.

A 100 microsecond pre-acquisition gate or $PRG_{100}$ output signal may be applied from the pre-acquisition search circuit 124 to the post-acquisition track circuit 126 and a pre-acquisition clock or CLPR output signal may be applied from the pre-acquisition search circuit 124 to the pre-acquisition code generator 120. A pre-acquisition gate or PRGTE output signal and an A register data or ADTA output signal may be applied from the pre-acquisition search circuit 124 to the dual channel logic circuit 128. A stop scan or STSCN output signal from the pre-acquisition search circuit 124 may be provided at a collective output terminal for application to a control unit such as the control unit 40 previously mentioned in connection with FIG. 1.

A 100 microsecond post-acquisition gate or $POG_{100}$ output signal may be applied from the post-acquisition track circuit 126 to the pre-acquisition search circuit 124. A post-acquisition gate or POGTE output signal, a post-acquisition reset or PORST output signal and a delayed track acquisition or TACQD output signal may be applied from the post-acquisition track circuit 126 to the dual channel logic circuit 128. A track acquisition or TACQ output signal may be applied from the post-acquisition track circuit 126 to the pre-acquisition search circuit 124 and may be provided at the collective output terminal of the decoder. A gated video or GVID output signal, a signal accept gate or GACPT output signal and a missing pulse or MP1 output signal may also be applied from the post-acquisition track circuit 126 to the collectively illustrated output terminal of the decoder. A post-acquisition clock or CLPO output signal, a gated post-acquisition comparator or GCOMP output signal and a post-acquisition load or LOAD output signal may be applied from the post-acquisition track circuit 126 to the post-acquisition code generator 122 as is illustrated in FIG. 7.

In operation, the entry of the $ADS_I$ signal from the code selector 38 of FIG. 1 into the pre-acquisition code generator 120 and the post-acquisition code generator 122 may operate to initialize or reset the decoder. Alternatively a master reset signal may be provided for this purpose if desired. The pre-acquisition code generator 120 locally generates a reference PIM (or PRF) code sequence PRCODE in the same manner in which the encoder 28 previously described in connection with FIGS. 1 and 3 generated a selected code sequence. However, when the decoder is in pre-acquisition mode, the locally generated code or PRCODE signal is generated in response to the pre-acquisition clock signal CLPR at a rate which greatly exceeds the repetition rate of the incoming video signal.

The incoming video or VID signal applied to the pre-acquisition search circuit 124 is clocked or shifted into a digital code correlator in the pre-acquisition search circuit 124 at approximately a 10 KHz. rate as is hereinafter described in greater detail. The code correlator is of sufficient length to insure that at least two complete intervals, i.e., a complete interval pair defined by three successive pulses, are always available for comparison with the locally generated code sequence.

The locally generated code or PRCODE signal is clocked through the digital code correlator in the pre-acquisition search circuit 124 at a much higher rate so that the interval pair of the incoming video signal in the code correlator is compared to every interval pair in the desired code sequence, i.e., one complete code word of the PRCODE signal, before the video signal interval pair is shifted out of the code correlator. This shifting of the video signal through the code correlator at one rate and the shifting of the locally generated code signal through the code correlator at another rate continues until coincidence is detected between three pulses of the video signal and the locally generated code. Three pulse coincidence indicates recognition of a unique interval pair in the incoming video signal which corresponds to a unique interval pair in the locally generated code.

When an interval pair of the incoming video signal matches an interval pair of the locally generated desired code sequence, a stop scan or STSCN signal is generated by the pre-acquisition search circuit 124 for use by the control unit 40 of FIG. 1. For example, this stop scan signal may be utilized by the control unit 40 of a laser seeker system to stop the scanning pattern of the system.

In addition, the pre-acquisition clock signal CLPR which determines the rate of the locally generated code PRCODE is changed from the high clock rate of 2.56 MHz. to the lower 10 KHz. clock rate at which the video signal is shifted through the code correlator. The locally generated code is thus thereafter generated and shifted through the code correlator in the pre-acquisition search circuit 124 at the same rate at which the incoming video signal is shifted through the code correlator.

The pre-acquisition search circuit 124 searches for the next successive time interval in the incoming video signal and, if this third time interval is present, a track acquisition or TACQ signal is generated to place the system in track and the post-acquisition code generator 122 is synchronized with the pre-acquisition code generator 120. This synchronization of the code generators is accomplished by loading the address $AG_X$ from the pre-acquisition code generator into the post-acquisition code generator 122 in response to the LOAD signal from the post-acquisition track circuit 126.

Thereafter, the post-acquisition clock signal CLPO effects the generation of the comparator or POCOMP signal which is modulated in accordance with the desired code sequence. This POCOMP signal is utilized by the post-acquisition track circuit 126 to gate the pulses of the video singal VID to the collective output terminal of the decoder as the gated video or GVID signal.

After the decoder has been placed into the post-acquisition or track mode in response to the successful recognition of the desired code sequence, the pre-acquisition code generator and the pre-acquisition search circuit revert to pre-acquisition mode and continue to correlate the incoming video signal with the locally generated code as was previously described. The decoder is thus in a dual channel mode in that it is operating in both pre-acquisition and post-acquisition modes simultaneously.

Each time the pre-acquisition search circuit successfully recognizes an interval pair of the desired code sequence subsequent to the initial three pulse coincidence, the address signals $AG_X$ and $AG_Y$ in the pre-acquisition and post-acquisition code generators 120 and 122, respectively, are compared by the dual channel logic circuit 128. If the address represented by the $AG_X$ signal is greater than or equal to the address represented by the $AG_Y$ signal, the dual channel four pulse coincidence or DCPC signal effects the generation of a LOAD signal by the post-acquisition track circuit 126 and the $AG_X$ address signal from the pre-acquisition code generator 120 is loaded into the post-acquisition code generator 122. This resynchronizes the post-acquisition code generator 122 to the received video signal which is further along in the code sequence, i.e., was received first. Resynchronization ensures that the pulse train from the transmitting unit, i.e., the target designator, is being tracked and not a pulse train from a repeater type countermeasure.

For example, if the generated address $AG_X$ of the latest interpulse period recognized by the code correlator in the pre-acquisition search circuit 124 is greater than the address $AG_Y$ of the latest interpulse period generated by the post-acquisition code generator 122, this discrepancy between addresses indicates tha the code is being delayed and retransmitted by a repeater type countermeasure. The dual channel pulse coincidence or DCPC signal effects the loading of the $AG_X$ signal into the post-acquisition code generator 122 to thereby synchronize the post-acquisition code generator to the designator signal rather than the repeater signal. Thereafter, the dual channel logic circuit 128 is inhibited from resynchronizing the post-acquisition code generator, as long as the track mode is maintained.

Pre-Acquisition and Post-Acquisition Code Generators

The pre-acquisition and post-acquisition code generators 120 and 122, respectively, of FIG. 7 are illustrated in greater detail in FIGS. 8 and 9, respectively, to facilitate an understanding of the invention.

Basically, the pre-acquisition and post-acquisition code generators may be identical in operation to the encoder 28 previously described in connection with FIG. 3. Each of the code generators 120 and 122 may include an address generator 42, a sum read only memory ($\Sigma$ROM) 44, and address adder 40, an interval read only memory (IROM) 46 and a time interval generator 48. In addition, an initial address storage register 132 may store a nine bit initial address signal $ADS_I$ generated by the code selector 38 of FIG. 1. This ADS$_I$ signal may comprise, for example, a nine bit digital signal wherein the first eight bits indicate the initial address AI and wherein the ninth bit indicates the mode in which the system is operating (i.e., PIM/PRF).

As is illustrated in FIG. 8 and as previously described in connection with FIG. 3, the pre-acquisition code address generator 42 cyclically generates address signals as the address generator counts from zero to 253. The rate at which these signals are generated depends upon the rate at which the modulo 254 counter in the pre-acquisition address generator is clocked by the comparator or PRCOMP signal. The rate of the PRCOMP signal depends, of course, upon the rate of the clock signal CLPR utilized to change the digitally represented time interval into a real time interval.

During pre-acquisition search, the rate of this clock signal CLPR is equal to the high or 2.56 MHz. clock rate of the CL$_{2.56}$ signal. During the time period immediately following recognition of an interval pair by the pre-acquisition search circuit 124 of FIG. 7 and immediately preceding the change-over to dual channel mode, the clock signal CLPR is the lower or 10 KHz. clock rate of the CL$_{10}$ clock signal.

The post-acquisition code generator of FIG. 9 is inoperative during pre-acquisition search in that the comparator or POCOMP signal is not gated through the Y address generator 42 by the post-acquisition track circuit as the gated comparator or GCOMP signal. However, in post-acquisition mode, the pre-acquisition code generator address signal AG$_X$ is loaded into the Y address generator so that the modulo 254 counter is preloaded with the AG$_X$ signal. Thereafter, real time intervals representing the selected code, i.e., the POCOMP signal, are generated in response to the post-acquisition clock signal CLPO and gated through to the Y address generator as the GCOMP signal to sequence the Y address generator 42.

Since the dual channel mode logic requires an indication of when the modulo 254 counter in the Y address generator is at a count of five, the signal which clears the modulo 254 counter in the Y address generator at the count of 254, i.e., the POCLR signal, is provided at an output terminal of the post-acquisition code generator 122 as illustrated. Moreover, the modulo 254 counter index signal POIND is also provided for use by the dual channel logic as is hereinafter described.

Pre-Acquisition Search Circuit

With reference now to FIG. 10 where the pre-acquisition search circuit of FIG. 7 is described in greater detail, the video input signal VID from the receiver 34 of FIG. 1 is applied to the J input terminal of a video sync flip-flop 134. The output signal from the true output terminal Q of the flip-flop 134 is applied as the ADTA signal to the dual channel logic circuit of FIGS. 7 and 23. The output signal from the false output terminal $\overline{Q}$ is applied as the $\overline{ADTA}$ signal to the A register of a digital correlator 136. The 10 KHz. clock signal CL$_{10}$ from the clock generator 130 of FIG. 7 is applied to the K input terminal of the flip-flop 134. This CL$_{10}$ signal is also applied directly to the $\phi$1A input terminal and is delayed in a conventional delay circuit 138 and thereafter applied to a $\phi$2A input terminal of the digital correlator 136. The pre-acquisition code signal PRCODE from the pre-acquisition code generator 120 of FIG. 8 is applied to the B register input terminal of the digital correlator 136.

The digital correlator 136 also receives clocking signals BCL$_1$ and BCL$_2$ from a pre-acquisition clock logic circuit 146 of FIG. 11 at the respective input terminals $\phi$1B and $\phi$2B, and the interval correlate output signal ICOR from the digital correlator 136 is applied to the 3 of 4 decoder 140 of FIG. 13. The 3 pulse coincidence or 3PC output signal from the 3 of 4 decoder 140 is applied to the delay compensation circuit 142 of FIG. 15 and the CL$_{10}$ clock signal is applied to both the delay compensation circuit 142 and to the frequency select circuit 144 of FIG. 14. The frequency select circuit 144 supplies frequency select signals FS1 and FS2, respectively, to a pre-acquisition gate generator 148 of FIG. 16 and the FS1 signal may be supplied to the pre-acquisition clock logic circuit 146 of FIG. 11. The delay compensation circuit 142 provides the inhibit signal INH both to the pre-acquisition clock logic circuit 146 of FIG. 11 and the frequency select circuit 144 of FIG. 14 and supplies the delayed three pulse coincidence signal 3PCD to the stop scan function circuit 150 of FIG. 17.

The pre-acquisition clock logic circuit 146 also receives the 10 KHz. clock signal CL$_{10}$ from the clock generator 130 of FIG. 7. In addition, this circuit also receives the 2.56 MHz. clock signal CL$_{2.56}$ and the 5.12 MHz. clock signal CL$_{5.12}$ from the clock generator 130. The CL$_{2.56}$ clock signal is also applied to the clock input terminal C of the video sync flip-flop 134, to the stop scan function circuit 150 of FIG. 17, and to the delay compensation circuit 142 of FIG. 15. The pre-acquisition clock logic circuit 146 provides the pre-acquisition clock signal CLPR to the pre-acquisition code generator 120 of FIGS. 7 and 8.

The track signal TACQ from the post-acquisition track circuit of FIG. 7 is applied to the stop scan function circuit 150 together with the timing signal POG$_{100}$. The stop scan function circuit 150 also receives a gating signal PRGA from the pre-acquisition gate generator 148 and provides the stop scan output signal STSCN.

The pre-acquisition compare signal PRCOMP from the pre-acquisition code generator 120 of FIG. 8 and the CL$_{10}$ clock signal from the clock generator 130 of FIG. 7 are applied to the pre-acquisition gate generator 148 to produce the gating signals PRGA, PRGTE and PRG$_{100}$. As earlier explained, the PRGA signal is applied to the stop scan function circuit 150 of FIG. 17. The PRGTE signal is applied to the dual channel logic circuit of FIGS. 7 and 23 as well as to the frequency select circuit 144 of FIG. 14 and the PRG$_{100}$ output signal is applied to the post-acquisition track circuit of FIGS. 7 and 18.

In operation and with continued reference to FIG. 10, the pre-acquisition search circuit 124 basically searches the incoming video signal VID for the presence of unique interval pairs which correspond to the interval pairs of the locally generated code sequence PRCODE.

The video signal VID is first shaped by the video sync circuit 134 since, in a typical system, the video signal may be very narrow and may thus be lost if directly clocked into the digital correlator 136. The synchronized video signal ADTA is then clocked into the digital correlator at approximately its average repetition rate, i.e., 10 KHz. while the locally generated code sequence PRCODE is clocked into the B register of the digital correlator 136.

In pre-acquisition mode, the PRCODE signal is clocked into the digital correlator at a 2.56 MHz. rate so that any interval pair in the A register is compared with every interval pair in the locally generated code in the B register.

The 3 of 4 decoder monitors the results of the comparisons in the digital correlator and provides an output pulse 3PC which indicates 3 pulse coincidence. Three pulse coincidence indicates favorable correlation of a unique interval pair of the incoming video signal with a unique interval pair in the locally generated code sequence as will hereinafter become apparent in connection with the description of FIG. 12. When three pulse coincidence is detected, the delay compensation circuit generates an inhibit signal which causes the frequency select circuit 144 to change the B register clock rate from 2.56 MHz. to 10 KHz. In addition, the inhibit signal INH from the delay compensation circuit inhibits the application of clock signals to the B register of the digital correlator for a predetermined number of clock intervals to allow the video signal in the A shift register to be shifted once again into coincidence with the signal in the B shift register. This loss of coincidence after detection of 3 pulse coincidence ordinarily occurs because of delays in the 3 of 4 decoder and the frequency select circuit and may require, for example, that the B register clock signal be inhibited for 3 clock intervals.

The frequency select signal FS1 from the frequency select circuit 144 also changes the rate of the clock signal CLPR from the pre-acquisition clock logic circuit 146 in response to the detection of three pulse coincidence from the 2.56 MHz. rate to the 10 KHz. This change in the clock rate of the CLPR clock signal thereafter causes the pre-acquisition code generator 120 to generate the PRCODE signal at the lower 10 KHz. rate.

The three pulse coincidence signal indicating the recognition of the desired code sequence in the incoming VID signal is delayed by the delay compensation circuit 142 and is utilized to enable the stop scan function circuit 150. Thereafter, the pre-acquisition gate generator 148 predicts the position of the next pulse in the incoming video signal in response to the pre-acquisition compare or PRCOMP signal and generates a pair of 100 microsecond gates PRG$_{100}$ and PRGTE. The PRGTE signal is utilized by the dual channel control circuit 268 of FIGS. 23 and 24 to ensure that the correlated incoming video signal is that of the target designator and not that of a repeater or other delay type countermeasure and to gate through the fourth pulse if it is in fact present in the incoming video signal. As will hereinafter be described in greater detail, if this fourth pulse is present the track acquisition signal TACQ indicates its presence and the pre-acquisition search circuit reverts to pre-acquisition or search mode and the video signal VID is thereafter gated through the AND gate 192 of FIG. 18 as the gated video or GVID signal for use by a suitable control unit for tracking or guidance purposes.

Pre-Acquisition Clock Logic Circuit

With reference now to FIG. 11 where the pre-acquisition clock logic circuit 146 of FIG. 10 is illustrated in greater detail, the 2.56 MHz. clock signal CL$_{2.56}$ is applied from the clock generator 130 of FIG. 7 directly to a dual multiplexer 152. The CL$_{2.56}$ signal is also delayed in a conventional delay circuit 154 and again applied to the dual multiplexer 152. Similarly, the 10 MHz. clock signal CL$_{10}$ is applied from the clock generator 130 of FIG. 7 directly to the dual multiplexer 152 and is also delayed in a suitable conventional delay circuit 156 and again applied thereto.

The inhibit signal INH from the delay comparator 142 of FIGS. 10 and 15 is applied as two phase signals $\phi$1 and $\phi$2, respectively, to input terminals ST1G and ST2G of the dual multiplexer 152. The frequency select signal FS1 from the frequency select circuit 144 of FIGS. 10 and 14 is applied to the set input terminal D of a binary element or flip-flop 158 and the output signal from the true output terminal Q thereof is applied to the A input terminal of the dual multiplexer 152. The 5.12 MHz. clock signal from the clock generator 130 of FIG. 7 may be applied to the clock input terminal of the flip-flop 158.

The output signal of the 1Y of the dual multiplexer 152 is applied as the pre-acquisition clock signal CLPR to the pre-acquisition code generator 120 of FIG. 8. The CLPR signal is also applied to one input terminal of a two input terminal AND gate 155 as well as through an inverter 160 to one input terminal of a second AND gate 162. An output signal 2Y from the dual multiplexer 152 is applied directly to the other input terminal and the AND gate 162 and through an inverter 164 to the input terminal of the AND gate 158. The B register clock output signals BCL$_1$ and BCL$_2$, respectively, from the AND gates 158 and 162 are applied to the digital correlator 136 of FIGS. 10 and 12.

In operation, the pre-acquisition clock logic circuit 146 of FIG. 11 directs the first and second phases of the 2.56 MHz. and 10 KHz. signals to the output terminals 1Y and 2Y in response to the frequency select signal FS1.

If the frequency select signal FS1 sets the flip-flop 158, the high signal level applied to the A input terminal of the dual multiplexer 152 directs the 10 KHz. phase 1 and phase 2 from the A1 and A2 input terminals to the AND gates 158 and 162 respectively via the 1Y and 2Y output terminals. When, however, the flip-flop 158 is reset by the CL$_{5.12}$ signal and remains reset, i.e., is not again set by the FS1 signal, the low signal level at the A input terminal directs the two phases of the CL$_{2.56}$ signal from the B1 and B2 input terminals, respectively, of the dual multiplexer 152 to the respective input terminals of the AND gates 158 and 162 via the output terminals 1Y and 2Y, respectively. In this manner, the BCL1 and BCL2 signals which are utilized to clock the B register in the digital comparator of FIG. 12 may have a 10 KHz. clock rate or a 2.56 MHz. clock rate depending upon the signal level of the FS1 signal from the frequency select circuit 144 of FIG. 14.

In addition, the inhibit or INH signal applied to the input terminals ST1G and ST2G of the dual multiplexer 152 may totally inhibit the generation of the clock signals BCL1 and BCL2 in order to compensate for delays in changing the frequency of the BCL1 and BCL2 signals after three pulse coincidence has been detected as was previously described.

Digital Correlator

The digital correlator 136 of FIG. 10 is illustrated in greater detail in the functional block diagram of FIG. 12.

With reference now to FIG. 12, the 10 KHz. clock signal CL$_{10}$ may be applied to the $\phi$1A input terminal of the digital correlator 136 and a slightly delayed version of the CL$_{10}$ clock signal may be applied to the $\phi$2A input terminal of the correlator 136. The synchronized data signal $\overline{\text{ADTA}}$ from the video sync flip-flop 134 of FIG. 10 may be applied to a 3,400 bit shift register generally indicated at 175 (hereinafter referred to as register A) via the input terminal A of the digital correlator 136.

The B register phase 1 clock signal BCL1 may be applied from the pre-acquisition clock logic circuit 146 of FIG. 10 to the $\phi$1B input terminal of the digital correlator 136. The B register phase 2 clock signal BCL2 may be applied to the $\phi$2B input terminal of the digital correlator 136. The generated pre-acquisition code or PRCODE signal from the pre-acquisition code generator 120 of FIGS. 7 and 8 may be applied to the data input terminal of a 3,400 bit shift register generally indicated at 176 (hereinafter referred to as register B) via the B input terminal of the digital correlator 136.

The output signal from the true output terminals of each of the stages of register A 175 may be compared with the output signals from the true output terminals of the corresponding stages of the register B 176 by 3,400 two input terminal AND gates generally indicated at 177. The output signals from the first 850 AND gates 177 may be applied through an OR gate 178 to output terminal A of the digital correlator 136 as one portion of the collectively illustrated interval correlation or ICOR output signal from the digital correlator 136. The output signals from the next two groups of register comparison AND gates 177 (not illustrated) may likewise be applied in groups through respective OR gates to provide the B and C portions of the interval correlation signal ICOR at the collectively illustrated output terminal of the digital correlator. The output signals from the last group of 850 register comparison AND gates 177 (the 3,400th AND gate of which is illustrated) may likewise be applied through an OR gate indicated at 179 as the D portion of the ICOR signal.

In operation, the synchronized incoming video signal $\overline{ADTA}$ is shifted into register A at a 10 KHz. clock rate. The locally generated code sequence PRCODE is, during pre-acquisition mode operation, shifted into the register B at a 2.56 MHz. rate by the BCL1 and BCL2 signals which are synchronized with the $CL_{10}$ signal. Register A is of sufficient length that one complete interval pair of the incoming video signal can be stored in register A. As was previously described, the generated code sequence PRCODE is time compressed by a factor of 256 in pre-acquisition mode operation and is thus shifted into register B at 256 times the rate at which the incoming video signal is shifted into register A. It can thus be seen that the incoming video signal in register A remains stationary while the locally generated code sequence PRCODE is shifted 256 times. The incoming video signal in register A is relatively stationary in comparison to the locally generated code PRCODE which circulates rapidly through register B.

The contents of register A and register B are continuously compared by the AND gates 177 and a favorable comparison in any group of 850 AND gates provides a high signal level A, B, C, or D portion of the interval correlate signal ICOR. If the three out of four decoder illustrated in FIG. 10 and hereinafter described in greater detail detects that three of the four ICOR signals are simultaneously at a high signal level, this indicates that an interval pair of the incoming video signal matches an interval pair of the locally generated PRCODE signal. In such an event, the three pulse coincidence signal 3PC generated by the 3 of 4 decoder 140 of FIGS. 10 and 13 conditions the decoder 140 to change to post-acquisition mode operation and then, upon recognition of another correct interpulse interval, into dual channel mode operation as was previously described in connection with FIGS. 7-11.

To facilitate an understanding of the digital correlator 136, reference may be had to FIGS. 12a-12c wherein a typical operation of the A and B registers is illustrated. For example, FIG. 12a graphically illustrates at some time $T_1$ arbitrarily designated as time zero that register A contains a unique interval pair $I_1I_2$ and this unique interval pair is part of the locally generated code sequence being shifted into register B.

At some later time $T_2$ equal to 10 B register clock pulses BCL $T_1$ the contents of register B has been shifted ten stages to the right while the contents of register A has remained stationary. However, at time $T_2$ there is still no three pulse coincidence between the contents of registers A and B.

In FIG. 12c it can be seen that at some time $T_3$ after ten more B clock pulses BCL the pulses defining the interval pair $I_1I_2$ in register A are stored in the same stages as the pulses defining the interval pair $I_1I_2$ in the locally generated code stored in the register B. Thus, at time $T_3$ three pulse coincidences are detected, indicating that an interval pair of the incoming video signal matches an interval pair in the locally generated code. The decoder 36 of FIG. 1 may thereafter be synchronized with the incoming video signal VID and the incoming video signal gated through the decoder 36 to a utilization device by a gate signal generated in response to the post-acquisition code generator 122 compare signal POCOMP as was previously described.

3 of 4 Decoder

With reference now to FIG. 13 where the 3 of 4 decoder 140 of FIG. 10 is illustrated in greater detail, the ICOR signal from the pre-acquisition gate generator 148 of FIGS. 10 and 16 is applied to the input terminals A, B, C, and D of a binary-to-hexadecimal decoder 170 in binary form. The binary-to-hexadecimal decoder 170 provides five output signals to a five input terminal NAND gate 172, and the output signal therefrom is applied as the 3PC output signal to the delay compensation circuit of FIGS. 10 and 15 and to the frequency select circuit 144 of FIGS. 10 and 14.

In operation, the interval correlate or ICOR signal from the digital correlator of FIG. 12 may comprise as many as 3 or 4 binary ONE or high level signals when 3 or 4 pulses in the A register of the digital correlator are correlated with 3 or 4 pulses in the B register of the digital correlator. When three of the ICOR signals are at a high signal level, one of the decimal output signals 7, 11, 13 and 14 will be at a low signal level to provide a positive going 3PC output signal indicating 3 pulse coincidence. Moreover, if all four of the digits of the ICOR signal are at a high signal level, the decimal 15 signal from the binary-to-hexadecimal decoder 170 will assume a low signal level providing the high level three pulse coincidence signal 3PC to indicate at least three pulse coincidence in the digital correlator 136 of FIG. 12.

Frequency Select Circuit

With reference now to FIG. 14 where the frequency select circuit 144 of FIG. 10 is illustrated in greater detail, the 10 KHz. clock signal $CL_{10}$ from the clock generator 130 of FIG. 7 is applied to the clock input terminal CLK of a JK flip-flop 173. The flip-flop 173 receives at the K input terminal thereof the PRGTE signal from the pre-acquisition gate generator 148 of FIGS. 10 and 16. The flip-flop 173 also receives on the J input terminal thereof the phase 1 inhibit signal INH$\phi$1 from the delay compensation circuit 142 of FIGS. 10 and 15.

The output signal from the true output terminal Q of the flip-flop 173 is applied as the FS1 signal to the pre-acquisition clock logic circuit 146 of FIGS. 10 and 11 and the pre-acquisition gate generator 148 of FIGS. 10 and 16. The output signal taken from the false output terminal $\overline{Q}$ of the flip-flop 173 is applied to one input terminal of a two input terminal NOR gate 174 to which is applied at the other input terminal thereof the phase 2 inhibit signal INH$\phi$2 from the delay compensation circuit 142 of FIGS. 10 and 15. The output signal from the NOR gate 174 is applied as the FS2 signal to the pre-acquisition gate generator 148 of FIGS. 10 and 16.

In operation, the inhibit signal from the delay compensation circuit 142 of FIG. 15 sets the flip-flop 173 in conjunction with the clock signal CL$_{10}$ whenever three pulse coincidence occurs thus generating a high signal level FS1 output signal to select the 10 KHz. clock signal in the pre-acquisition clock logic circuit of FIG. 11 as was previously described. Moreover, the generation of the FS2 signal is inhibited by application of the INH signal to the NOR gate 174.

Thereafter, the recognition of a fourth pulse in the incoming video signal resets the flip-flop 173 in conjunction with the clock signal CL$_{10}$ and the FS1 frequency select signal assumes a low signal level, effecting the selection of the 2.56 MHz. clock signal by the pre-acquisition clock logic circuit of FIG. 11. This may occur, for example, after fourth pulse coincidence.

Delay Compensation Circuit

With reference now to FIG. 15 where the delay compensation circuit 142 of FIG. 10 is illustrated in greater detail, the 2.56 MHz. clock signal CL$_{2.56}$ from the clock generator 130 of FIG. 7 is applied to one input terminal of a two input terminal NOR gate 200 and to the clock input terminal CLK of a flip-flop 202. The 10 KHz. clock signal CL$_{10}$ from the clock generator 130 of FIG. 7 is applied to the clock input terminal CLK of a conventional five stage counter 204. The output signal from the true output terminal Q of the flip-flop 202 is applied to the other input terminal of the NOR gate 200. The output signal from the NOR gate 200 is applied to the clock input terminal CLK of a conventional flip-flop 206. The output signal from the true output terminal QD of the fourth stage of the counter 204 is applied through an inverter 208 to the clear input terminal CLR of the flip-flop 206.

A positive potential is applied to the PRESET input terminals of both of the flip-flops 202 and 206 and the output signal taken from the true output terminal Q of the flip-flop 206 is applied to the input terminal D of the flip-flop 202 and to an output terminal as the first phase inhibit signal INH$\phi$1. This INH$\phi$1 signal is applied to the frequency select circuit 144 of FIGS. 10 and 14 and to the pre-acquisition clock logic circuit 146 of FIGS. 10 and 11.

The output signal from the true output terminal Q of the flip-flop 202 is applied as the phase 2 inhibit signal INH$\phi$2 to the frequency select circuit 144 and the pre-acquisition clock logic circuit 146. This INH$\phi$2 signal is also applied to the clear input terminal CLR of the counter 204. The output signal from the false output terminal $\overline{Q}$ of the flip-flop 202 is applied as the 3PCD signal to the stop scan function circuit 150 of FIGS. 10 and 17.

In operation, the delay compensation circuit 142 of FIG. 15 generates the inhibit signal INH which, as was previously described in connection with FIG. 10, inhibits the generation of the BCL1 and BCL2 signals by the pre-acquisition clock logic circuit of FIGS. 10 and 11 to compensate for delays in the detection of three pulse coincidence. As can be seen in FIG. 15, this may be accomplished essentially by successively generating the INH$\phi$1 and INH$\phi$2 signals with the flip-flops 202 and 206 in response to the detection of three pulse coincidence. Thereafter, the flip-flop 206 may be cleared in response to the counting of a predetermined number of CL$_{10}$ clock pulses by the five stage counter 204.

Pre-Acquisition Gate Generator

With reference to FIG. 16 where the pre-acquisition gate generator 148 of FIGS. 10 and 11 is illustrated in greater detail, the FS1 signal from the frequency select circuit of FIGS. 10 and 14 is applied to the D input terminal of a conventional flip-flop 210. Similarly, the FS2 signal from the same source is applied to the clear input terminal CLR of a second conventional flip-flop 212. The 10 KHz. clock signal CL$_{10}$ from the clock generator circuit 130 of FIG. 7 is applied to the clock input terminal CLK of both of the flip-flops 210 and 212 and the flip-flop 212 receives the pre-acquisition compare signal PRCOMP from the pre-acquisition code generator 120 of FIG. 8 on the input terminal D thereof.

The output signal from the true output terminal Q of the flip-flop 210 is applied as the PRGA signal to the stop scan function circuit 150 of FIGS. 10 and 17. The output signal from the true output terminal Q of the flip-flop 212 is applied as the PRGTE signal to the dual channel logic circuit 128 of FIGS. 7 and 23. The output signal taken from the false output terminal $\overline{Q}$ of the flip-flop 212 is applied as the gating signal PRG$_{100}$ to the post-acquisition track circuit 126 of FIGS. 7 and 11.

In operation, the pre-acquisition gate generator 148 generates high signal level and low signal level 100 microsecond gates PRGTE and PRG$_{100}$, respectively, after three pulse coincidence has been detected as indicated by the FS2 frequency select signal from the frequency select circuit 144 of FIG. 14. Since these gates are generated after the occurrence of three pulse coincidence in response to the pre-acquisition code generator compare signal PRCOMP, the PRGTE and PRG$_{100}$ gates occur at the predicted time of the next pulse in the incoming video signal. Likewise, the PRGA gating signal utilized by the stop scan function circuit 150 of FIG. 17 assumes a high signal level in response to the detection of three pulse coincidence as is indicated by the FS1 signal and remains at this high signal level until the FS1 signal assumes a low signal level.

Stop Scan Function Circuit

With reference now to FIG. 17 where the stop scan function circuit 150 of FIG. 10 is illustrated in greater detail, a conventional JK flip-flop 180 receives the 2.56 MHz. clock signal CL$_{2.56}$ on the clock input terminal CLK thereof from the clock generator 130 of FIG. 7. The flip-flop 180 also receives the post-acquisition gate signal POG$_{100}$ from the post-acquisition track circuit of FIG. 7 on the input terminal K thereof.

The track signal TACQ from a post-acquisition track circuit 126 of FIGS. 7 and 18 is applied to one input terminal of a NOR gate 182. The NOR gate 182 receives on the other input terminal thereof the delayed signal 3PCD from the delay compensation circuit 142 of FIG. 15 and provides an output signal to the input terminal J of the flip-flop 180.

The track signal TACQ is also applied to one input terminal of a NOR gate 184 which receives on the other input terminal thereof the pre-acquisition gating signal PRGA from the pre-acquisition gate generator 148 of FIGS. 10 and 16. The output signal from the NOR gate 184 is applied to the clear input terminal CLR of the flip-flop 180.

The output signal taken from the true output terminal Q of the flip-flop 180 is applied as the stop scan signal STSCN to the control unit 40 of FIG. 1.

In operation, the stop scan function circuit 150 of FIG. 17 provides a high signal level stop scan STSCN signal for use by the control unit 40 of FIG. 1, for example, to stop the scanning of the wave energy receiving unit 24. This high signal level STSCN signal is generated when both the track acquisition signal TACQ and the delayed three pulse coincidence signal 3PCD assume a low signal levels to set the flip-flop 180 via the NOR gate 182. The flip-flop 180 is thereafter reset by either the 100 microsecond post-acquisition gate $POG_{100}$ from the post-acquisition gate generator of FIG. 21 or via the NOR gate 184 output signal when the pre-acquisition gate PRGA from the pre-acquisition gate generator 148 of FIG. 16 assumes a low signal level.

Post-Acquisition Track Circuit

With reference now to FIG. 18 where the post-acquisition track circuit 126 of FIG. 7 is illustrated in greater detail, the clock signal $CL_{10}$ from the clock generator 130 of FIG. 7 is applied to the post-acquisition load logic circuit 186 of FIG. 19. The post-acquisition load logic circuit 186 also receives the DCPC signal from the dual channel logic circuit 128 of FIG. 7 and the clock signal $CL_{2.56}$ from the clock generator 130 of FIG. 7. In addition, the post-acquisition load logic circuit 186 receives the inhibit signal DCINH from the dual channel logic circuit 128 of FIG. 7 and the track signal TACQ from the track mode flip-flop 189 as will be described. The post-acquisition load logic circuit 186 provides the LOAD output signal to the post-acquisition code generator 122 of FIGS. 7 and 9 as well as the delayed track signal TACQD to the dual channel logic circuit 128 of FIGS. 7 and 23.

The gating signal $PRG_{100}$ from the pre-acquisition search circuit of FIG. 10 is applied to a gate select logic circuit 188 hereinafter described in connection with FIG. 22. The gate select logic circuit 188 also receives the gating signals $POG_{25}$ and $POG_{100}$ from the post-acquisition gate generator 190 hereinafter described in connection with FIG. 21 and provides the gate accept signal GACPT to the control unit 40 circuit of FIG. 1.

The gate select logic circuit 188 also provides a selected gate signal SELGT to one input terminal of a two input terminal AND gate 192 to which the video signal VID is also applied. The output signal from the AND gate 192 is applied as the gated video or GVID signal to the control unit 40 of FIG. 1, to the trigger input terminal T of a monostable or one-shot multivibrator 194, and one input terminal of a two-input terminal OR gate 196 to which the DCPC is also applied. The output signal from the true output terminal of the multivibrator 194 is applied as the truncate signal TRUN to the gate select logic circuit 188 of FIG. 22.

The post-acquisition compare signal POCOMP from the post-acquisition code generator 122 of FIGS. 7 and 9 is applied to the post-acquisition gate generator 190 hereinafter described in connection with FIG. 21. As earlier explained, the post-acquisition gate generator 190 provides the gating signals $POG_{25}$ and $POG_{100}$ to the gate select logic circuit 188 and the signal $POG_{100}$ to the pre-acquisition search circuit 124 of FIGS. 7 and 10. In addition, the post-acquisition gate generator 190 provides the POGTE and GCOMP signals to the dual channel logic circuit 128 of FIGS. 7 and 23. A missing pulse clock signal MPCL is also provided by the post-acquisition gate generator 190 to a conventional 5-stage missing pulse counter 198.

The missing pulse counter 198 receives the SYNC output signal from the OR gate 196 on the clear input terminal CLR thereof and provides from the true output terminal QA of the first stage of the counter the missing pulse signal $MP_1$ to the gate select logic circuit 188 of FIG. 22 and the control unit 40 of FIG. 1. The missing pulse counter 198 also provides from the true output terminal QE of the 5th stage thereof the post-acquisition reset signal PORST to the dual channel logic circuit 128 of FIGS. 7 and 23 and the clock input terminal CLK of the track mode flip-flop 189.

The clock signal $CL_{2.56}$ from the clock generator 130 of FIG. 7 is also applied to a post-acquisition sync counter 199 subsequently to be described in connection with FIG. 20. The post-acquisition sync counter 199 provides the post-acquisition clock signal CLPO to the post-acquisition code generator 122 of FIGS. 7 and 9 as well as SYNC clock signals $SCLK_1$, $SCLK_2$ and $SCLK_3$ to the post-acquisition gate generator 190 of FIG. 21. The post-acquisition sync counter 199 also receives from the OR gate 196 the SYNC output signal applied to the post-acquisition gate generator 190 and the PRESET input terminal of track mode flip-flop 189.

The track mode flip-flop 189 receives the PORST and SYNC signals as have been described. The input terminal D thereof is grounded and the Q output terminal provides the TACQ signal for application to the gate select logic circuit 188 of FIG. 22, the pre-acquisition search circuit 124 of FIGS. 7 and 10 and the control unit 40 of FIG. 1.

In operation, the post-acquisition track circuit 126 generally functions to synchronize the post-acquisition code generator 122 of FIG. 7 with the incoming video signal and to place the PIM decoder 36 of FIG. 1 into track mode.

The 100 microsecond pre-acquisition gate $PRG_{100}$ which predicts the position of the next incoming pulse of the VID signal as was previously described is applied to the gate select logic circuit 188 and 100 microsecond gate accept or GACPT and selected gate or SCLGT signals are generated. If the fourth pulse of the video signal VID is gated through the AND gate 192, the gated video signal GVID is generated. If fourth pulse coincidence is not detected, stop scan function 150 in the pre-acquisition search circuit 124 of FIG. 10 is reset and the post-acquisition track circuit 126 waits for another 100 microsecond gate $PRG_{100}$ from the pre-acquisition search circuit 124.

Assuming that fourth pulse coincidence is detected and the gated video signal GVID generated, a sync signal SYNC is provided at the output terminal of the OR gate 196 to set the track mode flip-flop 189 which in turn provides the track acquisition output signal TACQ to generate the LOAD and TACQD signals in the post-acquisition load logic circuit 186. The load signal loads the X address AG$_X$ from the pre-acquisition code generator 120 of FIG. 7 into the Y address generator in the post-acquisition code generator 122 of FIG. 7. Because of the timing of the particular embodiment of the invention described hereinafter in detail, the address AG$_X$ loaded into the post-acquisition code generator 122 in response to the LOAD signal is one greater than the address at the time the pulse coincidence was detected.

The SYNC signal also synchronizes the post-acquisition sync counter 199 to the incoming video and resets the missing pulse counter 198 if set. Moreover, the gated video signal GVID toggles the 20 microsecond truncate multivibrator 194 to reset the gate accept and microseconds after video is detected.

With continued reference to FIG. 18, the post-acquisition code generator is activate and indexed by the gating compare or GCOMP signal from the post-acquisition generator 190 and , in response to the post-acquisition compare signal POCOMP from the post-acquisition code generator 122 of FIGS. 7 and 9, the post-acquisition gate generator 190 generates both a 25 microsecond and a 100 microsecond gate POG$_{25}$ and POG$_{100}$, respectively, for application to the gate select logic 188. Moreover, the POG$_{100}$ signal resets the stop scan function circuit 150 of FIG. 124 if set.

The count in the missing pulse counter 198 is checked by the gate select logic 188 and if zero, e.g., the signal MP1 is a low signal level, the gate select logic 188 issues the 25 microsecond gate signal POG$_{25}$ as the gate accept and selected gate output signals GACPT and SELGT respectively. This 25 microsecond signal SELGT is timed to be centered around the incoming VID signal and, if the VID signal is present during the SELGT signal, the GVID signal is again generated and the cycle repeats for the next expected incoming video pulse.

However, if the expected video pulse VID is missing, the missing pulse counter 198 is clocked by the missing pulse clock MPCL since the next POCOMP signal is available and the sync signal SYNC is not available. If this missing pulse clock MPCL clocks the count in the missing pulse counter to a count of 6, the track mode flip-flop 189 is reset by the PORST signal and the system is removed from dual channel mode by resetting the dual channel inhibit flip-flop 274 of FIG. 23. The PIM decoder, of course, reverts back to pre-acquisition search mode until another three pulse coincidence indicates the correlation between the locally generated pre-acquisition code and the incoming video signal.

Post-Acquisition Load Logic Circuit

With reference to FIG. 19 where the post-acquisition load logic circuit 186 of FIG. 18 is illustrated in greater detail, the 10 KHz. clock signal CL$_{10}$ from the clock generator 130 of FIG. 7 is applied to one input terminal each of a pair of two input terminal NOR gates 214 and 216. The DCPC signal from the dual channel logic circuit of FIGS. 7 and 23 is applied to one input terminal of a two input terminal NOR gate 218 and the output signal therefrom applied to the other input terminal of the NOR gate 214. The output signal from the output terminal of the NOR gate 214 is applied to the input terminal J of a conventional JK flip-flop 220. The output signal from the false output terminal $\overline{Q}$ of the flip-flop 220 is applied to the input terminal K of a conventional JK flip-flop 222 and to the other input terminal of the NOR gate 216. The output signal from the NOR gate 216 is applied to the input terminal J of the flip-flop 222.

The output signal from the false output terminal $\overline{Q}$ of the flip-flop 222 is applied as the LOAD signal to the post-acquisition code generator 122 of FIGS. 7 and 9. The output signal from the true output terminal Q of the flip-flop 222 is applied to the input terminal K of the flip-flop 220. Both of the flip-flops 220 and 222 are clocked by the 2.56 MHz. clock signal CL$_{2.56}$ from the clock generator 130 of FIG. 7.

The track signal TACQ from the track mode flip-flop 189 is applied to the clock input terminal CLK of a conventional flip-flop 224 and the output signal from the false output terminal $\overline{Q}$ thereof is applied to the clock input terminal CLK of a conventional flip-flop 226. A source of positive potential is connected to the input terminals D and PRESET of both of the flip-flops 224 and 226 and the output signal from the true output terminal Q of the flip-flop 224 is applied to the other input terminal of the NOR gate 218. The output signal from the false output terminal $\overline{Q}$ of the flip-flop 226 is applied together with the output signal from the true output terminal Q of the flip-flop 220 to a two input terminal NOR gate 228. The output signal from the NOR gate 228 provides the delayed track signal TACQD to the dual channel logic circuit 128 of FIGS. 7 and 23.

The dual channel inhibit signal DCINH is applied to the clear input terminal CLR of the flip-flop 226. The output signal from the true output terminal Q of the flip-flop 220 is applied to the clear input terminal CLR of the flip-flop 224.

In operation, the post-acquisition load logic circuit 186 generates the LOAD signal which loads the generated address AG$_X$ from the pre-acquisition load generator 120 of FIG. 7 into the post-acquisition code generator 122 address generator. In addition, the delayed track acquisition or TACQD signal is generated for use by the dual channel logic circuit 128 of FIGS. 7 and 23 and placing the system in dual channel mode.

The delayed track acquisition signal TACQD is generated by delaying the track acquisition signal TACQ from the track mode flip-flop 189 of FIG. 18 through two flip-flops 224 and 226. The LOAD signal is generated by the flip-flops 220 and 222 in response to the dual channel fourth pulse coincidence signal DCPC from the dual channel logic circuit 128 of FIG. 23 and the synchronous clocks CL$_{10}$ and CL$_{2.56}$. This LOAD signal is generated each time a fourth pulse coincidence is detected thereby loading the address AG$_X$ from the pre-acquisition code generator 120 of FIG. 8 into the post-acquisition code generator 122 of FIG. 9 only after fourth pulse coincidence, i.e., between the time at which the decoder is taken out of pre-acquisition search mode and the time at which the PIM decoder is placed into dual channel mode.

Post-Acquisition Sync Counter

With reference now to FIG. 20 where the post-acquisition sync counter 199 of FIG. 18 is illustrated in more detail, the SYNC signal from the OR gate 196 of FIG. 18 is applied to the LOAD input terminals of a pair of four-stage binary counters 232 and 234. The 2.56 MHz clock signal CL$_{2.56}$ from the clock generator 130 of FIG. 7 is applied to the trigger input terminal T of the counter 232 and the output signal taken from the true output terminal QD of the fourth binary stage is applied through an inverter 236 to the trigger input terminal of the first of the four serially connected stages of the counter 234.

The output signal from the true output terminal QB of the counter 234 is applied as the sync clock signal SCLK1 to the post-acquisition gate generator 190 of FIGS. 18 and 21. Similarly, the output signal from the true output terminal QC of the third stage and the true output terminal QD of the fourth stage of the counter 234 are applied to the post-acquisition gate generator 190 as the SCLK2 signal and the SCLK3 signal respectively. The output signal from the CARRY output terminal of the counter 234 is provided as the post-acquisition clock signal CLPO to the post-acquisition code generator 122 of FIGS. 7 and 9.

In operation, the post-acquisition sync counter generates three synchronous clock signals delayed by a predetermined amount from the $CL_{2.56}$ clock signal and each other when the fourth stage counters 232 and 234 are enabled by the SYNC signal from the OR gate 196 of FIG. 18. These clock signals, $SCLK_1$–$SCLK_3$ and CLPO are utilized, respectively, by the post-acquisition gate generator 190 of FIGS. 18 and 21 to generate the 25 microsecond and 100 microsecond post-acquisition gate signals $POG_{25}$ and $POG_{100}$ and the missed pulse clock or MPCL signal. In addition, the CLPO signal is applied to the post-acquisition code generator 122 of FIGS. 7 and 9 as the synchronous 10 KHz. clock which clocks the time interval generator 48 thereof.

Post-Acquisition Gate Generator

With reference now to FIG. 21 where the post-acquisition gate generator 190 of FIG. 18 is illustrated in greater detail, the post-acquisition clock signal CLPO from the post-acquisition sync counter 199 of FIG. 20 is applied to one input terminal of a two input terminal AND gate 240. Similarly, the $SCLK_2$ signal from the same source is applied to one input terminal of a three input terminal NAND gate 242 and to the clock input terminal CLK of a pair of conventional flipflops 244 and 246. The $SCLK_1$ signal from the post-acquisition sync counter 199 of FIG. 20 is applied to the clock input terminal CLK of a flipflop 248. The $SCLK_3$ signal is applied to a second input of the NANO gate 242.

The post-acquisition compare signal POCOMP is applied from the post-acquisition code generator 122 of FIG. 9 to the DATA input terminal of the flipflop 244 and the output signal from the true output terminal Q thereof is applied to the DATA input terminal of the flipflop 246, to the other input terminal of the NAND gate 242 and to the pre-acquisition search circuit 124 of FIG. 10 as the $POG_{100}$ signal.

The output signal from the NAND gate 242 is applied to the DATA input terminal of the flipflop 248 which also receives on the PRESET input terminal thereof the SYNC signal from the OR gate 196 of FIG. 18 as earlier described. The SYNC signal is also applied to the clear input terminals CLR of both of the flip-flops 244 and 246.

The output signal from the false output terminal $\overline{Q}$ of the flip-flop 246 is applied to the other input terminal of the AND gate 240 and the output signal therefrom applied as the MPCL signal to the missing pulse counter 198 of FIG. 18. The output signal from the $\overline{Q}$ output terminal of the flip-flop 244 is applied as the POGTE signal to the dual channel logic circuit 128 of FIGS. 7 and 23. The output signal from the false output terminal $\overline{Q}$ of the flip-flop 248 is applied as the $POG_{25}$ signal to the gate select logic circuit 188 of FIGS. 18 and 22.

The operation, the post-acquisition gate generator 190 of FIG. 21 provides the gates which are utilized to gate the video signals VID through the PIM decoder to a utilization device when the system is in track mode. Moreover, the missing pulse clock MPCL supplied to the missing pulse counter 198 of FIG. 18 and the gate signals POGTE and GCOMP which are utilized to place the dual channel logic circuit 128 of FIG. 23 in dual channel mode and to index the post-acquisition code generator 122 of FIG. 7 to the next address, respectively. The 100 microsecond post-acquisition gate $POG_{100}$ may be generated by the sync clock or $SCLK_2$ signal at the clock input terminal of the flip-flop 244 in response to the post-acquisition compare signal POCOMP from the post-acquisition code generator 122 of FIG. 9. This $POG_{100}$ signal from the true output terminal Q of the flip-flop 244 may then be utilized to generate the 25 microsecond signal $POG_{25}$ by chopping off a leading and trailing portion of the 100 microsecond gate through the NAND gate 242 and the flip-flop 248. In this manner, the 25 microsecond post-acquisition gate $POG_{25}$ is centered within the 100 microsecond post-acquisition gate $POG_{100}$ which in turn is predictably generated symmetrically about the pulses of the incoming video signal.

Of course, if the SYNC signal from the OR gate 196 of FIG. 18 indicates that a video pulse has not been gated through the PIM decoder, the flip-flop 246 is set and then reset to generate the MPCL or missing pulse clock signal. The GCOMP and POGTE gate signals are also 100 microsecond signals centered around the expected position of the incoming video signal since the signals are taken from the false or $\overline{Q}$ output terminal of the flip-flop 244 which generates the 100 microsecond post-acquisition gate $POG_{100}$.

Gate Select Logic Circuit

With reference now to FIG. 22 where the gate select logic circuit 188 of FIG. 18 is illustrated in greater detail, the gating signal $POG_{100}$ from the post-acquisition generator 190 of FIG. 21 is applied to one input terminal of a three input terminal AND gate 250. The signal MP1 from the missing pulse counter 198 of FIG. 18 is applied to the second input terminal of the AND gate 250 and through an inverter 252 to the second input terminal of a three input terminal AND gate 254. The track signal TACQ from the track mode flip-flop 189 of FIG. 18 is applied to the third input terminal of the AND gate 250, through an inverter 256 to one input terminal of a two input terminal AND gate 258 and to the first input terminal of the AND gate 254. The gating signal $POG_{25}$ from the post-acquisition gate generator 190 of FIGS. 18 and 21 is applied to the third input terminal of the AND gate 254 and the $PRG_{100}$ signal from the pre-acquisition circuit 124 of FIGS. 7 and 10 is applied to the other input terminal of the AND gate 258.

The output signals from both of the gates 250 and 254 are applied to a two input terminal NOR gate 260. The output signal from the AND gate 258 is applied to a two input terminal NOR gate 262 together with the TRUN signal from the monostable multivibrator 194 of FIG. 18.

The output signals from the two NOR gates 260 and 262 are applied to a two input terminal NAND gate 264. The output signal from the NAND gate 264 is applied as the selected gate signal SELGT to the AND gate 192 of FIG. 18. The SELGT signal is also inverted in an inverter 266 and applied as the gate accept signal GACPT to the control unit 40 of FIG. 1.

In operation, the gate select logic 188 of FIG. 22 essentially selects the proper width gate accept and selected gate signals GACPT and SELGT in response to the missing pulse counter 198 output signal The 100 microsecond pre-acquisition gate $PRG_{100}$ from the pre-acquisition gate generator is applied to the AND gate 258 and provided as the output signals GACPT and SELGT when the TACQ signal from the track mode flip-flop 189 of FIG. 18 indicates that the system is not in track mode. On the other hand, the pre-acquisition gate signal $PRG_{100}$ is inhibited when the system is in track mode.

The 25 microsecond post-acquisition gate $PG_{25}$ is issued as the output signals from the gate select logic circuit 188 when the system is in track as is indicated by the TACQ signal and when the count in the missing pulse counter 198 of FIG. 18 is 0. However, should the count in the missing pulse counter 198 of FIG. 18 become 1 or more, the 100 microsecond post-acquisition gate $POG_{100}$ is issued as the output singnals from the gate select logic circuit 188. In this manner, the gate with which the video signal VID is gated through the post-acquisition track circuit 126 of FIG. 18 may be widened and narrowed in response to the number of pulses missed.

In addition, the truncated signal TRUN from the truncate multivibrator 194 of FIG. 18 truncates the output gate GACPT and SELGT irrespective of which gate is selected exactly 20 microseconds after a video pulse is gated through the AND gate 192 of FIG. 18.

Dual Channel Logic

With reference now to FIG. 23 where the dual channel logic circuit 128 of FIG. 7 is illustrated in greater detail, a dual channel control circuit 268 hereinafter described in connection with FIG. 24 receives the post-acquisition gate signal POGTE from the post-acquisition gate generator of FIG. 18 as well as the delayed track signal TACQD from the post-acquisition track circuit 126 of FIG. 19. The dual channel control circuit 268 also receives the 10 KHz. clock signal $CL_{10}$ from the clock generator 130 of FIG. 7 as well as the post-acquisition clear signal POCLR and the post-acquisition code generator index signal POIND from the Y address generator 4 of FIG. 9.

The $AG_X$ signals from the pre-acquisition code generator 120 of FIG. 8 and the $AG_Y$ signals from the post-acquisition code generator 122 of FIG. 9 are applied to a conventional digital comparator 270 which provides the $X \geq Y$ signal to the dual channel control circuit 268.

The dual channel control circuit 268 provides a DCONT signal to one input terminal of a three input terminal AND gate 272 to which the pre-acquisition gate signal PRGTE from the pre-acquisition search circuit 124 of FIGS. 7 and 10 is also applied. The AND gate 272 also receives the ADTA signal from the pre-acquisition search circuit 124 of FIGS. 7 and 10. The output signal from the AND gate 272 is applied as the DCPC signal to the post-acquisition track circuit 126 of FIGS. 7 and 11 and is also applied to the clock input terminal CLK of a dual channel inhibit flip-flop 274.

The post-acquisition reset signal PORST from the post-acquisition track circuit 126 of FIGS. 7 and 18 is applied to the clear input terminal CLR of the flip-flop 274. This PORST signal may be gated with a master clear signal if desired. The D input terminal of the flip-flop 274 receives a positive bias and the true output terminal Q thereof provides the DCINH signal to the post-acquisition track circuit 148 of FIG. 18.

In operation, the X and Y address signals $AG_X$ and $AG_Y$ from the pre-acquisition code generator 120 and the post-acquisition code generator 122, respectively, of FIG. 7 are compared by the digital comparator 270 and an indication of a $X \geq Y$ condition is provided by the X Y signal. Ordinarily, the $X \geq Y$ signal would only be indicative of the possibility that the X address is higher than the Y address thereby indicating that the signal being tracked is that of a repeater-type countermeasure. However as was previously mentioned, the timing of the system in accordance with this embodiment is such that the Y address always exceeds the X address by 1 count even when the system it is tracking the proper laser designator. There may be one exception to this condition in that the Y address may be reset to 0 before the X address as the counters which generate the address signals cycle through the count of 254 as was previously described. When this happens, the X address signal $AG_X$, although smaller than the Y address signal in actuality since it is trailing the Y address signal, may appear to be greater than the Y address signal until the X address counter cycles from 254 to 0.

The dual channel control circuit 268 of FIG. 24 prevents this condition from affecting the dual channel mode by utilizing the post-acquisition clear and post-acquisition index signals POCLR and POIND, respectively, from the post-acquisition code generator 122 of FIG. 7 as will hereinafter be described in connection with FIG. 24. Under all other circumstances, the $X \geq Y$ signal from the digital comparator 270 alerts the dual channel control circuit 268 to the fact that the system is tracking a repeater countermeasure if the system is in track as indicated by the TACQD signal.

If dual channel inhibit flip-flop 274 is not set and X is $\geq$ Y and fourth pulse conincidences detected, the 10 KHz. track clock CLPO is sychronized to the desired code and the Y address counter in the post-acquisition code generator 122 of FIG. 7 is loaded with the address $AG_X$ in the X address counter of the pre-acquisition code generator 120 of FIG. 7. Dual channel inhibit flip-flop 274 is set and the pre-acquisition circuits continue to search for the correct code.

However, if either track mode is reset as is indicated by the TACQD or if $X \not\geq Y$ or if the fourth pulse coincidence is not detected or finally if dual channel inhibit is already set, the system is recycled in pre-acquisition search mode without transferring the X address signal $AG_X$ to the Y address counter.

Dual Channel Control Circuit

With reference now to FIG. 24 where the dual channel control circuit 268 of FIG. 23 is illustrated in greater detail, the post acquisition reset signal PORST and the post-acquisition clear signal POCLR are applied to a two input terminal NOR gate 276 and the output signal therefrom applied to the clear input terminal CLR of the conventional five-stage binary counter 278. The counter 278 receives the post-acquisition generator index signal POIND at the clock input terminal CLK thereof and provides at the true output terminal QE of the 5th stage thereof a signal which inverted in an inverter 280 and applied to one input terminal of a two input terminal NOR gate 282.

The $X \geq Y$ signal from the digital comparator 270 of FIG. 23 is applied to the other input terminal of the NOR gate 282 and the X≧Y≧5 output signal therefrom is passed through an inverter 284 to the D input terminal of a conventional flip-flop 286.

The flip-flop 286 receives at the PRESET input terminal thereof the post-acquisition gate signal POGTE from the post-acquisition track circuit 126 of FIGS. 7 and 11. The flip-flop 286 also receives the 10 KHz. clock signal $CL_{10}$ from the clock generator 130 of FIG. 7 at the clock input terminal CLK thereof as well as the delayed track signal TRAQD from the post-acquisition track circuit 126 of FIGS. 7 and 18. The output signal from the true output terminal Q of the flip-flop 286 is applied as the DCONT signal to the AND gate 272 of FIG. 23.

In operation, the 5-stage counter 278 of the dual channel control circuit 268 of FIG. 24 provides a signal through the inverter 280 and NOR gate 282 and the inverter 284 to set the flip-flop 286 if the count in the Y address counter is less than 5. This signal may be provided by clearing the counter 278 when the Y address counter is cleared as is indicated by the post-acquisition clear signal POCLR from the Y address counter in the X address generator 42 of FIG. 9 and by thereafter counting the clock pulse POIND which clock this address counter. Moreover, if the X address signal exceeds the Y address signal, the flip-flop 286 is set.

In addition, it should be noted that the flip-flop 286 may be set by the POGTE signal from the post-acquisition gate generator 190 of FIGS. 18 and 21 and may be cleared by the delayed track acquisition signal TACQD from the post-acquisition load logic circuit 186 of FIGS. 18 and 19.

DESCRIPTION OF PIM DECODER OF FIG. 25

With reference to FIGS. 25a–25d as organized in the manner illustrated in FIG. 25, the decoder is divided into the pre-acquisition or search section and the post-acquisition or track section. These two sections function independently, with the logic flow being switched from pre-acquisition to post-acquisition at the time that the correct code is acquired.

The decoder logic begins with the entry of the desired code as designated by a 9 bit binary word. This binary word is entered serially at the serial data input 411 to reset all decoder circuits to the proper initial conditions and initiate the search mode. The decoder searches for a three pulse coincidence in the digital correlator at a 2.56 MHz. rate as earlier explained. This search function is accomplished by the pre-acquisition code generator 410 and the pre-acquisition search circuits 450. The pre-acquisition code generator 410 operates as described previously in the description of the designator encoder with the exception that the pre-acquisition clock signal or lead 417 is 2.56 MHz. thereby generating the code sequence in compressed time. This 2.56 MHz. clock is switched by logic 462 onto lead 417. Since the designator encoder disposed at a remote location and serving to illuminate the target has a clock signal input of 10 KHz., this time compression is a factor of 256.

The pre-acquisition code generator consists of the sequence logic circuit 412, the X address counter 414, a Σ ROM 416, the address adder 418, the initial address memory 420, IROM 422, the interval adder 424, the pre-acquisition code counter 426, and the comparator circuits 428.

The pre-acquisition code generator 410 generates pulses proportional to the desired code sequence and enters by lead 413 this compressed code in the digital correlator 452 as register B data. This compressed code sequence is shifted through the digital correlator 462 at a clock rate of 2.56 MHz. The pre-acquisition search circuits 450 consist of the digital correlator 452, a video sync circuit 454, a 3 of 4 decoder 456, a frequency select circuit 458, a delay compensation circuit 460, a pre-acquisition clock logic circuit 462, a stop scan function circuit 464, and a pre-acquisition gate generator 466.

Incoming received laser pulses enter the decoder subassembly on video input line 451. These video pulses are synchronized to the 10 KHz. clock signal by the video sync circuit 454 and entered in the digital correlator as register A data 453. The digital correlator 452 stores at least two complete intervals as marked by the received laser pulses and compares the stored data with the complete code sequence as generated by the pre-acquisition code generator.

If three pulses in the received video register match three pulses in the high speed register of the digital correlator 452, i.e., two received time intervals match two intervals in the desired code, the decoder will have a three pulse coincidence. If a three pulse coincidence is not detected, then the decoder remains in the search mode and continues seeking the correct code.

If a three pulse coincidence is detected by the 3 of 4 decoder 456, a three pulse coincidence signal 455 is issued. If track acquisition has not been achieved, then this coincidence signal provides a stop scan signal 457 and the frequency select circuits control the pre-acquisition clock logic to effect change from 2.56 MHz. to 10 KHz. The slower clock rate is then used to both generate the next interval in the pre-acquisition code generator 410 and to shift the generated code through the digital correlator 452.

A delay compensation circuit 460 assumes that the desired code and the incoming received code are synchronized in the digital correlator 452 and are shifted through the digital correlator together. When the pre-acquisition code generator 410 completes the next interval, a signal from the 12 bit comparator 428 on lead 415 is sent to the pre-acquisition gate generator 466 to provide therefrom a 100 microsecond fourth pulse gating signal.

At this point the decoder switches from the search mode to the track mode. The gate select logic circuit 476 receives the 100 microsecond fourth pulse gating signal 459 and provides a 100 microsecond signal accept gating signal 471. If a received laser pulse on the video input line 451 falls within this signal accept gating signal, coincidence is detected by the AND gate 478 and a coincidence signal 473 results. If no received laser pulse falls within the gate, then the stop scan signal 457 is reset, and the decoder returns to the search mode. The track mode then awaits another 100 microsecond fourth pulse gating signal.

When the coincidence signal 473 is provided, the track mode circuits 482 are set, the Y address counter 434 is loaded with a number which is one number greater than the number in the X address counter 414 at the time of coincidence, the 3.3 second timer function circuit 484 is reset if it has been previously set, and a track acquisition signal 475 is generated.

At this point the post-acquisition track circuits 470 synchronize the post-acquisition code generator 430 to the incoming received laser pulses and predicts when each subsequent received laser pulse is expected. These received laser pulses are passed into the decoder via the video input line 451. The post-acquisition track circuits 470 comprise the post-acquisition gate generator 472, the post-acquisition sync counter 474, the gate select logic circuit 476, a coincidence gate 478, a 20 microsecond gate truncation circuit 480, a track mode circuit 482, a 3.3 second timer function circuit 484, a missing pulse counter 486, and OR gates 488, 490 and 492.

The post-acquisition track circuits 470 synchronize the 10 KHz. track clock signal 477 from the post-acquisition sync counter 474 to the received laser pulses. The 20 microsecond gate truncation circuit 480 truncates the signal accept gate 471 20 microseconds after the coincidence signal 473. The coincidence signal 473 also resets the missing pulse counter 486 if it has been set, and also resets the hold signal 479 if it has been set. The post-acquisition code generator 430 is thus activated and begins to generate the desired code in real time.

The post-acquisition code generator 430 comprises a sequence logic circuit 432, a Y address counter 434, a Σ ROM 436, an address adder 438, an initial address memory 440, an IROM 442, an interval adder 444, a post-acquisition code counter 446, and a comparator circuit 448. The post-acquisition code generator 430 operates as the designator encoder described previously and generates pulses at the appropriate times to mark the intervals of the correct code sequence. These pulses, on the signal lead 431, trigger the post-acquisition gate generator 472 to generate 25 microsecond and 100 microsecond gating signal centered around the next expected received laser pulse.

The post-acquisition track circuits then reset the stop scan signal 457 if it has been set. If the missing pulse counter 486 contains a zero, then a 25 microsecond signal accept gating signal 471 centered around the next expected received laser pulse will be generated. If a received laser pulse falls within this gate, another coincidence signal 473 will be generated and the sequence of events as described above will be repeated. If a received laser pulse does not fall within this gating signal, then the hold signal 479 is set, and the missing pulse counter 486 is incremented by 1.

If the missing pulse counter 486 contains a number less than 6, the logic again generates the 25 and 100 microsecond gating signals. When the missing pulse counter 486 no longer contains 0, a 100 microsecond signal accept gating signal 471 is generated. The post-acquisition track circuits 470 continue operating in the above manner until a received laser pulse fails to fall within six consecutive gate signals. At this point the missing pulse counter would contain a six and the track mode circuit 482 would be reset, the missing pulse counter 486 would be reset to 0, and the dual channel inhibit circuit 504 would be reset if it has previously been set. At this point the decoder would return to the search mode and the track mode circuits would again await the 100 microsecond fourth pulse gate from the search mode circuits. In other words, if 6 consecutive pulses are missed, the decoder returns to a searching condition.

The condition of the output signals of the decoder at this point depends upon the state of the independent mode input signal 481. If the decoder is not in the independent mode, then the track acquisition signal 475 and the hold signal 479 are reset. If the decoder is in the independent mode, then the firm track inhibit signal 483 is reset and the 3.3 second timer function 484 is set. If the decoder reacquires the correct code before the 3.3 second timer has run to completion, then the firm track inhibit signal 483 is set at the time of that reacquisition. If the 3.3 second timer completes its run, the firm track inhibit signal 483 is set, and the track acquisition signal 475 and the hold signal 479 are reset.

The above description concerning the role of the independent mode input signal is not strictly a function of the decoder, but is a requirement of the specific seeker system with which it is interfaced. If the decoder was interfaced with other seeker systems, other output conditioning and/or timing might be required.

During the time decoder (the entire subassembly) has been operating in the track mode, the pre-acquisition search circuits 450 have been operating in conjunction with the dual channel function circuit 500. This allows the decoder to continue to search for advance phases of the desired code while the post-acquisition track circuits 470 have been tracking the code previously acquired. The dual channel function 500 consists of an AND gate 502, a dual channel inhibit circuit 504, a dual channel control circuit 506, and the X vs. Y counter comparator 508.

If a correct code has been acquired, the dual channel function circuit operates to set the track mode and enable the dual channel function unless it has been inhibited. The criteria for determining if an acquired code is an advance phase of the code previously acquired is the condition of the X vs. Y comparator 508. If the number in the X address counter 414 is greater than or equal to the number contained in the Y address counter 434, then the newly acquired code is an advanced phase. An X greater than or equal to Y signal 501 is generated to enable the dual channel control circuit 506. If X is not greater than or equal to Y, then the dual channel function circuit 500 will continue to search.

If X is greater than or equal to Y, then the dual channel control circuit 506 enables the pre-acquisition search circuit 450 to generate a 100 microsecond gating signal used to check for the presence of a properly timed fourth received laser pulse from the video input line 451. If the AND gate 502 detects coincidence, then the post-acquisition track circuits 470 are synchronized to the advance code phase.

The Y address counter 434 is loaded with a number which is one number greater than the number in the X address counter 414 at the time of the dual channel coincidence. The dual channel inhibit 504 is then set, and the search mode is inhibited until either the post-acquisition track circuits 470 miss six consecutive pulses, or until the decoder in its entirety is reset by entering a new code. The dual channel function 500 is inhibited after one update cycle because of the unlikelihood of there being more than one repeater spoofer countermeasure device operating at the target.

All of the logic in the decoder is synchronized by a clock system (not shown) operating from a 5.12 MHz. master oscillator and utilizing digital countdown circuits to produce all lower frequency clock signals required by the decoder. This master oscillator and clock system is internal to the decoder, but is not shown on the block diagram. This synchronous clock system achieves proper timing throughout the decoder logic and assures reliable operation.

ADVANTAGES AND SCOPE OF THE INVENTION

From the foregoing it is apparent that the novel pulse interval modulation technique disclosed herein provides many unique advantages in security in transmission and freedom from both unintentional interference and deliberate jamming. The many code possibilities may be easily set in the field under adverse conditions and at the last minute thereby virtually eliminating advance enemy knowledge of the code when the invention is utilized in a military application such as described herein.

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A reflected wave energy system comprising:
   means for transmitting a psuedo-random, cyclically repetitive code including a series of pulses of wave energy, the spacing of the pulses of said code defining a plurality of sequential pairs of time intervals, each pair of time intervals being unique within one cycle of said code;
   means for receiving pulses of wave energy;
   a first shift register;
   means responsive to said pulse receiving means for clocking pulses into a first serial shift register at a first predetermined rate;
   means for generating a series of pulses defining said psuedo-random, cyclically repetitive code;
   a second shift register;
   means responsive to said pulse generating means for clocking pulses into said second shift register at a second predetermined rate higher than said first predetermined rate;
   means for comparing the signal levels of corresponding stages of said first and second shift registers; and,
   means responsive to said comparison means for generating a specific signal.

2. The system of claim 1 wherein said specific signal generating means is responsive to a predetermined comparison of at least three corresponding stages of said first and second shift registers.

3. The system of claim 1 wherein said transmitting means includes:
   first means for storing a plurality of unique digital words each at a location assigned a predetermined address;
   means for selectively addressing one of said predetermined locations to read the digital word stored at said one of said locations; and,
   means for spacing sequential pulses in accordance with a time interval related in duration to the digital word read from said one of said locations.

4. The system of claim 3 wherein said addressing means comprises:
   means for selectively generating an initial address signal corresponding to one of said predetermined addresses assigned to said locations;
   means for generating a second address signal;
   means for addressing said one of said locations responsively to said initial and second address signals; and,
   wherein a set of predetermined, unique, cyclically repetitive codes is defined by the locations of said stored plurality of unique digital words in said storing means, a desired one of said set of unique codes being selected responsively to said initial address signal.

5. Apparatus for selecting a desired transmitted series of pulses of wave energy in the presence of undesired pulses comprising:
   means for modulating the spacing between adjacent pulses of the transmitted series of pulses in accordance with a selected psuedo-random code which repeats after one cycle of a predetermined number of pulses, the spacing between adjacent pairs of pulses differing for all pulse pairs in the code;
   means for receiving both the undesired and the transmitted series of pulses;
   means for generating a series of pulses spaced in a manner related to the selected psuedo-random code and equal in number to at least one cycle of the code; and,
   means for successively comparing the spacing between a predetermined number of said received pulses with the spacing between said generated pulses.

6. The apparatus of claim 5 wherein said modulating means and said generting means both include:
   first means for storing a plurality of unique digital words each at a location assigned a predetermined address;
   means for selectively addressing one of said predetermined locations to read the digital word stored at said one of said locations; and,
   means for spacing sequential pulses in accordance with a time interval related in duration to the digital word read from said one of said locations.

7. The apparatus of claim 6 wherein said addressing means comprises:
   means for selectively generating an initial address signal corresponding to one of said predetermined addresses assigned to said locations;
   means for generating a second address signal;
   means for addressing said one of said locations responsively to said initial and second address signals; and,
   wherein a set of predetermined, unique, cyclically repetitive codes is defined by the locations of said stored plurality of unique digital words in said storing means, a desired one of said set of unique codes being selected responsively to said initial address signal.

8. An encoder comprising:
   pulse generating means;
   means for establishing a plurality of different time intervals; and,
   means for modulating the spacing of adjacent pulses generated by said pulse generating means in accordance with unique pairs of time intervals selected in a predetermined order to thereby encode the pulse signal as an ordered series of unique time interval pairs.

9. The encoder of claim 8 wherein the number of time intervals is an integer and the maximum number of unique time interval pairs is an integer equal to the square of the number of time intervals.

10. The encoder of claim 9 wherein a predetermined number of unique time interval pairs comprises one cycle of the encoded pulse signal.

11. Apparatus for decoding an incoming signal encoded in accordance with a predetermined code while simultaneously searching for an incoming signal encoded in accordance with said first predetermined code comprising:
- means for generating first and second signals encoded in accordance with the predetermined code;
- means for comparing the encoded incoming signal with said first signal at a comparison rate higher than the repetition rate of the incoming signal;
- means for synchronizing said second signal with the encoded incoming signal in response to a favorable comparison;
- means for gating the encoded incoming signal to a utilization device in response to the synchronized second signal;
- means for continuing the comparing of the encoded incoming signal with said first signal at said comparison rate after synchronizing the second signal;
- means for correlating the code positions in the encoded incoming signal indicated by said first and second signals in response to each further favorable comparison; and,
- means for synchronizing said second signal with a first received encoded incoming signal in response to said correlating means.

12. A method for synchronizing a receiver to a transmitted series of pulses of wave energy of wave energy comprising the steps of:
   (a) transmitting a series of pulses of wave energy spaced according to a selected psuedo-random, cyclically repetitive code wherein the spacing of the pulses defines a plurality of sequential pairs of intervals with each pair of intervals being unique within one cycle of the code;
   (b) receiving the pulses of wave energy;
   (c) shifting the received pulses into a first serial shift register clocked at a first rate;
   (d) generating a series of pulses defining pulse pairs spaced in a manner related to and in the same sequence as the pulse pairs of the transmitted pulses;
   (e) shifting the generated series of pulses into a second shift register clocked at a second predetermined rate higher than the first predetermined rate;
   (f) comparing the signal levels of corresponding stages of the first and second shift registers; and,
   (g) generating a synchronization signal in response to a favorable comparison of the signal levels of at least three corresponding stages of the first and second shift registers.

13. The method of claim 12 wherein said series of pulses of wave energy are spaced by:
   storing a plurality of digital words each at a location assigned a predetermined address;
   selectively addressing one of said predetermined locations to read the digital word stored at said one of said locations; and,
   spacing sequential pulses in accordance with a time interval related in duration to the digital word read from said one of said locations.

14. The method of claim 13 wherein a set of predetermined, unique, cyclically repetitive codes is defined by the locations of said stored plurality of digital words, and including the step of selectively generating an initial address signal to select one code of said set of codes.

15. A method for selecting a desired transmitted series of pulses of wave energy in the presence of interfering pulses comprising the steps of:
   (a) modulating the spacing between adjacent pulses of a transmitted series of pulses in accordance with a selected psuedo-random code which repeats after one cycle of a predetermined number of pulses, the spacing between adjacent pairs of pulses differing for all pulse pairs in the one cycle of the code;
   (b) receiving the transmitted series of pulses in the presence of interfering pulses;
   (c) generating a series of pulses spaced in relation to the selected psuedo-random code and equal in number to at least one cycle of the code; and,
   (d) successively comparing the spacing between a predetermined number of the received pulses and the spacing between the generated pulses until at least two successive spaces compare favorably.

16. The method of claim 15 wherein the spacing between adjacent pulses is modulated by:
   storing a plurality of digital words each at a location assigned a predetermined address;
   selectively addressing one of said predetermined locations to read the digital word stored at said one of said locations; and,
   spacing sequential pulses in accordance with a time interval related in duration to the digital word read from said one of said locations.

17. A method for encoding a pulse signal comprising the steps of:
   (a) establishing a plurality of different time intervals; and,
   (b) spacing adjacent pulse pair of the pulse signal in accordance with unique pairs of said intervals selected in a predetermined order to thereby encode the pulse signal as an ordered series of interpulse interval pairs, the interpulse intervals defined by three consecutive pulses of the pulse signal being unique.

18. The method of claim 17 wherein the time intervals are established by storing a plurality of digital words each representing a unique time interval at locations assigned predetermined addresses.

19. The method of claim 18 wherein the adjacent pulse pairs are spaced by:
   selectively addressing said predetermined locations in a selectable sequence to sequentially read the digital words stored at said locations; and,
   spacing sequential adjacent pulses of the pulse signal in accordance with a time interval related in duration to the digital words read from said locations.

20. The method of claim 19 wherein a set of predetermined, unique, cyclically repetitive codes is defined by the locations of said stored plurality of digital words, and including the step of selectively generating an initial address signal to select one code of said set of codes.

21. The method of claim 17 wherein the number of time intervals is an integer and wherein the maximum number of unique interpulse interval pairs is an interger equal to the square of the number of time intervals.

22. The method of claim 21 wherein a number of unique interpulse interval pairs in one cycle of the encoded pulse signal equals the square of the number of time intervals and wherein the cycle is repeated.

23. A method for decoding an incoming signal encoded in accordance with a predetermined code while simultaneously searching for an incoming signal encoded in accordance with the predetermined code comprising the steps of:
   (a) generating first and second signals encoded in accordance with the predetermined code;

(b) comparing the encoded incoming signal with the first signal at a comparison rate higher than the repetition rate of the incoming signal;

(c) synchronizing the second signal with the encoded incoming signal in response to a favorable comparison;

(d) gating the encoded incoming signal to a utilization device in response to the synchronized second signal;

(e) continuing the comparing of the encoded incoming signal with the first signal at said comparison rate after synchronizing the second signal;

(f) correlating the code positions in the encoded incoming signal indicated by the first and second signals in response to each further favorable comparison; and, (g) synchronizing the second signal with the first received encoded incoming signal in response to the correlation.

24. Apparatus for selectively generating an encoded pulse signal comprising:
a read only memory having a plurality of unique digital words each stored at a location assigned a predetermined address;
means for selectively addressing said predetermined locations to read the digital words stored at said locations; and,
means for spacing sequential pulses in accordance with pairs of time intervals related in duration to digital words read from said locations.

25. The apparatus of claim 24 wherein each of said unique digital words represents a unique time interval.

26. The apparatus of claim 24 wherein said spacing means comprises:
means for generating a series of spaced pulses; and,
means for modifying the spacing between said pulses responsively to the digital word read from said one of said locations.

27. Apparatus for selectively generating an encoded pulse signal comprising:
first means for storing a plurality of unique digital words each at a location assigned a predetermined address;
means for selectively generating an initial address signal corresponding to one of said predetermined addresses assigned to said locations;
means for generating a second address signal;
means for selectively addressing one of said predetermined locations to read the digital word at said one of said locations responsively to said initial and second address signals;
means for generating a series of spaced pulses; and,
means responsive to said pulse generating means for generating a sequential pulse spaced in accordance with the digital word read from said addressed one of said locations.

28. The apparatus of claim 27 wherein a set of predetermined, unique, cyclically repetitive codes is defined by the locations of said stored plurality of unique digital words in said storing means, a desired one of said set of unique codes being selected responsively to said initial address signal.

29. The apparatus of claim 28 wherein said storing means comprises a physically replaceable read only memory, whereby a read only memory having one arrangement of unique digital words stored therein can be replaced by a read only memory having another arrangement of unique digital words stored therein to thereby permit selection between different, unique sets of codes.

30. The apparatus of claim 27 including means for summing said initial address signal and said second address signal to generate a current address signal, said locations being addressed responsively to said current address signal.

31. The apparatus of claim 27 wherein said means for generating said second address signal includes:
a counter responsive to each pulse of said modified series of pulses for providing a digital output signal; and,
means for enabling and inhibiting said counter, said second address signal being generated responsively to said counter output signal, said second address generating means providing a single predetermined second address signal when said counter is inhibited and a plurality of successive second address signals when said counter is enabled.

32. The apparatus of claim 31 wherein a set of predetermined, unique, cyclically repetitive codes is defined by the locations of said stored plurality of unique digital words in said storing means, a desired one of said set of unique codes being selected responsively to said initial address signal.

33. The apparatus of claim 32 wherein said storing means comprises a physically replaceable read only memory, whereby a read only memory having one arrangement of unique digital words stored therein can be replaced by a read only memory having another arrangement of unique digital words stored therein to thereby permit selection between different, unique sets of codes.

34. The apparatus of claim 31 wherein said means for generating said second address signal includes:
second means for storing a plurality of digital words each representing a partial sum of a plurality of unique address differences and each stored at a location assigned a predetermined address; and,
means for addressing one of said locations of said second storing means responsively to said counter output signal to select the partial sum of said unique address differences stored at that location, said one of said locations of said first storing means being addressed responsively to said initial address signal and said selected partial sum.

35. The apparatus of claim 34 wherein said first and second storing means each comprise a read only memory.

36. Apparatus for selectively generating an encoded pulse signal comprising:
first means for storing a plurality of unique digital words each at a location assigned a predetermined address;
means for selectively addressing one of said predetermined locations to read the digital word stored at said one of said locations; and,
means for spacing sequential pulses in accordance with a time interval related in duration to the digital word read from said one of said locations,
said addressing means including:
means for selectively generating an initial address signal corresponding to one of said predetermined addresses assigned to said locations;
a counter responsive to each of said spaced sequential pulses for providing a digital output signal;
means for enabling said counter to generate a plurality of successive subsequent address signals; and, means for successively addressing different ones of said pre-determined locations responsively to said initial and subsequent address signals to successively read said digital words stored at said different ones of said locations.

37. The apparatus of claim 36 wherein said spacing means comprises:
   means for generating a series of spaced pulses; and,
   means for modifying the spacing between successive pairs of said pulses responsively to the successively addressed digital words.

38. The apparatus of claim 36 wherein a set of predetermined, unique, cyclically repetitive codes is defined by the locations of said stored plurality of unique digital words in said storing means, a desired one of said set of unique codes being selected responsively to said initial address signal.

39. The apparatus of claim 38 wherein said storing means comprises a physically replaceable read only memory, whereby a read only memory having one arrangement of unique digital words stored therein can be replaced by a read only memory having another arrangement of unique digital words stored therein to thereby permit selection between different, unique sets of codes.

40. A pulse interval modulation encoder comprising:
   first means for storing a plurality of digital words each representing a unique time interval and each stored at a location assigned a predetermined address;
   means for selectively generating an initial address signal;
   means for sequentially generating subsequent address signals;
   means for selectively reading said stored plurality of digital words responsively to said initial and subsequent address signals;
   means for generating a series of spaced pulses; and,
   means for modifying the spacing between successive pairs of pulses in said series of pulses in response to said selectively read digital words.

41. The encoder of claim 40 wherein a set of predetermined, unique, cyclically repetitive codes is defined by the locations of said stored plurality of unique digital words in said storing means, a desired one of said set of unique codes being selected responsively to said initial address signal.

42. The encoder of claim 41 wherein said storing means comprises a physically replaceable read only memory, whereby a read only memory having one arrangement of unique digital words stored therein can be replaced by a read only memory having another arrangement of unique digital words stored therein to thereby permit selection between different, unique sets of codes.

43. The encoder of claim 40 wherein said means for generating subsequent address signals comprises:
   a counter responsive to each pulse of said modified series of pulses for providing a digital output signal; and,
   means for enabling and inhibiting said counter, said subsequent address signals being generated responsively to said counter output signal, said subsequent address signal generating means providing identical predetermined subsequent address signals when said counter is inhibited and a plurality of different subsequent address signals when said counter is enabled.

44. The encoder of claim 43 wherein said means for generating subsequent address signals includes:
   second means for storing a plurality of digital words each representing a partial sum of a plurality of unique address differences and each stored at a location assigned a predetermined address; and,
   means for addressing one of said locations of said second storing means responsively to said counter output signal to select the partial sum of said unique address differences stored at that location and to thereby generate said subsequent address signal, whereby the addressing of said one of said locations of said first storing means by said initial and subsequent address signals is relatively immune to spurious noise pulses.

45. The encoder of claim 44 wherein said first and second storing means each comprise a read only memory.

46. Apparatus for selecting a coded series of pulses from a received signal in the presence of interfering pulses comprising:
   first storing means for storing a plurality of digital words each representing a unique time interval and each stored at a location assigned a predetermined address;
   first addressing means for selectively addressing one of said predetermined locations to read the digital word stored at said one of said locations;
   first generating means for generating a first series of pulses;
   first modulating means for modulating the spacing between two pulses in said series of pulses in accordance with the time interval represented by the digital word read from said first storing means;
   means for comparing the spacing between pulses of the received signal with spacing between pulses of the modulated first series of pulses;
   means for generating a gating signal synchronized to the coded series of pulses in the received signal in response to a favorable comparison; and,
   means for selectively gating the received signal in response to said gating signal.

47. The apparatus of claim 46 wherein said gating signal generating means comprises:
   second storing means for storing a plurality of digital words each representing a unique time interval and each stored at a location assigned a predetermined address;
   second addressing means for selectively addressing one of said predetermined locations to read the digital word stored at said one of said locations;
   second generating means for generating a second series of pulses;
   second modulating means for modulating the spacing between two pulses in said second series of pulses in accordance with the time interval represented by the digital word read from said second storing means to generate said gating signal; and,
   means for synchronizing said second addressing means to said first addressing means in response to a favorable comparison by said comparing means.

48. The apparatus of claim 46 wherein said comparing means comprises:
   first and second shift registers;
   means for shifting the received coded series of pulses into said first shift register at a first predetermined rate;

means for shifting said modulated first series of pulses into said second shift register at a second predetermined rate higher than said first rate; and, means for comparing the signal levels of corresponding stages of said first and second shift registers.

49. The apparatus of claim 48 wherein said gating signal generating means comprises:

second storing means for storing a plurality of digital words each representing a unique time interval and each stored at a location assigned a predetermined address;

second addressing means for selectively addressing one of said predetermined locations to read the digital word stored at said one of said locations;

second generating means for generating a second series of pulses;

second modulating means for modulating the spacing between two pulses in said second series of pulses in accordance with the time interval represented by the digital word read from said second storing means to generate said gating signal; and, means for synchronizing said second addressing means to said first addressing means in response to a favorable comparison by said comparing means.

50. The apparatus of claim 48 wherein said comparing means includes means for generating a specific output signal in response to a favorable comparison between three corresponding stages of said first and second shift registers, said gating signal generating means being responsive to said specific output signal.

51. A laser target designation and tracking system comprising:

a laser transmitter at a first location for transmitting a series of pulses of light wave energy toward a target;

means at said first location for modulating the spacing between the pulses of said series of pulses in accordance with a predetermined cyclically repetitive code, the spacing of the pulses defining a plurality of sequential pairs of time intervals, each pair of time intervals being unique for one cycle of the code;

means at a second location for receiving light wave energy reflected from the target;

means at said second location for generating a series of pulses spaced in accordance with said predetermined code; and, means at said second location for comparing the received light wave energy with said generated series of pulses to detect said predetermined code.

52. The system of claim 51 wherein said modulating means includes means for selectively generating any code in a set of predetermined, unique, cyclically repetitive codes, the spacing between the pulses of said series of pulses being modulated in accordance with the selectively generated code.

53. The system of claim 52 wherein each selectively generated code of said set of predetermined, unique, cyclically repetitive codes comprises a plurality of sequential, unique pairs of time intervals, each pair of time intervals in each code of said set of codes being unique.

54. The system of claim 53 wherein said modulating means comprises:

first means for storing a plurality of digital words each representing a unique time interval and each stored at a location assigned a predetermined address;

means for selectively generating an initial address signal;

means for sequentially generating subsequent address signals;

means for selectively reading said stored plurality of digital words responsively to said initial and subsequent address signals;

means for generating a series of spaced pulses;

means for modifying the spacing between successive pairs of pulses in said series of pulses in response to said selectively read digital words; and, means for applying said modified series of pulses to said laser transmitter.

55. The system of claim 54 wherein a desired code in said set of codes is selected in response to the generated initial address signal.

56. The system of claim 51 wherein said modulating means comprises:

first means for storing a plurality of digital words each representing a unique time interval and each stored at a location assigned a predetermined address;

means for selectively generating an initial address signal;

means for sequentially generating subsequent address signals;

means for selectively reading said stored plurality of digital words responsively to said initial and subsequent address signals;

means for generating a series of spaced pulses;

means for modifying the spacing between successive pairs of pulses in said series of pulses in response to said selectively read digital words; and, means for applying said modified series of pulses to said laser transmitter.

57. The system of claim 56 wherein said means for generating subsequent address signals comprises:

a counter responsive to each pulse of said modified series of pulses for providing a digital output signal; and, means for enabling and inhibiting said counter, said subsequent address signal being generated responsively to said counter output signal, said subsequent address signal generating means providing a single predetermined subsequent address signal when said counter is inhibited and a plurality of successive subsequent address signals when said counter is enabled.

58. The system of claim 57 wherein said means for generating said subsequent address signal includes:

second means for storing a plurality of digital words each representing a partial sum of a plurality of unique address differences and each stored at a location assigned a predetermined address; and, means for addressing one of said locations of said second storing means responsively to said counter output signal to select the partial sum of said unique address differences stored at that location and to thereby generate said subsequent address signal, whereby the addressing of said one of said locations of said first storing means responsively to said initial and subsequent address signals is relatively immune to spurious noise pulses.

59. The system of claim 58 wherein said first and second storing means each comprise a read only memory.

60. A coded wave energy transmitting and receiving system comprising:

a transmitter adapted to transmit a series of pulses applied thereto in the form of wave energy;

a read only memory having a plurality of stored digital words each representing a unique time interval and each stored at a location assigned a predetermined address;

first means for selectively addressing said predetermined locations of said first storing means to sequentially read the digital words stored at said locations in accordance with a sequence providing words representing unique pairs of time intervals;

first means for generating a series of spaced pulses;

means for modifying the spacing between the pulses of said series of pulses responsively to the digital words sequentially read from said locations;

circuit means for applying said modified series of pulses to said transmitter for transmission thereof in the form of wave energy; and, means for receiving said modified series of pulses transmitted in the form of wave energy.

61. A coded wave energy transmitting and receiving system comprising:

a transmitter adapted to transmit a series of pulses applied thereto in the form of wave energy;

first means for storing a plurality of digital words each representing a unique time interval and each stored at a location assigned a predetermined address;

first means for selectively addressing one of said predetermined locations of said first storing means to read the digital word stored at that location;

first means for generating a series of spaced pulses;

means for modifying the spacing between the pulses of said series of pulses responsively to the digital word read from said one of said locations;

circuit means for applying said modified series of pulses to said transmitter for transmission thereof in the form of wave energy; and, means for receiving said modified series of pulses transmitted in the form of wave energy, said address means including:

means for selectively generating an initial address signal corresponding to one of said predetermined addresses assigned to said locations;

means for generating a second address signal; and, means for addressing said one of said locations responsively to said initial and second address signals.

62. The system of claim 61 including means for summing said initial address signal and said second address signal to generate a current address signal, said locations being addressed responsively to said current address signal.

63. The system of claim 61 wherein said means for generating said second address signal includes:

a counter responsive to each pulse of said modified series of pulses for providing a digital output signal; and, means for enabling and inhibiting said counter, said second address signal being generated responsively to said counter output signal, said second address generating means providing a single predetermined second address signal when said counter is inhibited and a plurality of successive second address signals when said counter is enabled.

64. The system of claim 63 wherein said means for generating said second address signal includes:

second means for storing a plurality of digital words each representing a partial sum of a plurality of unique address differences and each stored at a location assigned a predetermined address; and, means for addressing one of said locations of said second storing means responsively to said counter output signal to select the partial sum of said unique address differences stored at that location, said one of said locations of said first storing means being addressed responsively to the sum of said initial address signal and said selected partial sum.

65. The system of claim 64 wherein said first and second storing means each comprise a read only memory.

66. A coded wave energy transmitting and receiving system comprising:

a transmitter adapted to transmit a series of pulses applied thereto in the form of wave energy;

first means for storing a plurality of digital words each representing a unique time interval and each stored at a location assigned a predetermined address;

first means for selectively addressing one of said predetermined locations of said first storing means to read the digital word stored at that location;

first means for generating a series of spaced pulses;

means for modifying the spacing between the pulses of said series of pulses responsively to the digital word read from said one of said locations;

circuit means for applying said modified series of pulses to said transmitter for transmission thereof in the form of wave energy; and, means for receiving said modified series of pulses transmitted in the form of wave energy, said receiving means including:

second means for storing a plurality of digital words each representing a unique time interval and each stored at a location assigned a predetermined address;

second means for selectively addressing one of said predetermined locations of said second storing means to read the digital word stored at that location;

second means for generating a second series of spaced pulses;

second means for modifying the spacing between the pulses of said second series of pulses responsively to the digital word read from said second storing means;

means for comparing the spacing between pulses of the received modified first series of pulses and pulses of the modified second series of pulses;

means for generating a gating signal synchronized to the received modified series of pulses in response to a favorable comparison; and, means for selectively gating the received signal in response to said gating signal.

67. The system of claim 66 wherein said gating signal generating means comprises:

third means for storing a plurality of digital words each representing a unique time interval and each stored at a location assigned a predetermined address;

third means for selectively addressing one of said predetermined locations of said third storing means to read the digital word stored at that location;

third means for generating a third series of pulses;

third means for modulating the spacing between the pulses of said third series of pulses in accordance with the time interval represented by the digital word read from said third storing means to generate said gating signal; and, means for synchronizing said third addressing means to said second addressing means in response to a favorable comparison by said comparing means.

68. The system of claim 67 wherein said comparing means comprises:

first and second shift registers;

means for shifting the received coded train of pulses into said first shift register at a first predetermined rate;

means for shifting said modulated pulse train into said second shift register at a second predetermined rate higher than said first rate; and, means for comparing the signal levels of corresponding stages of said first and second shift register.

69. A method for selectively generating an encoded pulse signal comprising the steps of:

storing a plurality of digital words each at a location assigned a predetermined address;

selectively addressing one of said predetermined locations to read the digital word stored at said one of said locations by selectively generating an initial address signal corresponding to one of said predetermined addresses assigned to said location, generating a second address signal, summing said initial and second address signals, and addressing said one of said locations responsively to the sum of said initial and second address signals; and, spacing sequential pulses in accordance with a time interval related in duration to the digital word read from said one of said locations by generating a series of spaced pulses, and modifying the spacing between said pulses responsively to the digital word read from said one of said locations.

70. The method of claim 69 wherein said second address signal is generated by:

providing a counter having a digital output signal; and, enabling said counter to count each pulse of the modified series of pulses to thereby provide a plurality of successive second address signals responsively to said counter output signal.

71. The method of claim 70 wherein said second address signal is generated by:

storing a plurality of digital words each representing a partial sum of a plurality of unique address differences and each stored at a location assigned a predetermined address; and, addressing one of said locations in response to said counter output signal to select the partial sum of said unique address difference stored at that location to thereby generate said second address signal.

72. A method for pulse interval modulation encoding comprising the steps of:

storing a plurality of digital words each representing a unique time interval and each stored at a location assigned a predetermined address;

selectively generating an initial address signal;

sequentially generating subsequent address signals responsively to said initial address signal;

selectively reading said stored plurality of digital words responsively to said initial and subsequent address signals;

generating a series of spaced pulses; and, modifying the spacing between successive pairs of pulses in said series of pulses in response to said selectively read digital words.

73. The method of claim 72 wherein said subsequent address signals are generated by:

storing a plurality of digital words each representing a partial sum of a plurality of unique address differences and each stored at a location assigned a predetermined address; and, selectively addressing said locations to successively select a partial sum of said unique address differences stored at said locations and thereby generate said subsequent address signals.

74. The method of claim 72 including the steps of:

arranging the digital words at the locations to define a set of predetermined, unique, cyclically repetitive codes; and, selecting a desired one of the codes of the set of codes in response to the selection of the initial address signal.

75. The method of claim 74 wherein said subsequent address signals are generated by:

storing a plurality of digital words each representing a partial sum of a plurality of unique address differences and each stored at a location assigned a predetermined address; and, selectively addressing said locations to successively select a partial sum of said unique address differences stored at said locations and thereby generate said subsequent address signals.

76. A method for selecting a coded series of pulses from a received signal in the presence of interfering pulses comprising:

storing a plurality of digital words each representing a unique time interval and each stored at a location assigned a predetermined address;

selectively addressing one of said locations to read the digital word stored at said one of said locations;

generating a series of pulses;

modulating the spacing between two pulses in said series of pulses in accordance with the time interval represented by the digital word read from said addressed location;

comparing the spacing between pulses of the received signal with spacing between pulses of the modulated series of pulses;

generating a gating signal synchronized to the coded series of pulses in the received signal in response to a favorable comparison; and, selectively gating the received signal in response to said gating signal.

77. A method for designating and tracking a target comprising the steps of:

transmitting a series of pulses of light wave energy from a first location toward a target;

modulating the spacing between the pulses of said transmitted series of pulses of light wave energy in accordance with a predetermined cyclically repetitive code, the spacing of the pulses defining a plurality of sequential pairs of time intervals, each pair of time intervals being unique for one cycle of the code;

receiving light wave energy reflected from the target at a second location;

generating, at said second location, a series of pulses spaced in accordance with said predetermined code;

comparing the light wave energy received at said second location with said generated series of pulses to detect said predetermined code; and, tracking said target in response to the detected predetermined code.

78. The method of claim 77 wherein the spacing between the pulses of said transmitted series of pulses is modulated by:

storing a plurality of digital words each representing a unique time interval and each stored at a location assigned a predetermined address;

selectively generating an initial address signal;

sequentially generating subsequent address signals responsively to said initial address signal;

selectively reading said stored plurality of digital words responsively to said initial and subsequent address signals;

generating a series of spaced pulses;

modifying the spacing between successive pulses in said series of pulses in response to said selectively read digital words; and, modulating the spacing between the pulses of said transmitted series of pulses responsively to said modified series of pulses.

79. The method of claim 78 wherein the pulses of said series of pulses generated at said second location are spaced by:

storing a plurality of digital words each representing a unique time interval and each stored at a location assigned a predetermined address;

selectively generating an initial address signal;

sequentially generating subsequent address signals responsively to said initial address signal;

selectively reading said stored plurality of digital words responsively to said initial and subsequent address signals;

generating a series of spaced pulses;

modifying the spacing between successive pulses in said series of pulses in response to said selectively read digital words; and, modulating the spacing between the pulses of said transmitted series of pulses responsively to said modified series of pulses.

80. The method of claim 79 wherein a set of predetermined, unique, cyclically repetitive codes is defined by the locations of said stored plurality of unique digital words, a desired one of said set of unique codes being selectable responsively to said initial address signal, the method including the step of selecting the same initial address signal at both the first and second locations to thereby select the same code of the set of codes at both locations.

81. The method of claim 78 wherein said subsequent address signal is generated by:

storing a plurality of digital words each representing a partial sum of a plurality of unique address differences and each stored at a location assigned a predetermined address; and, selectively addressing said locations to select the partial sums of said unique address differences stored at said locations and thereby generate said subsequent address signals.

82. A method for transmitting and receiving coded wave energy signals comprising the steps of:

providing a transmitter adapted to transmit a series of pulses applied thereto in the form of wave energy;

storing in a first storing means a plurality of digital words each representing a unique time interval and each stored at a location assigned a predetermined address;

selectively addressing one of said predetermined locations of said first storing means to read the digital word stored at that location;

generating a first series of spaced pulses;

modifying the spacing between a pair of pulses of said first series of pulses responsively to the digital word read from said one of said locations of said first storing means;

applying said modified first series of pulses to said transmitter for transmission thereof in the form of wave energy;

receiving wave energy including said modified first series of pulses transmitted in the form of wave energy;

storing in a second storing means a plurality of digital words each representing a unique time interval and each stored at a location assigned a predetermined address;

selectively addressing one of said predetermined locations of said second storing means to read the digital word stored at that location;

generating a second series of spaced pulses;

modifying the spacing between a pair of pulses of said second series of pulses responsively to the digital word read from said second storing means;

comparing the spacing between pulses of the received wave energy with the spacing between pulses of the modified second series of pulses;

generating a gating signal synchronized to the received modified series of pulses in response to a favorable comparison; and, selectively gating the received signal in response to said gating signal.

83. The method of claim 82 including the steps of:

repetitively addressing said one of said predetermined locations of each of said first and second storing means; and, continuously modifying the spacing between pairs of pulses of said first and second series of pulses responsively to the respective addressed ones of said digital words.

84. The method of claim 82 including the steps of:

selectively addressing another of said predetermined locations of each of said first and second storing means to read the digital word stored at that location; and, modifying the spacing between another pair of pulses of said first and second series of pulses responsively to the respective addressed ones of said digital words read from each of said another of said locations.

85. A method for encoding a series of pulses by individually varying the pulse to pulse spacing of immediately adjacent pairs of pulses in the series of pulses in accordance with unique pairs of interpulse intervals in response to sequentially provided, unique digital spacing control signals.

* * * * *